(12) United States Patent
Yamazaki et al.

(10) Patent No.: US 10,998,448 B2
(45) Date of Patent: May 4, 2021

(54) THIN FILM SEMICONDUCTOR DEVICE INCLUDING BACK GATE COMPRISING OXIDE SEMICONDUCTOR MATERIAL

(71) Applicant: Semiconductor Energy Laboratory Co., Ltd., Kanagawa-ken (JP)

(72) Inventors: Shunpei Yamazaki, Tokyo (JP); Junichi Koezuka, Tochigi (JP); Masami Jintyou, Tochigi (JP); Daisuke Kurosaki, Tochigi (JP)

(73) Assignee: Semiconductor Energy Laboratory Co., Ltd.

( * ) Notice: Subject to any disclaimer, the term of this patent is extended or adjusted under 35 U.S.C. 154(b) by 0 days.

(21) Appl. No.: 16/776,856

(22) Filed: Jan. 30, 2020

(65) Prior Publication Data

US 2020/0168738 A1 May 28, 2020

Related U.S. Application Data

(63) Continuation of application No. 14/710,029, filed on May 12, 2015, now abandoned.

(30) Foreign Application Priority Data

May 15, 2014 (JP) .................................. 2014-101183

(51) Int. Cl.
*H01L 29/786* (2006.01)
*H01L 27/12* (2006.01)
*H01L 29/49* (2006.01)

(52) U.S. Cl.
CPC ...... *H01L 29/7869* (2013.01); *H01L 27/1225* (2013.01); *H01L 29/4908* (2013.01); *H01L 29/78648* (2013.01); *H01L 29/78696* (2013.01)

(58) Field of Classification Search
CPC ............. H01L 29/7869; H01L 29/4908; H01L 29/78648; H01L 29/78696; H01L 27/1225
(Continued)

(56) References Cited

U.S. PATENT DOCUMENTS 5,731,856 A   3/1998   Kim et al.
5,744,864 A   4/1998   Cillessen et al.
(Continued)

FOREIGN PATENT DOCUMENTS

EP   1 737 044 A1   12/2006
EP   2 226 847 A2    9/2010
(Continued)

OTHER PUBLICATIONS

Coates, D. et al., "Optical Studies of the Amorphous Liquid-Cholesteric Liquid Crystal Transition:The "Blue Phase"," Physics Letters, Sep. 10, 1973, vol. 45A, No. 2, pp. 115-116.
(Continued)

*Primary Examiner* — Matthew E. Gordon
(74) *Attorney, Agent, or Firm* — Husch Blackwell LLP

(57) ABSTRACT

In a semiconductor device using a transistor including an oxide semiconductor, a change in electrical characteristics is inhibited and reliability is improved. The transistor includes a first gate electrode; a first insulating film over the first gate electrode; an oxide semiconductor film over the first insulating film; a source electrode electrically connected to the oxide semiconductor film; a drain electrode electrically connected to the oxide semiconductor film; a second insulating film over the oxide semiconductor film, the source electrode, and the drain electrode; and a second gate electrode over the second insulating film. The second insulating film includes oxygen. The second gate electrode includes the
(Continued)

same metal element as at least one of metal elements of the oxide semiconductor film and has a region thinner than the oxide semiconductor film.

17 Claims, 33 Drawing Sheets

(58) Field of Classification Search
  USPC .......................................................... 257/43
  See application file for complete search history.

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,601,984 B2 | 10/2009 | Sano et al. |
| 7,674,650 B2 | 3/2010 | Akimoto et al. |
| 7,732,819 B2 | 6/2010 | Akimoto et al. |
| 8,242,837 B2 | 8/2012 | Yamazaki et al. |
| 8,350,621 B2 | 1/2013 | Yamazaki et al. |
| 8,377,744 B2 | 2/2013 | Yamazaki et al. |
| 8,441,010 B2 | 5/2013 | Ichijo et al. |
| 8,513,661 B2 | 8/2013 | Takahashi et al. |
| 8,551,824 B2 | 10/2013 | Yamazaki et al. |
| 8,552,423 B2 | 10/2013 | Yamazaki et al. |
| 8,624,240 B2 | 1/2014 | Sato et al. |
| 8,698,143 B2 | 4/2014 | Yamazaki et al. |
| 8,737,109 B2 | 5/2014 | Yamazaki et al. |
| 8,803,589 B2 | 8/2014 | Yamazaki et al. |
| 8,835,917 B2 | 9/2014 | Yamazaki et al. |
| 8,841,163 B2 | 9/2014 | Yamazaki et al. |
| 8,883,556 B2 | 11/2014 | Yamazaki |
| 8,901,562 B2 | 12/2014 | Yamada et al. |
| 8,957,414 B2 | 2/2015 | Yamazaki et al. |
| 9,240,467 B2 | 1/2016 | Yamazaki et al. |
| 9,263,472 B2 | 2/2016 | Yamazaki et al. |
| 9,293,602 B2 | 3/2016 | Yamazaki |
| 9,324,877 B2 | 4/2016 | Yamazaki et al. |
| 9,419,020 B2 | 8/2016 | Yamazaki et al. |
| 9,449,706 B2 | 9/2016 | Yamazaki et al. |
| 9,660,104 B2 | 5/2017 | Yamazaki |
| 9,685,562 B2 | 6/2017 | Yamazaki et al. |
| 9,716,109 B2 | 7/2017 | Yamazaki et al. |
| 9,721,811 B2 | 8/2017 | Yamazaki et al. |
| 9,780,225 B2 | 10/2017 | Yamazaki |
| 10,109,500 B2 | 10/2018 | Yamazaki et al. |
| 10,115,743 B2 | 10/2018 | Yamazaki et al. |
| 10,297,322 B2 | 5/2019 | Yamazaki et al. |
| 10,461,098 B2 | 10/2019 | Yamazaki et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0179199 A1 | 7/2009 | Sano et al. |
| 2009/0206332 A1 | 8/2009 | Son et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0266542 A1 | 11/2011 | Ryu et al. |
| 2011/0284844 A1 | 11/2011 | Endo et al. |
| 2012/0061662 A1 | 3/2012 | Yamazaki et al. |
| 2012/0248433 A1* | 10/2012 | Nakano ............... H01L 29/4908 257/43 |
| 2012/0300151 A1* | 11/2012 | Yamazaki ............. H01L 29/45 349/43 |
| 2013/0037799 A1 | 2/2013 | Sakata et al. |
| 2013/0277672 A1 | 10/2013 | Sano et al. |
| 2014/0038351 A1 | 2/2014 | Yamazaki et al. |
| 2015/0004762 A1 | 1/2015 | Shimoda et al. |
| 2015/0123115 A1* | 5/2015 | Kim .................. H01L 21/02554 257/43 |

(56) References Cited

U.S. PATENT DOCUMENTS

| | | | |
|---|---|---|---|
| 2015/0303309 | A1 | 10/2015 | Koezuka et al. |
| 2017/0373193 | A1 | 12/2017 | Yamazaki et al. |
| 2019/0027377 | A1 | 1/2019 | Yamazaki et al. |
| 2019/0035819 | A1 | 1/2019 | Yamazaki et al. |
| 2020/0058682 | A1 | 2/2020 | Yamazaki et al. |

FOREIGN PATENT DOCUMENTS

| | | | |
|---|---|---|---|
| JP | 60-198861 | A | 10/1985 |
| JP | 63-210022 | A | 8/1988 |
| JP | 63-210023 | A | 8/1988 |
| JP | 63-210024 | A | 8/1988 |
| JP | 63-215519 | A | 9/1988 |
| JP | 63-239117 | A | 10/1988 |
| JP | 63-265818 | A | 11/1988 |
| JP | 05-053147 | A | 3/1993 |
| JP | 05-251705 | A | 9/1993 |
| JP | 08-264794 | A | 10/1996 |
| JP | 11-505377 | | 5/1999 |
| JP | 2000-044236 | A | 2/2000 |
| JP | 2000-150900 | A | 5/2000 |
| JP | 2000-243963 | A | 9/2000 |
| JP | 2002-076356 | A | 3/2002 |
| JP | 2002-289859 | A | 10/2002 |
| JP | 2003-086000 | A | 3/2003 |
| JP | 2003-086808 | A | 3/2003 |
| JP | 2004-103957 | A | 4/2004 |
| JP | 2004-273614 | A | 9/2004 |
| JP | 2004-273732 | A | 9/2004 |
| JP | 2006-165529 | A | 6/2006 |
| JP | 2009-176865 | A | 8/2009 |
| JP | 2011-109646 | A | 6/2011 |
| JP | 2011-139050 | A | 7/2011 |
| JP | 2011-199272 | A | 10/2011 |
| JP | 2011-233889 | A | 11/2011 |
| JP | 2012-009836 | A | 1/2012 |
| JP | 2012-033836 | A | 2/2012 |
| JP | 2012-033913 | A | 2/2012 |
| JP | 2012-069932 | A | 4/2012 |
| JP | 2012-084858 | A | 4/2012 |
| JP | 2012-146805 | A | 8/2012 |
| JP | 2012-151461 | A | 8/2012 |
| JP | 2013-247142 | A | 12/2013 |
| JP | 2014-006519 | A | 1/2014 |
| JP | 2014-057056 | A | 3/2014 |
| JP | 2014-074908 | A | 4/2014 |
| KR | 2012-0117723 | A | 10/2012 |
| WO | WO 2004/114391 | A1 | 12/2004 |
| WO | WO 2006/051993 | A2 | 5/2006 |
| WO | WO 2009/093722 | A1 | 7/2009 |
| WO | WO 2011/010543 | A1 | 1/2011 |
| WO | WO 2011/049005 | A1 | 4/2011 |
| WO | WO 2011/068033 | A1 | 6/2011 |
| WO | WO 2011/105184 | A1 | 9/2011 |
| WO | WO 2011/145467 | A1 | 11/2011 |
| WO | WO 2012/026503 | A1 | 3/2012 |
| WO | WO 2012/090973 | A1 | 7/2012 |

OTHER PUBLICATIONS

Meiboom, S. et al., "Theory of the Blue Phase of Cholesteric Liquid Crystals," Physical Review Letters, May 4, 1981, vol. 46, No. 18, pp. 1216-1219.
Costello, M.J. et al., "Electron Microscopy of a Cholesteric Liquid Crystal and Its Blue Phase," Physical Review. A, May 1, 1984, vol. 29, No. 5, pp. 2957-2959.
Kimizuka, N. et al., "Spinel,YBFE2O4, and YB2FE3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000 ," Journal of Solid State Chemistry, 1985, vol. 60, pp. 382-384.
Nakamura, M. et al., "The Phase Relations in the In2O3—Ga2ZnO4—ZnO System at 1350° C.," Journal of Solid State Chemistry, Aug. 1, 1991, vol. 93, No. 2, pp. 298-315.
Kitzerow, H.-S. et al., "Observation of Blue Phases in Chiral Networks," Liquid Crystals, 1993, vol. 14, No. 3, pp. 911-916.
Kimiluka, N. et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.
Chern, H. et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.
Prins, M.W.J. et al., "A Ferroelectric Transparent Thin-Film Transistor," Applied Physics Letters, Jun. 17, 1996, vol. 68, No. 25, pp. 3650-3652.
Li, C. et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.
Kikuchi, H. et al., "Polymer-Stabilized Liquid Crystal Blue Phases," Nature Materials, Sep. 2, 2002, vol. 1, pp. 64-68.
Tsuda, K. et al., "Ultra Low Power Consumption Technologies for Mobile TFT-LCDs," IDW '02: Proceedings of the 9th International Display Workshops, Dec. 4, 2002, pp. 295-298.
Nomura, K. et al., "Thin-Film Transistor Fabricated in Single-Crystalline Transparent Oxide Semiconductor," Science, May 23, 2003, vol. 300, No. 5623, pp. 1269-1272.
Ikeda, T. et al., "Full-Functional System Liquid Crystal Display Using CG-Silicon Technology," SID Digest '04: SID International Symposium Digest of Technical Papers, 2004, vol. 35, pp. 860-863.
Nomura, K. et al., "Room-Temperature Fabrication of Transparent Flexible Thin-Film Transistors Using Amorphous Oxide Semiconductors," Nature, Nov. 25, 2004, vol. 432, pp. 488-492.
Dembo, H. et al., "RFCPUS on Glass and Plastic Substrates Fabricated by TFT Transfer Technology," IEDM 05: Technical Digest of International Electron Devices Meeting, Dec. 5, 2005, pp. 1067-1069.
Kanno, H. et al., "White Stacked Electrophosphorecent Organic Light-Emitting Devices Employing MoO3 as a Charge-Generation Layer," Advanced Materials, 2006, vol. 18, No. 3, pp. 339-342.
Lee, H.N. et al., "Current Status of, Challenges to, and Perspective View of Am-OLED," IDW '06: Proceedings of the 13th International Display Workshops, Dec. 7, 2006, pp. 663-666.
Hosono, H., "68.3: Invited Paper:Transparent Amorphous Oxide Semiconductors for High Performance TFT," SID Digest '07: SID International Symposium Digest of Technical Papers, 2007, vol. 38, pp. 1830-1833.
Hirao, T. et al., "Novel Top-Gate Zinc Oxide Thin-Film Transistors (ZnO TFTS) for AMLCDS," Journal of the Society for Information Display, 2007, vol. 15, No. 1, pp. 17-22.
Park, S.H.K. et al., "Challenge to Future Displays: Transparent Am-OLED Driven by PEALD Grown ZnO TFT," IMID '07 Digest, 2007, pp. 1249-1252.
Kikuchi, H. et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.
Miyasaka, M., "SUFTLA Flexible Microelectronics on Their Way to Business," SID Digest '07: SID International Symposium Digest of Technical Papers, 2007, vol. 38, pp. 1673-1676.
Kurokawa, Y. et al., "UHF RFCPUS on Flexible and Glass Substrates for Secure RFID Systems," Journal of Solid-State Circuits , 2008, vol. 43, No. 1, pp. 292-299.
Jeong, J.K. et al., "3.1: Distinguished Paper: 12.1-Inch WXGA AMOLED Display Driven by Indium-Gallium-Zinc Oxide TFTs Array," SID Digest '08: SID International Symposium Digest of Technical Papers, May 20, 2008, vol. 39, No. 1, pp. 1-4.
Lee, J.H. et al., "World's Largest (15-Inch) XGA AMLCD Panel Using IGZO Oxide TFT," SID Digest '08: SID International Symposium Digest of Technical Papers, May 20, 2008, vol. 39, pp. 625-628.

(56) References Cited

OTHER PUBLICATIONS

Park, J.S. et al., "Amorphous Indium-Gallium-Zinc Oxide TFTS and Their Application for Large Size AMOLED," Am-FPd '08 Digest of Technical Papers, Jul. 2, 2008, pp. 275-278.
Takahashi, M. et al., "Theoretical Analysis of IGZO Transparent Amorphous Oxide Semiconductor," IDW '08: Proceedings of the 15th International Display Workshops, Dec. 3, 2008, pp. 1637-1640.
Sakata, J. et al., "Development of 4.0-In. AMOLED Display With Driver Circuit Using Amorphous In—Ga—Zn-Oxide TFTs," IDW '09: Proceedings of the 16th International Display Workshops, 2009, pp. 689-692.
Asaoka, Y. et al., "29.1: Polarizer-Free Reflective LCD Combined With Ultra Low-Power Driving Technology," SID Digest '09: SID International Symposium Digest of Technical Papers, May 31, 2009, pp. 395-398.
Nowatari, H. et al., "60.2: Intermediate Connector With Suppressed Voltage Loss for White TANDEM OLEDS," SID Digest '09: SID International Symposium Digest of Technical Papers, May 31, 2009, vol. 40, pp. 899-902.
Jin, D.-U. et al., "65.2: Distinguished Paper:World-Largest (6.5') Flexible Full Color Top Emission AMOLED Display on Plastic Film and Its Bending Properties," SID Digest '09: SID International Symposium Digest of Technical Papers, May 31, 2009, pp. 983-985.
Lee, M.-H. et al., "15.4: Excellent Performance of Indium-Oxide-Based Thin-Film Transistors by DC Sputtering," SID Digest '09: SID International Symposium Digest of Technical Papers, May 31, 2009, pp. 191-193.
Cho, D.-H. et al., "21.2: Al and Sn-Doped Zinc Indium Oxide Thin Film Transistors for AMOLED Back-Plane," SID Digest '09: SID International Symposium Digest of Technical Papers, May 31, 2009, pp. 280-283.
Kikuchi, H. et al., "39.1: Invited Paper:Optically Isotropic Nano-Structured Liquid Crystal Composites for Display Applications," SID Digest '09: SID International Symposium Digest of Technical Papers, May 31, 2009, pp. 578-581.
Osada, T. et al., "15.2: Development of Driver-Integrated Panel using Amorphous In—Ga—Zn-Oxide TFT," SID Digest '09: SID International Symposium Digest of Technical Papers, May 31, 2009, pp. 184-187.
Ohara, H. et al., "21.3: 4.0 In. QVGA AMOLED Display Using In—Ga—Zn-Oxide TFTS With a Novel Passivation Layer", SID Digest '09: SID International Symposium Digest of Technical Papers, May 31, 2009, pp. 284-287.
Godo, H. et al., "P-9: Numerical Analysis on Temperature Dependence of Characteristics of Amorphous In—Ga—Zn-Oxide TFT," SID Digest '09: SID International Symposium Digest of Technical Papers, May 31, 2009, pp. 1110-1112.
Osada, T. et al., "Development of Driver-Integrated Panel Using Amorphous In—Ga—Zn-Oxide TFT," Am-FPd '09 Digest of Technical Papers, Jul. 1, 2009, pp. 33-36.
Godo, H. et al., "Temperature Dependence of Characteristics and Electronic Structure for Amorphous In—Ga—Zn-Oxide TFT," Am-FPd '09 Digest of Technical Papers, Jul. 1, 2009, pp. 41-44.
Ohara, H. et al., "Amorphous In—Ga—Zn-Oxide TFTs with Suppressed Variation for 4.0 inch QVGA AMOLED Display," Am-FPd '09 Digest of Technical Papers, Jul. 1, 2009, pp. 227-230, The Japan Society of Applied Physics.
Park, J.C. et al., "High Performance Amorphous Oxide Thin Film Transistors with Self-Aligned Top-Gate Structure," IEDM 09: Technical Digest of International Electron Devices Meeting, Dec. 7, 2009, pp. 191-194.
Nakamura, M., "Synthesis of Homologous Compound with New Long-Period Structure," NIRIM Newsletter, Mar. 1, 1995, vol. 150, pp. 1-4.
Hosono, H. et al., "Working Hypothesis to Explore Novel Wide Band Gap Electrically Conducting Amorphous Oxides and Examples," Journal of Non-Crystalline Solids, 1996, vol. 198-200, pp. 165-169.
Orita, M. et al., "Mechanism of Electrical Conductivity of Transparent InGaZnO4," Physical Review. B, Jan. 15, 2000, vol. 61, No. 3, pp. 1811-1816.

Van de Walle, C.G., "Hydrogen as a Cause of Doping in Zinc Oxide," Physical Review Letters, Jul. 31, 2000, vol. 85, No. 5, pp. 1012-1015.
Orita, M. et al., "Amorphous Transparent Conductive Oxide InGaO3(ZnO)m (m<4):a Zn4s Conductor," Philosophical Magazine, 2001, vol. 81, No. 5, pp. 501-515.
Janotti, A. et al., "Oxygen Vacancies in ZnO," Applied Physics Letters, 2005, vol. 87, pp. 122102-1-122102-3.
Clark, S.J. et al., "First Principles Methods Using CASTEP," Zeitschrift fur Kristallographie, 2005, vol. 220, pp. 567-570.
Nomura, K. et al., "Amorphous Oxide Semiconductors for High-Performance Flexible Thin-Film Transistors," Japanese Journal of Applied Physics, 2006, vol. 45, No. 5B, pp. 4303-4308.
Janotti, A. et al., "Native Point Defects in ZnO," Physical Review. B, Oct. 4, 2007, vol. 76, No. 16, pp. 165202-1-165202-22.
Lany, S. et al., "Dopability, Intrinsic Conductivity, and Nonstoichiometry of Transparent Conducting Oxides," Physical Review Letters, Jan. 26, 2007, vol. 98, pp. 045501-1-045501-4.
Park, J.-S. et al., "Improvements in the Device Characteristics of Amorphous Indium Gallium Zinc Oxide Thin-Film Transistors by Ar Plasma Treatment," Applied Physics Letters, Jun. 26, 2007, vol. 90, No. 26, pp. 262106-1-262106-3.
Park, J.S. et al., "Electronic Transport Properties of Amorphous Indium-Gallium-Zinc Oxide Semiconductor Upon Exposure to Water," Applied Physics Letters, 2008, vol. 92, pp. 072104-1-072104-3.
Hsieh, H.-H. et al., "P-29: Modeling of Amorphous Oxide Semiconductor Thin Film Transistors and Subgap Density of States," SID Digest '08: SID International Symposium Digest of Technical Papers, May 20, 2008, vol. 39, pp. 1277-1280.
Oba, F. et al., "Defect Energetics in ZnO: A Hybrid Hartree-Fock Density Functional Study," Physical Review. B, 2008, vol. 77, pp. 245202-1-245202-6.
Kim, S. et al., "High-Performance Oxide Thin Film Transistors Passivated by Various Gas Plasmas," 214th ECS Meeting, 2008, No. 2317, ECS.
Hayashi, R. et al., "42.1: Invited Paper: Improved Amorphous In—Ga—Zn—O TFTS," SID Digest '08: SID International Symposium Digest of Technical Papers, May 20, 2008, vol. 39, pp. 621-624.
Son, K.-S. et al., "42.4L: Late-News Paper: 4 Inch QVGA AMOLED Driven by the Threshold Voltage Controlled Amorphous GIZO (Ga2O3—In2O3—ZnO) TFT," SID Digest '08: SID International Symposium Digest of Technical Papers, May 20, 2008, vol. 39, pp. 633-636.
Park, Sang-Hee et al., "42.3: Transparent ZnO Thin Film Transistor for the Application of High Aperture Ratio Bottom Emission Am-OLED Display," SID Digest '08: International Symposium Digest of Technical Papers, May 20, 2008, vol. 39, pp. 629-632.
Fung, T.C. et al., "2-D Numerical Simulation of High Performance Amorphous In—Ga—Zn—O TFTs for Flat Panel Displays," Am-FPd '08 Digest of Technical Papers, Jul. 2, 2008, pp. 251-252, The Japan Society of Applied Physics.
Mo, Y.-G. et al., "Amorphous Oxide TFT Backplanes for Large Size AMOLED Displays," IDW '08: Proceedings of the 6th International Display Workshops, Dec. 3, 2008, pp. 581-584.
Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.
Fortunato, E.M.C. et al., "Wide-Bandgap High-Mobility ZnO Thin-Film Transistors Produced at Room Temperature," Applied Physics Letters, Sep. 27, 2004, vol. 85, No. 13, pp. 2541-2543.
Masuda, S. et al., "Transparent Thin Film Transistors Using ZnO as an Active Channel Layer and Their Electrical Properties," Journal of Applied Physics, Feb. 1, 2003, vol. 93, No. 3, pp. 1624-1630.
Oh, M.S. et al., "Improving the Gate Stability of ZnO Thin-Film Transistors With Aluminum Oxide Dielectric Layers," Journal of the Electrochemical Society, 2008, vol. 155, No. 12, pp. H1009-H1014.
Park, J.S. et al., "Dry Etching of ZnO Films and Plasma-Induced Damage to Optical Properties," Journal of Vacuum Science & Technology B, Mar. 1, 2003, vol. 21, No. 2, pp. 800-803.

(56) References Cited

OTHER PUBLICATIONS

Ueno, K. et al., "Field-Effect Transistor on SrTiO3 With Sputtered Al2O3 Gate Insulator," Applied Physics Letters, Sep. 1, 2003, vol. 83, No. 9, pp. 1755-1757.
Nomura, K. et al., "Carrier Transport in Transparent Oxide Semiconductor with Intrinsic Structural Randomness Probed Using Single Crystalline InGaO3(ZnO)5 Films," Applied Physics Letters, Sep. 13, 2004, vol. 85, No. 11, pp. 1993-1995.

\* cited by examiner

100C

100C

100C

100D

100D

100E

100E 106 107 104 102

106 107 104 102

108

108

112a 112b 114 116

114 116

FIG. 16A
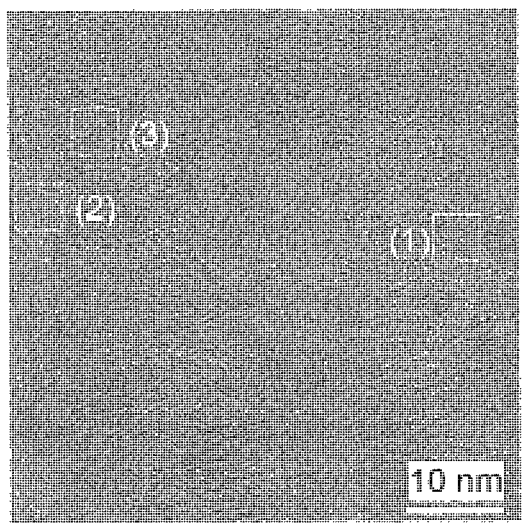
FIG. 16B  FIG. 16C  FIG. 16D
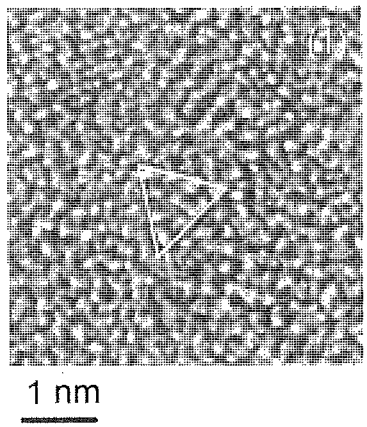 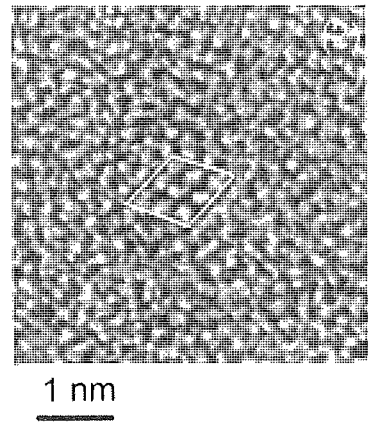 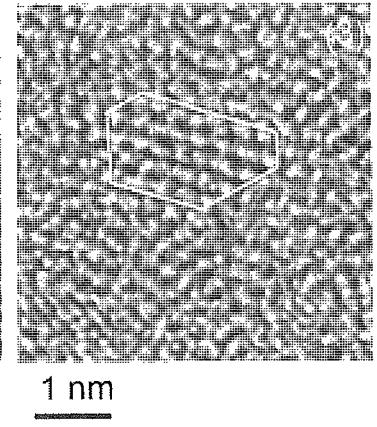

THIN FILM SEMICONDUCTOR DEVICE INCLUDING BACK GATE COMPRISING OXIDE SEMICONDUCTOR MATERIAL

This application is a continuation of copending U.S. application Ser. No. 14/710,029, filed on May 12, 2015 which is incorporated herein by reference.

BACKGROUND OF THE INVENTION

1. Field of the Invention

One embodiment of the present invention relates to a semiconductor device including an oxide semiconductor film and a display device including the semiconductor device.

Note that one embodiment of the present invention is not limited to the above technical field. The technical field of one embodiment of the invention disclosed in this specification and the like relates to an object, a method, and a manufacturing method. In addition, the present invention relates to a process, a machine, manufacture, and a composition of matter. In particular, one embodiment of the present invention relates to a semiconductor device, a display device, a light-emitting device, a power storage device, a storage device, a driving method thereof, a manufacturing method thereof, and a manufacturing apparatus thereof.

In this specification and the like, a semiconductor device generally means a device that can function by utilizing semiconductor characteristics. A semiconductor element such as a transistor, a semiconductor circuit, an arithmetic device, and a storage device are each an embodiment of a semiconductor device. An imaging device, a display device, a liquid crystal display device, a light-emitting device, an electro-optical device, a power generation device (including a thin film solar cell, an organic thin film solar cell, and the like), and an electronic appliance may each include a semiconductor device.

2. Description of the Related Art

Attention has been focused on a technique for forming a transistor using a semiconductor thin film formed over a substrate having an insulating surface (also referred to as a field-effect transistor (FET) or a thin film transistor (TFT)). Such transistors are applied to a wide range of electronic appliances such as an integrated circuit (IC) and an image display device (display device). A semiconductor material typified by silicon is widely known as a material for a semiconductor thin film that can be used for a transistor. As another material, an oxide semiconductor has been attracting attention (e.g., Patent Document 1).

For example, Patent Document 2 discloses a semiconductor device in which, to reduce oxygen vacancy in an oxide semiconductor layer where a channel is formed, an insulating layer which releases oxygen by heating is used as a base insulating layer of the oxide semiconductor layer.

In addition, a method for manufacturing a semiconductor device in which an oxide semiconductor layer is highly purified in the following manner is disclosed: an oxide insulating layer is formed over the oxide semiconductor layer; oxygen is introduced (added) through the oxide insulating layer; heat treatment is performed; and impurities such as hydrogen, moisture, a hydroxyl group, or hydride are removed from the oxide semiconductor layer by the introduction of oxygen and the heat treatment (e.g., Patent Document 3).

REFERENCE

Patent Document

[Patent Document 1] Japanese Published Patent Application No. 2006-165529
[Patent Document 2] Japanese Published Patent Application No. 2012-009836
[Patent Document 3] Japanese Published Patent Application No. 2011-199272

SUMMARY OF THE INVENTION

In the case where a transistor is manufactured using an oxide semiconductor film for a channel formation region, oxygen vacancy formed in the channel formation region of the oxide semiconductor film adversely affects the transistor characteristics; therefore, the oxygen vacancy causes a problem. For example, oxygen vacancy formed in the channel formation region of the oxide semiconductor film is bonded with hydrogen to serve as a carrier supply source. The carrier supply source generated in the channel formation region of the oxide semiconductor film causes a change in the electrical characteristics, typically, a shift in the threshold voltage, of the transistor including the oxide semiconductor film. Furthermore, there is a problem in that electrical characteristics fluctuate among the transistors. Therefore, it is preferable that the amount of oxygen vacancy in the channel formation region of the oxide semiconductor film be as small as possible.

In addition, when electric charge or the like which is not necessary is accumulated on the side opposite to the side of the channel formation region of the oxide semiconductor film, i.e. on the back channel side, the transistor characteristics are adversely affected. For example, in the case of a bottom-gate transistor, accumulation of electric charge in the vicinity of the surface of an insulating film on the side opposite to the side of a gate insulating film causes a shift in the threshold voltage of the transistor. Furthermore, there is a problem in that electrical characteristics fluctuate among the transistors. Therefore, it is preferable that electric charge can be fixed or controlled appropriately on the back channel side of the oxide semiconductor film.

In view of the above problem, an object of one embodiment of the present invention is to inhibit a change in electrical characteristics and to improve reliability in a semiconductor device using a transistor including an oxide semiconductor. Another object of one embodiment of the present invention is to provide a semiconductor device with low power consumption. Another object of one embodiment of the present invention is to provide a novel semiconductor device. Another object of one embodiment of the present invention is to provide a novel display device.

Note that the description of the above object does not disturb the existence of other objects. In one embodiment of the present invention, there is no need to achieve all the objects. Objects other than the above objects will be apparent from and can be derived from the description of the specification and the like.

One embodiment of the present invention is a semiconductor device including a transistor which includes a first gate electrode; a first insulating film over the first gate electrode; an oxide semiconductor film over the first insulating film; a source electrode electrically connected to the oxide semiconductor film; a drain electrode electrically connected to the oxide semiconductor film; a second insulating film over the oxide semiconductor film, the source electrode, and the drain electrode; and a second gate electrode over the second insulating film. The second insulating film includes oxygen. The second gate electrode includes the same metal element as at least one of metal elements of the oxide semiconductor film and has a region thinner than the oxide semiconductor film.

Another embodiment of the present invention is a semiconductor device including a transistor which includes a first gate electrode; a first insulating film over the first gate electrode; an oxide semiconductor film over the first insulating film; a source electrode electrically connected to the oxide semiconductor film; a drain electrode electrically connected to the oxide semiconductor film; a second insulating film over the oxide semiconductor film, the source electrode, and the drain electrode; and a second gate electrode over the second insulating film. The second gate electrode is electrically connected to the first gate electrode through an opening provided in the first insulating film and the second insulating film. The second insulating film includes oxygen. The second gate electrode includes the same metal element as at least one of metal elements of the oxide semiconductor film and has a region thinner than the oxide semiconductor film.

Another embodiment of the present invention is a semiconductor device including a transistor which includes a first gate electrode; a first insulating film over the first gate electrode; an oxide semiconductor film over the first insulating film; a second insulating film over the oxide semiconductor film; a source electrode electrically connected to the oxide semiconductor film through an opening provided in the second insulating film; a drain electrode electrically connected to the oxide semiconductor film through an opening provided in the second insulating film; and a second gate electrode over the second insulating film. The second insulating film includes oxygen. The second gate electrode includes the same metal element as at least one of metal elements of the oxide semiconductor film and has a region thinner than the oxide semiconductor film.

Another embodiment of the present invention is a semiconductor device including a transistor which includes a first gate electrode; a first insulating film over the first gate electrode; an oxide semiconductor film over the first insulating film; a second insulating film over the oxide semiconductor film; a source electrode electrically connected to the oxide semiconductor film through an opening provided in the second insulating film; a drain electrode electrically connected to the oxide semiconductor film through an opening provided in the second insulating film; and a second gate electrode over the second insulating film. The second gate electrode is electrically connected to the first gate electrode through an opening provided in the first insulating film and the second insulating film. The second insulating film includes oxygen. The second gate electrode includes the same metal element as at least one of metal elements of the oxide semiconductor film and has a region thinner than the oxide semiconductor film.

In each of the above structures, the thickness of the second gate electrode is preferably greater than or equal to 5 nm and less than or equal to 35 nm.

Furthermore, in each of the above structures, the oxide semiconductor film preferably includes oxygen, In, Zn, and M (M is Ti, Ga, Sn, Y, Zr, La, Ce, Nd, or Hf). It is preferable that the oxide semiconductor film include a crystal part and that the crystal part have c-axis alignment.

Another embodiment of the present invention is a display device including the semiconductor device according to any one of the above structures, and a display element. Another embodiment of the present invention is a display module including the display device and a touch sensor. Another embodiment of the present invention is an electronic appliance including the semiconductor device according to any one of the above structures, the display device, or the display module; and an operation key or a battery.

According to one embodiment of the present invention, a change in electrical characteristics can be inhibited and reliability can be improved in a semiconductor device using a transistor including an oxide semiconductor. Alternatively, according to one embodiment of the present invention, a semiconductor device with low power consumption can be provided. According to one embodiment of the present invention, a novel semiconductor device can be provided. According to one embodiment of the present invention, a novel display device can be provided.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF THE DRAWINGS

FIGS. 16A to 16D are Cs-corrected high-resolution TEM images of a plane of a CAAC-OS.

DETAILED DESCRIPTION OF THE INVENTION

Figure 1A:
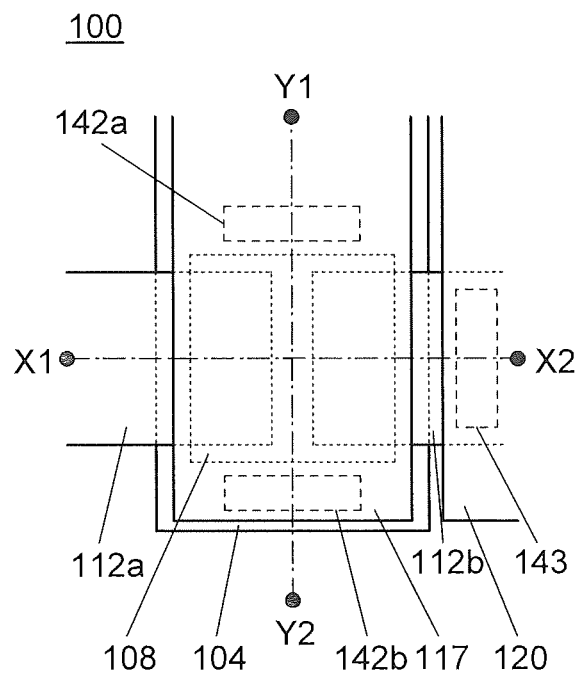
FIGS. 1A to 1C are a top view and cross-sectional views illustrating one embodiment of a semiconductor device.

Embodiments will be described below with reference to drawings. However, the embodiments can be implemented with various modes. It will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, and the region are exaggerated for clarity in some cases. Therefore, embodiments of the present invention are not limited to such a scale. Note that the drawings are schematic views showing ideal examples, and embodiments of the present invention are not limited to shapes or values shown in the drawings.

Note that in this specification, ordinal numbers such as "first", "second", and "third" are used in order to avoid confusion among components, and the terms do not limit the components numerically.

Note that in this specification, terms for describing arrangement, such as "over" "above", "under", and "below", are used for convenience in describing a positional relation between components with reference to drawings. Furthermore, the positional relation between components is changed as appropriate in accordance with a direction in which each component is described. Thus, there is no limitation on terms used in this specification, and description can be made appropriately depending on the situation.

In this specification and the like, a transistor is an element having at least three terminals of a gate, a drain, and a source. The transistor has a channel formation region between a drain (a drain terminal, a drain region, or a drain electrode) and a source (a source terminal, a source region, or a source electrode), and current can flow through the drain region, the channel formation region, and the source region. Note that in this specification and the like, a channel formation region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, the expression "electrically connected" includes the case where components are connected through an "object having any electric function". There is no particular limitation on an "object having any electric function" as long as electric signals can be transmitted and received between components that are connected through the object. Examples of an "object having any electric function" are a switching element such as a transistor, a resistor, an inductor, a capacitor, and elements with a variety of functions as well as an electrode and a wiring.

Note that in this specification and the like, a "silicon oxynitride film" refers to a film that includes oxygen at a higher proportion than nitrogen, and a "silicon nitride oxide film" refers to a film that includes nitrogen at a higher proportion than oxygen.

In describing structures of the present invention with reference to the drawings in this specification and the like, the same reference numerals are used in common for the same portions in different drawings.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. A term "substantially parallel" indicates that the angle formed between two straight lines is greater than or equal to −30° and less than or equal to 30°. In addition, a term "perpendicular" indicates that the angle formed between two straight lines is greater than or equal to 80° and less than or equal to 100°, and accordingly includes the case where the angle is greater than or equal to 85° and less than or equal to 95°. A term "substantially perpendicular" indicates that the angle formed between two straight lines is greater than or equal to 60° and less than or equal to 120°.

In this specification and the like, the terms "film" and "layer" can be interchanged with each other depending on the case or circumstances. For example, the term "conductive layer" can be changed into the term "conductive film" in some cases. Also, the term "insulating film" can be changed into the term "insulating layer" in some cases.

Embodiment 1

In this embodiment, a semiconductor device of one embodiment of the present invention and a method for manufacturing the semiconductor device will be described with reference to FIGS. 2A to 1C, FIGS. 2A to 2C, FIGS. 3A to 3C, FIGS. 4A to 4C, FIGS. 5A to 5D, FIGS. 6A and 6B, FIGS. 7A to 7H, FIGS. 8A to 8H, FIGS. 9A to 9H, FIGS. 10A and 10B, FIGS. 11A to 11H, FIGS. 12A to 12H, FIGS. 13A to 13H, and FIGS. 14A and 14B.

<Structure Example 1 of Semiconductor Device>

Figure 1B:
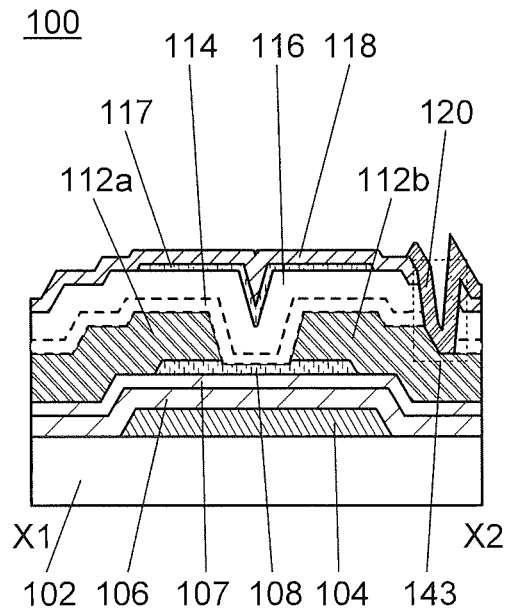
Figure 1C:
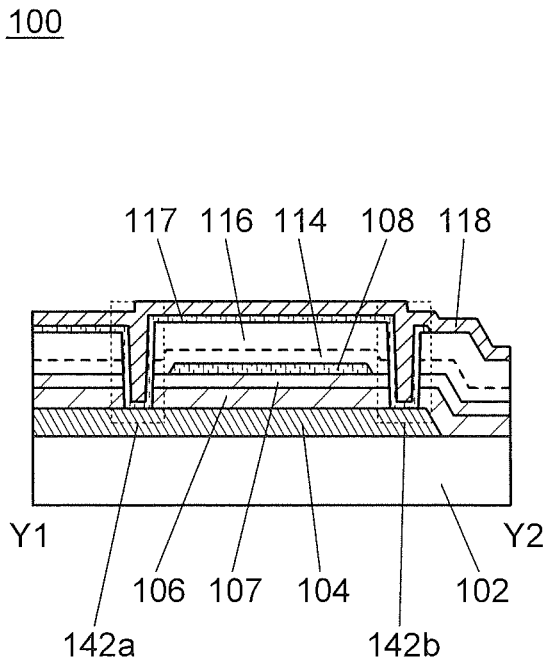

FIG. 1A is a top view of a transistor 100 that is a semiconductor device of one embodiment of the present invention. FIG. 1B is a cross-sectional view taken along a dashed dotted line X1-X2 in FIG. 1A, and FIG. 1C is a cross-sectional view taken along a dashed dotted line Y1-Y2 in FIG. 1A. Note that in FIG. 1A, some components of the transistor 100 (e.g., an insulating film serving as a gate insulating film) are not illustrated to avoid complexity. Furthermore, the direction of the dashed dotted line X1-X2 may be called a channel length direction, and the direction of the dashed dotted line Y1-Y2 may be called a channel width direction. As in FIG. 1A, some components are not illustrated in some cases in top views of transistors described below.

The transistor 100 includes a conductive film 104 functioning as a first gate electrode over a substrate 102, an insulating film 106 over the substrate 102 and the conductive film 104, an insulating film 107 over the insulating film 106, an oxide semiconductor film 108 over the insulating film 107, conductive films 112a and 112b functioning as source and drain electrodes electrically connected to the oxide semiconductor film 108, insulating films 114 and 116 over the oxide semiconductor film 108 and the conductive films 112a and 112b, and an oxide semiconductor film 117 functioning as a second gate electrode over the insulating film 116. The oxide semiconductor film 117 is electrically connected to the conductive film 104 through openings 142a and 142b provided in the insulating films 106, 107, 114, and 116. As illustrated in FIGS. 1A to 1C, an insulating film 118 covering the insulating film 116 and the oxide semiconductor film 117 may be provided. Furthermore, a conductive film 120 electrically connected to the conductive film 112b through an opening 143, which is provided in the insulating films 114, 116, and 118, may be provided.

In some cases, the insulating films 106 and 107 are collectively referred to as a first insulating film, which functions as a first gate insulating film of the transistor 100.

In some cases, the insulating films 114 and 116 are collectively referred to as a second insulating film, which includes oxygen and has a function of supplying oxygen to the oxide semiconductor film 108. The second insulating film functions as a second gate insulating film of the transistor 100. The insulating film 118 functions as a protective insulating film for inhibiting entry of impurities into the transistor 100.

The oxide semiconductor film 108 of the transistor 100 includes a channel formation region. When oxygen vacancy is formed in the oxide semiconductor film 108 included in the transistor 100, electrons serving as carriers are generated; as a result, the transistor 100 tends to be normally-on. Therefore, it is important to reduce oxygen vacancy in the oxide semiconductor film 108 for stable transistor characteristics. In the structure of the transistor of one embodiment of the present invention, excess oxygen is introduced into an insulating film over the oxide semiconductor film 108, here, the insulating film 114 over the oxide semiconductor film 108, whereby oxygen is moved from the insulating film 114 to the oxide semiconductor film 108 to fill oxygen vacancy in the oxide semiconductor film 108. Alternatively, excess oxygen is introduced into the insulating film 116 over the oxide semiconductor film 108, whereby oxygen is moved from the insulating film 116 to the oxide semiconductor film 108 through the insulating film 114 to fill oxygen vacancy in the oxide semiconductor film 108. Alternatively, excess oxygen is introduced into the insulating films 114 and 116 over the oxide semiconductor film 108, whereby oxygen is moved from both the insulating films 114 and 116 to the oxide semiconductor film 108 to fill oxygen vacancy in the oxide semiconductor film 108.

It is preferable that the insulating films 114 and 116 each include a region (oxygen excess region) including oxygen in excess of that in the stoichiometric composition. In other words, the insulating films 114 and 116 are each an insulating film capable of releasing oxygen. Note that the oxygen excess region is formed in each of the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed. Note that for the above plasma treatment, an apparatus with which an oxygen gas is made to be plasma by high-frequency power (also referred to as a plasma etching apparatus or a plasma ashing apparatus) is preferably used.

According to one embodiment of the present invention, oxygen is introduced into the insulating films 114 and 116 through an oxide semiconductor film to be the oxide semiconductor film 117 functioning as a second gate electrode later so that the oxygen excess region is provided in the insulating films 114 and 116. The oxide semiconductor film becomes the oxide semiconductor film 117 functioning as a second gate electrode by being processed after oxygen is introduced into the insulating films 114 and 116. In this manner, the oxide semiconductor film is used as a protective film at the time of introducing oxygen into the insulating films 114 and 116 and then processed into a second gate electrode, whereby the manufacturing process can be simplified.

Note that the oxide semiconductor film 117 functioning as a second gate electrode has a function of transmitting oxygen when oxygen is introduced and has conductivity after being processed. The oxide semiconductor film 117 includes the same metal element as at least one of metal elements of the oxide semiconductor film 108 and has a region thinner than the oxide semiconductor film 108. With the above structure of the oxide semiconductor film 117, oxygen can be favorably introduced into the insulating films 114 and 116.

Oxygen of the insulating films 114 and 116 is released, and diffused to the oxide semiconductor film 108 by heat treatment. The number of oxygen molecules released from the insulating films 114 and 116 can be measured by thermal desorption spectroscopy (TDS).

Providing the insulating films 114 and 116 over the oxide semiconductor film 108 in the above manner makes it possible to move oxygen in the insulating films 114 and 116 to the oxide semiconductor film 108, so that oxygen vacancy formed in the oxide semiconductor film 108 can be filled. Furthermore, the oxide semiconductor film 117, which has a function as a second gate electrode, provided over the insulating film 116 can control a potential on the back channel side of the channel formation region of the oxide semiconductor film 108. Therefore, in the semiconductor device of one embodiment of the present invention, the oxygen vacancy in the oxide semiconductor film 108 can be filled favorably and the potential on the back channel side of the oxide semiconductor film 108 can be controlled, whereby a highly reliable semiconductor device can be provided.

As illustrated in FIG. 1C, in the transistor 100, the oxide semiconductor film 117 functioning as a second gate electrode is connected to the conductive film 104 functioning as a first gate electrode through the openings 142a and 142b provided in the insulating films 106, 107, 114, and 116.

Accordingly, the oxide semiconductor film 117 and the conductive film 104 are supplied with the same potential.

Note that although the structure in which the openings 142a and 142b are provided so that the oxide semiconductor film 117 and the conductive film 104 are connected to each other is described in this embodiment, one embodiment of the present invention is not limited thereto. For example, a structure in which only one of the openings 142a and 142b is provided so that the oxide semiconductor film 117 and the conductive film 104 are connected to each other may be employed.

As illustrated in FIG. 1B, the oxide semiconductor film 108 is positioned to face each of the conductive film 104 functioning as a first gate electrode and the oxide semiconductor film 117 functioning as a second gate electrode, and is sandwiched between the two gate electrodes. The lengths in the channel length direction and the channel width direction of the oxide semiconductor film 117 functioning as a second gate electrode are longer than those in the channel length direction and the channel width direction of the oxide semiconductor film 108. The whole oxide semiconductor film 108 is covered with the oxide semiconductor film 117 with the insulating films 114 and 116 positioned therebetween. Since the oxide semiconductor film 117 functioning as a second gate electrode is connected to the conductive film 104 functioning as a first gate electrode through the opening 142a and 142b provided in the insulating films 106, 107, 114, and 116, a side surface of the oxide semiconductor film 108 in the channel width direction faces the oxide semiconductor film 117 functioning as a second gate electrode with the insulating films 114 and 116 positioned therebetween.

In other words, in the channel width direction of the transistor 100, the conductive film 104 functioning as a first gate electrode and the oxide semiconductor film 117 functioning as a second gate electrode are connected to each other through the openings provided in the insulating films 106 and 107 functioning as first gate insulating films and the insulating films 114 and 116 functioning as second gate insulating films; and the conductive film 104 and the oxide semiconductor film 117 surround the oxide semiconductor film 108 with the insulating films 106 and 107 functioning as first gate insulating films and the insulating films 114 and 116 functioning as second gate insulating films positioned therebetween.

Such a structure enables electric fields of the conductive film 104 functioning as a first gate electrode and the oxide semiconductor film 117 functioning as a second gate electrode to electrically surround the oxide semiconductor film 108 included in the transistor 100. A device structure of a transistor, like that of the transistor 100, in which electric fields of a first gate electrode and a second gate electrode electrically surround an oxide semiconductor film where a channel formation region is formed can be referred to as a surrounded channel (s-channel) structure.

Since the transistor 100 has the s-channel structure, an electric field for inducing a channel can be effectively applied to the oxide semiconductor film 108 by the conductive film 104 functioning as a first gate electrode; therefore, the current drive capability of the transistor 100 can be improved and high on-state current characteristics can be obtained. Since the on-state current can be increased, the size of the transistor 100 can be reduced. In addition, since the transistor 100 is surrounded by the conductive film 104 functioning as a first gate electrode and the oxide semiconductor film 117 functioning as a second gate electrode, the mechanical strength of the transistor 100 can be increased.

The conductive film 120 in the transistor 100 functions as, for example, a pixel electrode used for a display device.

Other components of the semiconductor device of this embodiment are described in detail below.

<Substrate>

There is no particular limitation on the property of a material and the like of the substrate 102 as long as the material has heat resistance enough to withstand at least heat treatment to be performed later. For example, a glass substrate, a ceramic substrate, a quartz substrate, a sapphire substrate, or the like may be used as the substrate 102. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used as the substrate 102. Still alternatively, any of these substrates provided with a semiconductor element may be used as the substrate 102. In the case where a glass substrate is used as the substrate 102, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<First Gate Electrode, Source Electrode, and Drain Electrode>

The conductive film 104 functioning as a first gate electrode and the conductive films 112a and 112b functioning as source and drain electrodes can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, and the like can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<First Gate Insulating Film>

As each of the insulating films 106 and 107 functioning as first gate insulating films of the transistor 100, an insulating layer including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 functions as a blocking film which keeps out oxygen. For example, in the case where excess oxygen is supplied to the insulating film 107, the insulating film 114, the insulating film 116, and/or the oxide semiconductor film 108, the insulating film 106 can keep out oxygen.

Note that the insulating film 107 that is in contact with the oxide semiconductor film 108 functioning as a channel formation region of the transistor 100 is preferably an oxide insulating film and preferably includes a region including oxygen in excess of the stoichiometric composition (oxygen-excess region). In other words, the insulating film 107 is an insulating film which is capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, by using hafnium oxide, a thickness can be made larger than that of silicon oxide; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the thickness of the insulating film can be increased. This makes it possible to reduce a decrease in withstand voltage of the transistor 100 and furthermore to increase the withstand voltage, thereby reducing electrostatic discharge damage to the transistor 100.

<Oxide Semiconductor Film>

The oxide semiconductor film 108 includes oxygen, In, Zn, and M (M is Ti, Ga, Y, Zr, Sn, La, Ce, Nd, or Hf). Typically, In—Ga oxide, In—Zn oxide, or In-M-Zn oxide can be used for the oxide semiconductor film 108. It is particularly preferable to use In-M-Zn oxide for the oxide semiconductor film 108.

In the case where the oxide semiconductor film 108 is formed of In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=3:1:2, and In:M:Zn=4:2:4.1 are preferable. In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratios of metal elements in the formed oxide semiconductor film 108 vary from the above atomic ratio of metal elements of the sputtering target within a range of ±40% as an error.

Note that in the case where the oxide semiconductor film 108 is formed of In-M-Zn oxide, the proportion of In and the proportion of M, not taking Zn and O into consideration, are preferably greater than or equal to 25 atomic % and less than 75 atomic %, respectively, or further preferably greater than or equal to 34 atomic % and less than 66 atomic %, respectively.

The energy gap of the oxide semiconductor film 108 is 2 eV or more, preferably 2.5 eV or more, or further preferably 3 eV or more. With the use of an oxide semiconductor having such a wide energy gap, the off-state current of the transistor 100 can be reduced.

The thickness of the oxide semiconductor film 108 is greater than or equal to 3 nm and less than or equal to 200 nm, preferably greater than or equal to 3 nm and less than or equal to 100 nm, or further preferably greater than or equal to 3 nm and less than or equal to 50 nm.

An oxide semiconductor film with low carrier density is used as the oxide semiconductor film 108. For example, an oxide semiconductor film whose carrier density is lower than or equal to $1\times10^{17}/cm^3$, preferably lower than or equal to $1\times10^{15}/cm^3$, further preferably lower than or equal to $1\times10^{13}/cm^3$, or still further preferably lower than or equal to $1\times10^{11}/cm^3$ is used as the oxide semiconductor film 108.

Note that, without limitation to those described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108 be set to be appropriate.

Note that it is preferable to use, as the oxide semiconductor film 108, an oxide semiconductor film in which the impurity concentration is low and density of defect states is low, in which case the transistor can have more excellent electrical characteristics. Here, the state in which impurity concentration is low and density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel formation region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Furthermore, the highly purified intrinsic or substantially highly purified intrinsic oxide semiconductor film has an extremely low off-state current; even when an element has a channel width W of $1\times10^6$ μm and a channel length L of 10 μm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Accordingly, the transistor in which the channel formation region is formed in the highly purified intrinsic or substantially highly purified intrinsic oxide semiconductor film can have a small variation in electrical characteristics and high reliability. Charges trapped by the trap states in the oxide semiconductor film take a long time to be released and may behave like fixed charges. Thus, the transistor whose channel formation region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal element causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by secondary ion mass spectrometry (SIMS) is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, or further preferably lower than or equal to $1\times10^{16}$ atoms/cm$^3$.

When silicon or carbon that is one of elements belonging to Group 14 is included in the oxide semiconductor film 108, oxygen vacancy is increased in the oxide semiconductor film 108, and the oxide semiconductor film 108 becomes an n-type film. Thus, the concentration of silicon or carbon (the concentration measured by SIMS) in the oxide semiconductor film 108 or the concentration of silicon or carbon (the concentration measured by SIMS) in the vicinity of an interface with the oxide semiconductor film 108 is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108.

Furthermore, when including nitrogen, the oxide semiconductor film 108 easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5\times10^{18}$ atoms/cm$^3$.

The oxide semiconductor film 108 may have a non-single-crystal structure, for example. The non-single crystal structure includes a c-axis aligned crystalline oxide semiconductor (CAAC-OS) which is described later, a polycrystalline structure, a microcrystalline structure, or an amorphous structure, for example. Among the non-single crystal structure, the amorphous structure has the highest density of defect states, whereas CAAC-OS has the lowest density of defect states.

The oxide semiconductor film 108 may have an amorphous structure, for example. The oxide semiconductor films having the amorphous structure each have disordered atomic arrangement and no crystalline component, for example. Alternatively, the oxide films having an amorphous structure have, for example, an absolutely amorphous structure and no crystal part.

Note that the oxide semiconductor film 108 may be a mixed film including two or more of the following: a region having an amorphous structure, a region having a microcrystalline structure, a region having a polycrystalline structure, a region of CAAC-OS, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Furthermore, in some cases, the mixed film has a stacked-layer structure of two or more of a region having an amorphous structure, a region having a microcrystalline structure, a region having a polycrystalline structure, a CAAC-OS region, and a region having a single-crystal structure.

<Second Gate Insulating Film>

The insulating films 114 and 116 each have a function as a second gate insulating film of the transistor 100. In addition, the insulating films 114 and 116 each have a function of supplying oxygen to the oxide semiconductor film 108. The insulating films 114 and 116 include oxygen. The insulating film 114 is an insulating film which can transmit oxygen. Note that the insulating film 114 also functions as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm, can be used as the insulating film 114.

In addition, it is preferable that the number of defects in the insulating film 114 be small and typically the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that transmits through the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the oxide insulating film in which the density of states due to nitrogen oxide is low between $E_{v\_os}$ and $E_{c\_os}$.

Note that a silicon oxynitride film that releases less nitrogen oxide is a film of which the amount of released ammonia is larger than the amount of released nitrogen oxide in thermal desorption spectroscopy analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than or equal to 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is released and diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the interface between the insulating film 114 and the oxide semiconductor film 108.

The insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. By using such an oxide insulating film, the shift in the threshold voltage of the transistor can be reduced, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than the strain point of the substrate, a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than or equal to 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the oxide insulating film having a low density of states due to nitrogen oxide between $E_{v\_os}$ and $E_{c\_os}$ measured by SIMS is lower than or equal to $6 \times 10^{20}$ atoms/cm$^3$.

The oxide insulating film in which the density of states due to nitrogen oxide is low between $E_{v\_os}$ and $E_{c\_os}$ is formed by a PECVD method at a substrate temperature higher than or equal to 220° C., higher than or equal to 280° C., or higher than or equal to 350° C. using silane and dinitrogen monoxide, whereby a dense and hard film can be formed.

The insulating film 116 is formed using an oxide insulating film that includes oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0 \times 10^{19}$ atoms/cm$^3$, preferably greater than or equal to $3.0 \times 10^{20}$ atoms/cm$^3$, in TDS measurement. Note that the temperature of the film surface in the TDS measurement is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm, can be used as the insulating film 116.

It is preferable that the number of defects in the insulating film 116 be small, and typically the spin density corresponding to a signal which appears at g=2.001 due to a dangling bond of silicon be lower than $1.5 \times 10^{18}$ spins/cm$^3$, or further preferably lower than or equal to $1 \times 10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be used.

<Second Gate Electrode>

The oxide semiconductor film 117 functioning as a second gate electrode includes the same metal element as at least one of the metal elements of the oxide semiconductor film 108. For example, in the case where the oxide semiconductor film 108 includes oxygen, In, Zn, and M (M is Ti, Ga, Sn, Y, Zr, La, Ce, Nd, or Hf), the oxide semiconductor film 117 includes at least one element selected from In, Zn, Ti, Ga, Sn, Y, Zr, La, Ce, Nd, or Hf. In particular, In—Sn oxide, In—Zn oxide, In—Ga oxide, Zn oxide, Al—Zn oxide, or In—Ga—Zn oxide is preferably used for the oxide semiconductor film 117.

In the case where In—Ga—Zn oxide is used for the oxide semiconductor film 108, the oxide semiconductor film 117 preferably includes at least Ga. In the case where In—Ga—Zn oxide is used for the oxide semiconductor film 108, the oxide semiconductor film 117 preferably includes at least Zn. In the case where In—Ga—Zn oxide is used for the oxide semiconductor film 108, the oxide semiconductor film 117 preferably includes at least Ga and Zn.

In the case where the oxide semiconductor film 117 is thin, the conductivity is lowered and therefore the oxide semiconductor film 117 is less likely to function as a second gate electrode. On the other hand, in the case where the oxide semiconductor film 117 is thick, oxygen is less likely to transmit through the oxide semiconductor film 117 when oxygen addition treatment is performed. Thus, the thickness of the oxide semiconductor film 117 is greater than or equal to 5 nm and less than or equal to 35 nm, preferably greater than or equal to 5 nm and less than or equal to 15 nm. The resistivity of the oxide semiconductor film 117 is greater than or equal to $10^{-8}$ Ω·cm and less than or equal to $10^{-1}$ Ω·cm, preferably greater than or equal to $10^{-5}$ Ω·cm and less than or equal to $10^{-2}$ Ω·cm, for example.

<Protective Insulating Film>

The insulating film 118 functions as a protective insulating film for the transistor 100. The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward release and diffusion of oxygen from the oxide semiconductor film 108, outward release and diffusion of oxygen included in the insulating films 114 and 116, and entry of hydrogen, water, or the like into the oxide semiconductor film 108 from the outside by providing the insulating film 118. A nitride insulating film can be used as the insulating film 118, for example. As the nitride insulating film, a silicon nitride film, a silicon nitride oxide film, an aluminum nitride film, an aluminum nitride oxide film, and the like can be given. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the variety of films such as the conductive films, the insulating films, and the oxide semiconductor film which are described above can be formed by a sputtering method or a PECVD method, such films may be formed by another method, e.g., a thermal CVD method or an atomic layer deposition (ALD) method. As an example of a thermal CVD method, a metal organic chemical vapor deposition (MOCVD) method can be given.

A thermal CVD method has an advantage that no defect due to plasma damage is generated because it does not utilize plasma for forming a film.

Deposition by a thermal CVD method may be performed in such a manner that a source gas and an oxidizer are supplied to a chamber at a time so that the pressure in the chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, and the oxide semiconductor films which are described above can be formed by a thermal CVD method such as an MOCVD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, i.e., ozone ($O_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas which is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are sequentially introduced plural times to form an initial tungsten film, and then a $WF_6$ gas and an $H_2$ gas are sequentially introduced plural times to form a tungsten film. Note that an $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are sequentially introduced plural times to form an InO layer, a $Ga(CH_3)_3$ gas and an $O_3$ gas are sequentially introduced plural times to form a GaO layer, and then a $Zn(CH_3)_2$ gas and an $O_3$ gas are sequentially introduced plural times to form a ZnO layer. Note that the order of these layers is not limited to this example. A mixed compound layer such as an In—Ga—O layer, an In—Zn—O layer, or a Ga—Zn—O layer may be formed by mixing of these gases. Note that although an $H_2O$ gas which is obtained by bubbling with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

<Structure Example 2 of Semiconductor Device>

A structure example different from that of the transistor 100 in FIGS. 1A to 1C is described with reference to FIGS. 2A to 2C. Note that in the case where a portion has a function similar to that described above, the same hatch pattern is applied to the portion, and the portion is not especially denoted by a reference numeral in some cases.

Figure 2A:
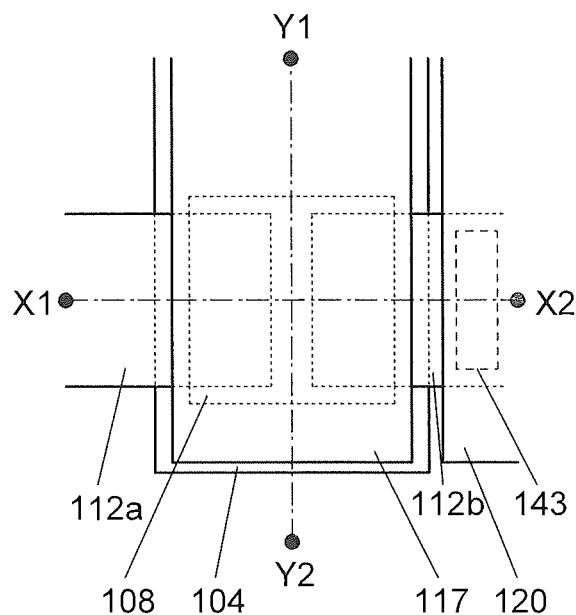
FIGS. 2A to 2C are a top view and cross-sectional views illustrating one embodiment of a semiconductor device.

FIG. 2A is a top view of a transistor 100A that is a semiconductor device of one embodiment of the present invention. FIG. 2B is a cross-sectional view taken along dashed-dotted line X1-X2 illustrated in FIG. 2A, and FIG. 2C is a cross-sectional view taken along dashed-dotted line Y1-Y2 illustrated in FIG. 2A.

The transistor 100A includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the conductive films 112a and 112b functioning as source and drain electrodes electrically connected to the oxide semiconductor film 108, the insulating films 114 and 116 over the oxide semiconductor film 108 and the conductive films 112a and 112b, and the oxide semiconductor film 117 functioning as a second gate electrode over the insulating film 116. As illustrated in FIGS. 2A to 2C, the insulating film 118 covering the insulating film 116 and the oxide semiconductor film 117 may be provided. Furthermore, the conductive film 120 electrically connected to the conductive film 112b through the opening 143, which is provided in the insulating films 114, 116, and 118, may be provided.

The transistor 100A is different from the transistor 100 described above in that the openings 142a and 142b are not provided. Note that the other components of the transistor 100A are the same as those of the transistor 100 described above, and an effect similar to that of the transistor 100 can be obtained.

As in the transistor 100A, in which the openings 142a and 142b are not provided, potentials which are different and independent from each other can be supplied to the conductive film 104 functioning as a first gate electrode and the oxide semiconductor film 117 functioning as a second gate electrode. For example, a negative or positive bias voltage is applied to the oxide semiconductor film 117 functioning as a second gate electrode so that the oxide semiconductor film 117 can have a function of adjusting the threshold voltage of the transistor 100A. Alternatively, a ground potential (GND) is applied to the oxide semiconductor film 117 functioning as a second gate electrode so that the potential of the oxide semiconductor film 117 can be a fixed potential.

<Structure Example 3 of Semiconductor Device>

A structure example different from that of the transistor 100 in FIGS. 1A to 1C is described with reference to FIGS. 3A to 3C. Note that in the case where a portion has a function similar to that described above, the same hatch pattern is applied to the portion, and the portion is not especially denoted by a reference numeral in some cases.

Figure 3A:
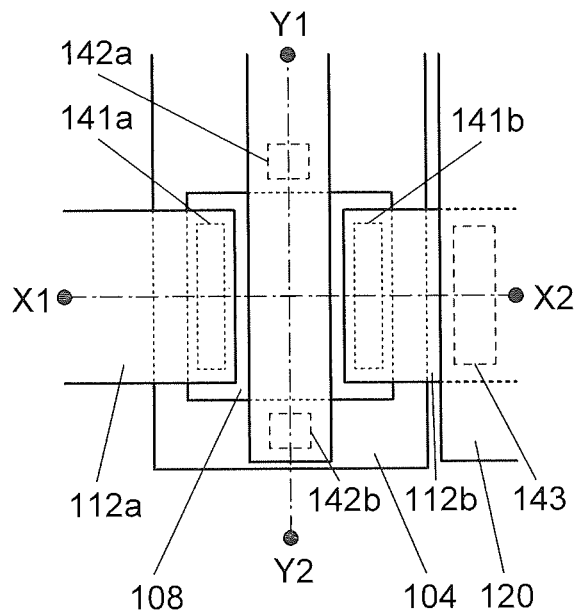
FIGS. 3A to 3C are a top view and cross-sectional views illustrating one embodiment of a semiconductor device.

FIG. 3A is a top view of a transistor 100B that is a semiconductor device of one embodiment of the present invention. FIG. 3B is a cross-sectional view taken along dashed-dotted line X1-X2 illustrated in FIG. 3A, and FIG. 3C is a cross-sectional view taken along dashed-dotted line Y1-Y2 illustrated in FIG. 3A.

The transistor 100B includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive films 112a and 112b functioning as source and drain electrodes electrically connected to the oxide semiconductor film 108 though openings 141a and 141b provided in the insulating film 114 and the insulating film 116, and the oxide semiconductor film 117 functioning as a second gate electrode, which is provided over the insulating film 116 and overlaps with the oxide semiconductor film 108. The oxide semiconductor film 117 is electrically connected to the conductive film 104 through the openings 142a and 142b provided in the insulating films 106, 107, 114, and 116. As illustrated in FIGS. 3A to 3C, the insulating film 118 covering the insulating film 116, the conductive films 112a and 112b, and the oxide semiconductor film 117 may be provided. Furthermore, the conductive film 120 electrically connected to the conductive film 112b through the opening 143, which is provided in the insulating film 118, may be provided.

Figure 3B:
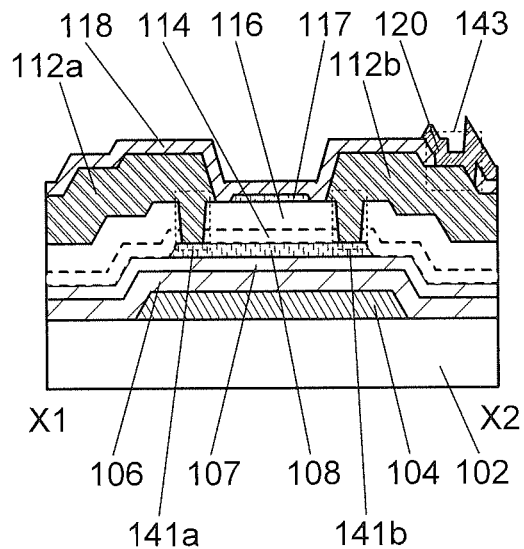
Figure 3C:
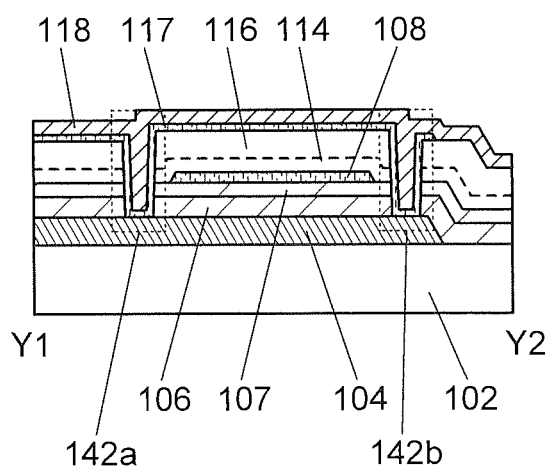

Although the transistor 100 and the transistor 100A have channel-etched structures, the transistor 100B in FIGS. 3A to 3C has a channel-protective structure. Thus, either the channel-etched structure or the channel-protective structure can be applied to the semiconductor device of one embodiment of the present invention.

Like the transistor 100, the transistor 100B is provided with the insulating films 114 and 116 over the oxide semiconductor film 108; therefore, oxygen included in the insulating films 114 and 116 can fill oxygen vacancy in the oxide semiconductor film 108. Furthermore, the oxide semiconductor film 117, which has a function as a second gate electrode, provided over the insulating film 116 can control a potential on the back channel side of the channel formation region of the oxide semiconductor film 108. Therefore, in the semiconductor device of one embodiment of the present invention, the oxygen vacancy in the oxide semiconductor film 108 can be filled favorably and the potential on the back channel side of the oxide semiconductor film 108 can be controlled, whereby a highly reliable semiconductor device can be provided.

<Structure Example 4 of Semiconductor Device>

A structure example different from that of the transistor 100C in FIGS. 3A to 3C is described with reference to FIGS. 4A to 4C. Note that in the case where a portion has a function similar to that described above, the same hatch pattern is applied to the portion, and the portion is not especially denoted by a reference numeral in some cases.

Figure 4A:
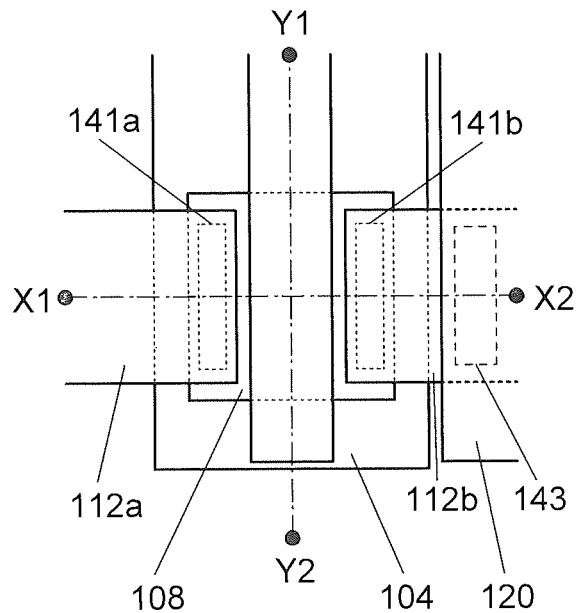
FIGS. 4A to 4C are a top view and cross-sectional views illustrating one embodiment of a semiconductor device.

FIG. 4A is a top view of a transistor 100C that is a semiconductor device of one embodiment of the present invention. FIG. 4B is a cross-sectional view taken along a dashed dotted line X1-X2 in FIG. 4A, and FIG. 4C is a cross-sectional view taken along a dashed dotted line Y1-Y2 in FIG. 4A.

The transistor 100C includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, the insulating film 114 over the oxide semiconductor film 108, the insulating film 116 over the insulating film 114, the conductive films 112a and 112b functioning as source and drain electrodes electrically connected to the oxide semiconductor film 108 though openings 141a and 141b provided in the insulating film 114 and the insulating film 116, and the oxide semiconductor film 117 functioning as a second gate electrode, which is provided over the insulating film 116 and overlaps with the oxide semiconductor film 108. As illustrated in FIGS. 4A to 4C, the insulating film 118 covering the insulating film 116, the conductive films 112a and 112b, and the oxide semiconductor film 117 may be provided. Furthermore, the conductive film 120 electrically connected to the conductive film 112b through the opening 143, which is provided in the insulating film 118, may be provided.

The transistor 100C is different from the transistor 100B described above in that the openings 142a and 142b are not provided. Note that the other components of the transistor 100C are the same as those of the transistor 100B described above, and an effect similar to that of the transistor 100B can be obtained.

As in the transistor 100C, in which the openings 142a and 142b are not provided, potentials which are different and independent from each other can be supplied to the conductive film 104 functioning as a first gate electrode and the oxide semiconductor film 117 functioning as a second gate electrode. For example, the oxide semiconductor film 117 functioning as a second gate electrode has a function of adjusting the threshold voltage of the transistor 100C by applying a negative or positive bias voltage thereto. Alternatively, the potential of the oxide semiconductor film 117 functioning as a second gate electrode can be a fixed potential by applying a ground potential (GND) thereto.

Note that the other components of the transistor 100C are the same as those of the transistor 100 illustrated in FIGS. 1A to 1C, and an effect similar to that of the transistor 100 can be obtained.

<Structural Example 5 of Semiconductor Device>

A structure example different from that of the transistor 100 in FIGS. 1A to 1C is described with reference to FIGS. 5A to 5D. Note that in the case where a portion has a function similar to that described above, the same hatch pattern is applied to the portion, and the portion is not especially denoted by a reference numeral in some cases.

Figure 5A:
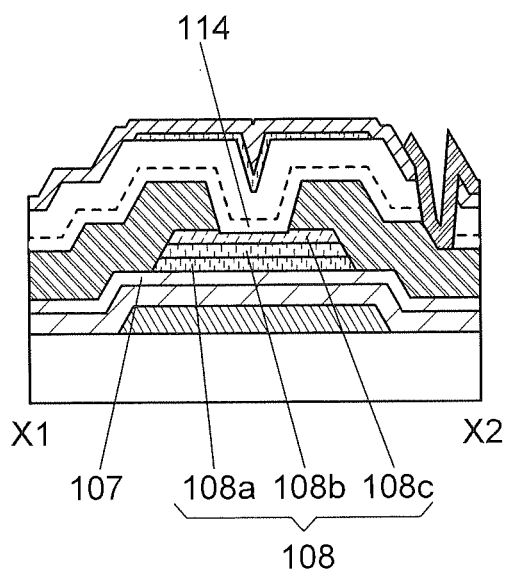
FIGS. 5A to 5D are cross-sectional views each illustrating one embodiment of a semiconductor device.
Figure 5B:
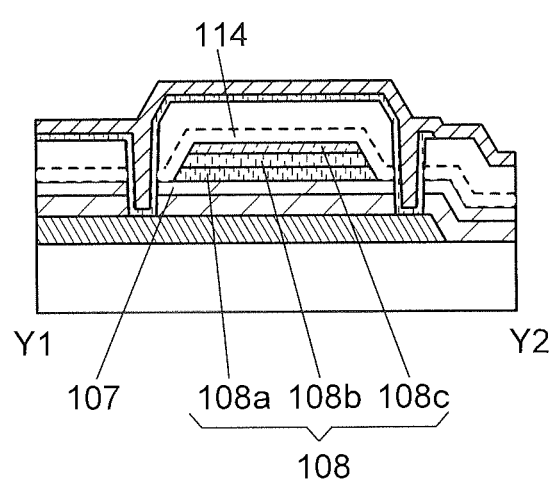
Figure 5C:
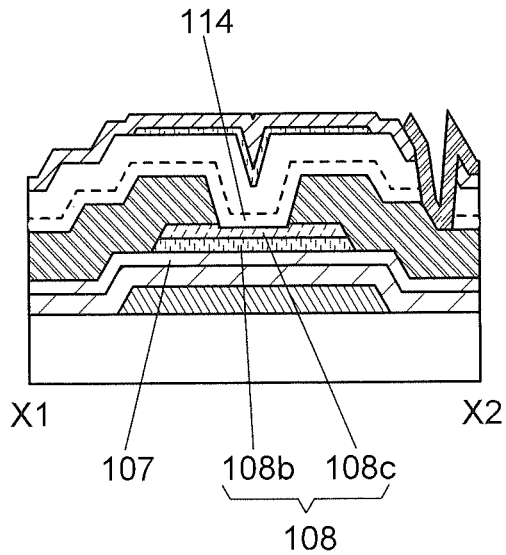
Figure 5D:
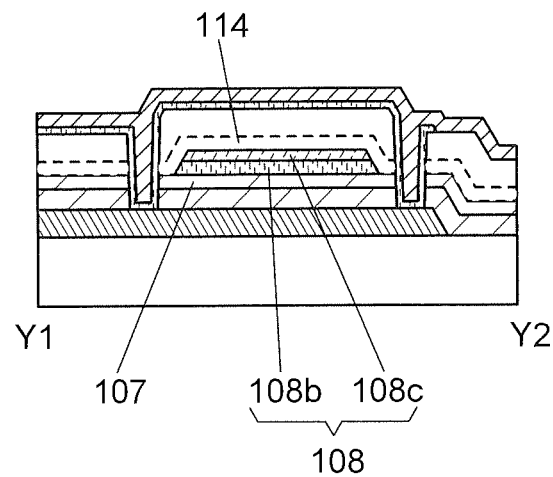

FIGS. 5A and 5B each illustrate a cross-sectional view of a modification example of the transistor 100 in FIGS. 1B and 1C. FIGS. 5C and 5D each illustrate a cross-sectional view of another modification example of the transistor 100 in FIGS. 1B and 1C.

A transistor 100D in FIGS. 5A and 5B has the same structure as the transistor 100 in FIGS. 1B and 1C except that the oxide semiconductor film 108 has a three-layer structure. Specifically, the oxide semiconductor film 108 of the transistor 100D includes an oxide semiconductor film 108a, an oxide semiconductor film 108b, and an oxide semiconductor film 108c. A transistor 100E in FIGS. 5C and 5D has the same structure as the transistor 100 in FIGS. 1B and 1C except that the oxide semiconductor film 108 has a two-layer structure. Specifically, the oxide semiconductor film 108 of the transistor 100E includes the oxide semiconductor film 108b and the oxide semiconductor film 108c.

Here, band structures including the oxide semiconductor films 108a, 108b, and 108c and insulating films in contact with the oxide semiconductor films 108b and 108c are described with reference to FIGS. 6A and 6B.

Figure 6A:
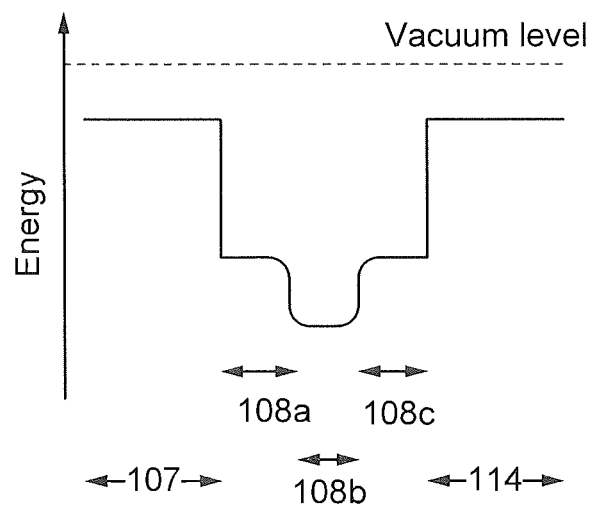
FIGS. 6A and 6B are band diagrams.

FIG. 6A shows an example of a band structure in the thickness direction of a stack including the insulating film 107, the oxide semiconductor films 108a, 108b, and 108c, and the insulating film 114. FIG. 6B shows an example of a band structure in the thickness direction of a stack including the insulating film 107, the oxide semiconductor films 108b and 108c, and the insulating film 114. For easy understanding, energy level of the conduction band minimum (Ec) of each of the insulating film 107, the oxide semiconductor films 108a, 108b, and 108c, and the insulating film 114 is shown in the band structures.

In FIG. 6A, a silicon oxide film is used as each of the insulating films 107 and 114, an oxide semiconductor film formed using a metal oxide target having an atomic ratio of metal elements of In:Ga:Zn=1:3:2 is used as the oxide semiconductor film 108a, an oxide semiconductor film formed using a metal oxide target having an atomic ratio of metal elements of In:Ga:Zn=1:1:1 is used as the oxide semiconductor film 108b, and an oxide semiconductor film formed using a metal oxide target having an atomic ratio of metal elements of In:Ga:Zn=1:3:2 is used as the oxide semiconductor film 108c.

Figure 6B:
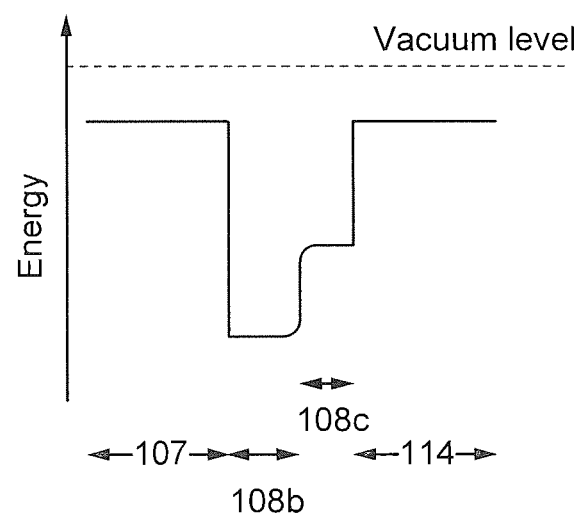

In the band structure of FIG. 6B, a silicon oxide film is used as each of the insulating films 107 and 114, an oxide semiconductor film formed using a metal oxide target having an atomic ratio of metal elements of In:Ga:Zn=1:1:1 is used as the oxide semiconductor film 108b, and a metal oxide film formed using a metal oxide target having an atomic ratio of metal elements of In:Ga:Zn=1:3:2 is used as the oxide semiconductor film 108c.

As illustrated in FIGS. 6A and 6B, the energy level of the conduction band minimum gradually varies between the oxide semiconductor film 108a and the oxide semiconductor film 108b and between the oxide semiconductor film 108b and the oxide semiconductor film 108c. In other words, the energy level of the conduction band minimum is continuously varied or continuously connected. To obtain such a band structure, there exists no impurity, which forms a defect state such as a trap center or a recombination center for the oxide semiconductor, at the interface between the oxide semiconductor film 108a and the oxide semiconductor film 108b or at the interface between the oxide semiconductor film 108b and the oxide semiconductor film 108c.

To form a continuous junction between the oxide semiconductor film 108a and the oxide semiconductor film 108b and between the oxide semiconductor film 108b and the oxide semiconductor film 108c, it is necessary to form the films successively without exposure to the air by using a multi-chamber deposition apparatus (sputtering apparatus) provided with a load lock chamber.

With the band structure of FIG. 6A or FIG. 6B, the oxide semiconductor film 108b serves as a well, and a channel formation region is formed in the oxide semiconductor film 108b in the transistor with the stacked-layer structure.

By providing the oxide semiconductor film 108a and/or the oxide semiconductor film 108c, the oxide semiconductor film 108b can be distanced away from trap states.

In addition, the trap states might be more distant from the vacuum level than the energy level of the conduction band minimum (Ec) of the oxide semiconductor film 108b functioning as a channel formation region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the trap states be closer to the vacuum level than the energy level of the conduction band minimum (Ec) of the oxide semiconductor film 108b. Such a structure inhibits accumulation of electrons in the trap states. As a result, the on-state current and the field-effect mobility of the transistor can be increased.

In FIGS. 6A and 6B, the energy level of the conduction band minimum of each of the oxide semiconductor films 108a and 108c is closer to the vacuum level than that of the oxide semiconductor film 108b. Typically, a difference in energy level between the conduction band minimum of the oxide semiconductor film 108b and the conduction band minimum of each of the oxide semiconductor films 108a and 108c is 0.15 eV or more or 0.5 eV or more and 2 eV or less or 1 eV or less. That is, the difference between the electron affinity of each of the oxide semiconductor films 108a and 108c and the electron affinity of the oxide semiconductor film 108b is 0.15 eV or more or 0.5 eV or more and 2 eV or less or 1 eV or less.

In such a structure, the oxide semiconductor film 108b serves as a main path of current and functions as a channel formation region. In addition, since the oxide semiconductor films 108a and 108c each include one or more metal elements included in the oxide semiconductor film 108b in which a channel formation region is formed, interface scattering is less likely to occur at the interface between the oxide semiconductor film 108a and the oxide semiconductor film 108b or at the interface between the oxide semiconductor film 108b and the oxide semiconductor film 108c. Thus, the transistor can have high field-effect mobility because the movement of carriers is not hindered at the interface.

To prevent each of the oxide semiconductor films 108a and 108c from functioning as part of a channel formation region, a material having sufficiently low conductivity is used for the oxide semiconductor films 108a and 108c. Alternatively, a material which has a smaller electron affinity (a difference in energy level between the vacuum level and the conduction band minimum) than the oxide semiconductor film 108b and has a difference in energy level in the conduction band minimum from the oxide semiconductor film 108b (band offset) is used for the oxide semiconductor films 108a and 108c. Furthermore, to inhibit generation of a difference between threshold voltages due to the value of the drain voltage, it is preferable to fotni the oxide semiconductor films 108a and 108c using a material whose energy level of the conduction band minimum is closer to the vacuum level than that of the oxide semiconductor film 108b by 0.2 eV or more, preferably 0.5 eV or more.

It is preferable that the oxide semiconductor films 108a and 108c not have a spinel crystal structure. This is because if the oxide semiconductor films 108a and 108c have a spinel crystal structure, constituent elements of the conductive films 112a and 112b might be released, and diffused to the oxide semiconductor film 108b at the interface between the spinel crystal structure and another region. Note that each of the oxide semiconductor film 108a and 108c is preferably a CAAC-OS, which is described later, in which case a higher blocking property against constituent elements of the conductive films 112a and 112b, for example, copper elements, is obtained.

The thickness of each of the oxide semiconductor films 108a and 108c is greater than or equal to a thickness that is capable of inhibiting release and diffusion of the constituent elements of the conductive films 112a and 112b to the oxide semiconductor film 108b, and less than a thickness that inhibits supply of oxygen from the insulating film 114 to the oxide semiconductor film 108b. For example, when the thickness of each of the oxide semiconductor films 108a and 108c is greater than or equal to 10 nm, release and diffusion of the constituent elements of the conductive films 112a and 112b to the oxide semiconductor film 108b can be inhibited. When the thickness of each of the oxide semiconductor films 108a and 108c is less than or equal to 100 nm, oxygen can be effectively supplied from the insulating films 114 and 116 to the oxide semiconductor film 108b.

When the oxide semiconductor films 108a and 108c are each an In-M-Zn oxide in which the atomic ratio of the element M (M is Ti, Ga, Sn, Y, Zr, La, Ce, Nd, or Hf) is higher than that of In, the energy gap of each of the oxide semiconductor films 108a and 108c can be large and the electron affinity thereof can be small. Therefore, a difference in electron affinity between the oxide semiconductor film 108b and each of the oxide semiconductor films 108a and 108c may be controlled by the proportion of the element M. Furthermore, oxygen vacancy is less likely to be generated in the oxide semiconductor film in which the atomic ratio of Ti, Ga, Sn, Y, Zr, La, Ce, Nd, or Hf is higher than that of In because Ti, Ga, Sn, Y, Zr, La, Ce, Nd, and Hf each are a metal element that is strongly bonded to oxygen.

When an In-M-Zn oxide is used for the oxide semiconductor films 108a and 108c, the proportions of In and M, not taking Zn and O into consideration, is preferably as follows: the atomic percentage of In is less than 50 atomic % and the atomic percentage of M is greater than or equal to 50 atomic %; or further preferably, the atomic percentage of In is less than 25 atomic % and the atomic percentage of M is greater than or equal to 75 atomic %. Alternatively, a gallium oxide film may be used as each of the oxide semiconductor films 108a and 108c. Alternatively, a Ga—Zn oxide film may be used as each of the oxide semiconductor films 108a and 108c.

Furthermore, in the case where each of the oxide semiconductor films 108a, 108b, and 108c is an In-M-Zn oxide, the proportion of M atoms in each of the oxide semiconductor films 108a and 108c is higher than that in the oxide semiconductor film 108b. Typically, the proportion of M atoms in each of the oxide semiconductor films 108a and 108c is 1.5 or more times, preferably twice or more times, or further preferably three or more times as high as that in the oxide semiconductor film 108b.

Furthermore, in the case where the oxide semiconductor films 108a, 108b, and 108c are each an In-M-Zn oxide, when the oxide semiconductor film 108b has an atomic ratio of In:M:Zn=$x_1$:$y_1$:$z_1$ and the oxide semiconductor films 108a and 108c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, or still further preferably $y_2/x_2$ is three or more times or four or more times as large as $y_1/x_1$. At this time, $y_1$ is preferably greater than or equal to $x_1$ in the oxide semiconductor film 108b, because stable electrical characteristics of a transistor including the oxide semiconductor film 108b can be achieved. However, when $y_1$ is three or more times as large as $x_1$, the field-effect mobility of the transistor including the oxide semiconductor film 108b is reduced. Accordingly, $y_1$ is preferably smaller than three times $x_1$.

In the case where the oxide semiconductor film 108b is an In-M-Zn oxide and a target having the atomic ratio of metal elements of In:M:Zn=$x_1$:$y_1$:$z_1$ is used for depositing the oxide semiconductor film 108b, $x^1/y^1$ is preferably greater than or equal to ⅓ and less than or equal to 6, or further preferably greater than or equal to 1 and less than or equal to 6, and $z_1/y_1$ is preferably greater than or equal to ⅓ and less than or equal to 6, or further preferably greater than or equal to 1 and less than or equal to 6. Note that when $z_1/y_1$ is greater than or equal to 1 and less than or equal to 6, a CAAC-OS to be described later is easily formed as the oxide semiconductor film 108b. Typical examples of the atomic ratio of the metal elements of the target are In:M:Zn=1:1:1, In:M:Zn=1:1:1.2, and In:M:Zn=3:1:2.

In the case where the oxide semiconductor films 108a and 108c are each an In-M-Zn oxide and a target having an atomic ratio of metal elements of In:M:Zn=$x_2$:$y_2$:$z_2$ is used for depositing the oxide semiconductor films 108a and 108c, $x_2/y_2$ is preferably less than $x_1/y_1$, and $z_2/y_2$ is preferably greater than or equal to ⅓ and less than or equal to 6, or further preferably greater than or equal to 1 and less than or equal to 6. When the atomic ratio of M with respect to indium is high, the energy gap of the oxide semiconductor films 108a and 108c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, In:M:Zn=1:3:6, In:M:Zn=1:4:2, In:M:Zn=1:4:4, In:M:Zn=1:4:5, and In:M:Zn=1:5:5.

Furthermore, in the case where the oxide semiconductor films 108a and 108c are each an In-M oxide, when a divalent metal element (e.g., zinc) is not included as M, the oxide semiconductor films 108a and 108c which do not include a spinel crystal structure can be formed. As the oxide semiconductor films 108a and 108c, for example, an In—Ga oxide film can be used. The In—Ga oxide film can be formed by a sputtering method using an In—Ga metal oxide target (In:Ga=7:93), for example. To deposit the oxide semiconductor films 108a and 108c by a sputtering method using DC discharge, on the assumption that an atomic ratio of In:M is x:y, it is preferable that y/(x+y) be less than or equal to 0.96, or further preferably less than or equal to 0.95, for example, 0.93.

In each of the oxide semiconductor films 108a, 108b, and 108c, the proportions of the atoms in the above atomic ratio vary within a range of ±40% as an error.

The structures of the transistors of this embodiment can be freely combined with each other.

<Method 1 for Manufacturing Semiconductor Device>

Next, a method for manufacturing the transistor 100 that is a semiconductor device of one embodiment of the present invention is described in detail below with reference to FIGS. 7A to 7H, FIGS. 8A to 8H, and FIGS. 9A to 9H. FIGS. 7A to 7H, FIGS. 8A to 8H, and FIGS. 9A to 9H are cross-sectional views illustrating a method for manufacturing a semiconductor device.

FIGS. 7A, 7C, 7E, and 7G, FIGS. 8A, 8C, 8E, and 8G, and FIGS. 9A, 9C, 9E, and 9G are each a cross-sectional view in the channel length direction of the transistor 100, and FIGS. 7B, 7D, 7F, and 7H, FIGS. 8B, 8D, 8F, and 8H, and FIGS. 9B, 9D, 9F, and 9H are each a cross-sectional view in the channel width direction of the transistor 100.

Note that the films included in the transistor 100 (i.e., the insulating film, the oxide semiconductor film, the conductive film, and the like) can be formed by any of a sputtering method, a chemical vapor deposition (CVD) method, a vacuum evaporation method, and a pulsed laser deposition (PLD) method. Alternatively, a coating method or a printing method can be used. Although the sputtering method and a PECVD method are typical examples of the film formation method, a thermal CVD method or an atomic layer deposition (ALD) method may be used. As the thermal CVD method, an MOCVD method may be used, for example.

Deposition by the thermal CVD method may be performed in such a manner that the pressure in a chamber is set to an atmospheric pressure or a reduced pressure, and a source gas and an oxidizer are supplied to the chamber at a time and react with each other in the vicinity of the substrate or over the substrate. Thus, no plasma is generated in the deposition; therefore, the thermal CVD method has an advantage that no defect due to plasma damage is caused.

Deposition by the ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching switching valves (also referred to as high-speed valves). In such a case, a first source gas is introduced, an inert gas (e.g., argon or nitrogen) or the like is introduced at the same time as or after introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first single-atomic layer; then the second source gas is introduced to react with the first single-atomic layer; as a result, a second single-atomic layer is stacked over the first single-atomic layer, so that a thin film is formed.

The sequence of the gas introduction is repeated plural times until a desired thickness is obtained, whereby a thin film with excellent step coverage can be formed.

The thickness of the thin film can be adjusted by the number of repetition times of the sequence of the gas introduction; therefore, an ALD method makes it possible to accurately adjust a thickness and thus is suitable for manufacturing a minute transistor.

First, a conductive film is formed over the substrate 102 and processed through a lithography process and an etching process, whereby the conductive film 104 functioning as a first gate electrode is formed. Then, the insulating films 106 and 107 functioning as first gate insulating films are formed over the conductive film 104 (see FIGS. 7A and 7B).

The conductive film 104 functioning as a first gate electrode can be formed by a sputtering method, a CVD method, a vacuum evaporation method, or a PLD method. Alternatively, a coating method or a printing method can be used. Although typical deposition methods are a sputtering method and a PECVD method, a thermal CVD method, such as an MOCVD method, or an ALD method described above may be used.

In this embodiment, a glass substrate is used as the substrate 102, and as the conductive film 104 functioning as a first gate electrode, a 100-nm-thick tungsten film is formed by a sputtering method.

The insulating films 106 and 107 functioning as first gate insulating films can be formed by a sputtering method, a PECVD method, a thermal CVD method, a vacuum evaporation method, a PLD method, or the like. In this embodiment, a 400-nm-thick silicon nitride film as the insulating film 106 and a 50-nm-thick silicon oxynitride film as the insulating film 107 are formed by a PECVD method.

Note that the insulating film 106 can have a stacked-layer structure of silicon nitride films. Specifically, the insulating film 106 can have a three-layer structure of a first silicon nitride film, a second silicon nitride film, and a third silicon nitride film. An example of the three-layer structure is as follows.

For example, the first silicon nitride film can be formed to have a thickness of 50 nm under the conditions where silane at a flow rate of 200 sccm, nitrogen at a flow rate of 2000 sccm, and an ammonia gas at a flow rate of 100 sccm are supplied as a source gas to a reaction chamber of a PECVD apparatus, the pressure in the reaction chamber is controlled to 100 Pa, and the power of 2000 W is supplied using a 27.12 MHz high-frequency power source.

The second silicon nitride film can be formed to have a thickness of 300 nm under the conditions where silane at a flow rate of 200 sccm, nitrogen at a flow rate of 2000 sccm, and an ammonia gas at a flow rate of 2000 sccm are supplied as a source gas to the reaction chamber of the PECVD apparatus, the pressure in the reaction chamber is controlled to 100 Pa, and the power of 2000 W is supplied using a 27.12 MHz high-frequency power source.

The third silicon nitride film can be formed to have a thickness of 50 nm under the conditions where silane at a flow rate of 200 sccm and nitrogen at a flow rate of 5000 sccm are supplied as a source gas to the reaction chamber of the PECVD apparatus, the pressure in the reaction chamber is controlled to 100 Pa, and the power of 2000 W is supplied using a 27.12 MHz high-frequency power source.

Note that the first silicon nitride film, the second silicon nitride film, and the third silicon nitride film can each be formed at a substrate temperature of 350° C.

When the insulating film 106 has the three-layer structure of silicon nitride films, for example, in the case where a conductive film including Cu is used as the conductive film 104, the following effect can be obtained.

The first silicon nitride film can inhibit release and diffusion of a copper (Cu) element from the conductive film 104. The second silicon nitride film has a function of releasing hydrogen and can improve withstand voltage of the insulating film functioning as a gate insulating film. The third silicon nitride film releases a small amount of hydrogen and can inhibit diffusion of hydrogen released from the second silicon nitride film.

The insulating film 107 is preferably an insulating film including oxygen to improve characteristics of an interface with the oxide semiconductor film 108 formed later.

Figure 7A:
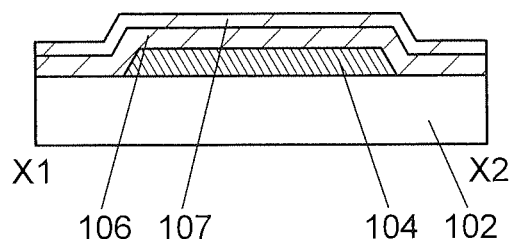
FIGS. 7A to 7H are cross-sectional views illustrating an example of a manufacturing process of a semiconductor device.
Figure 7B:
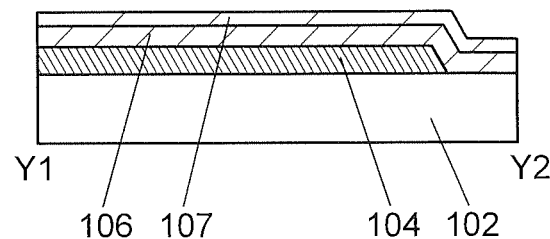
Figure 7C:
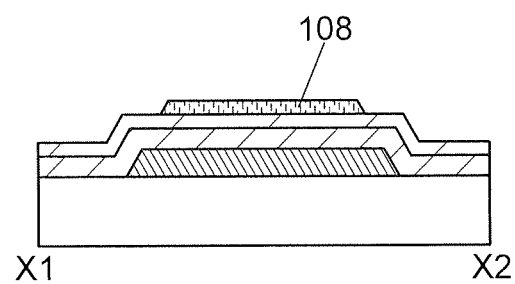
Figure 7D:
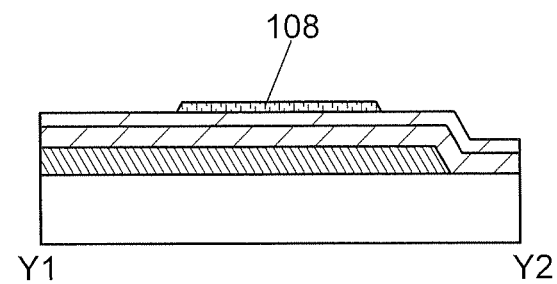

Next, the oxide semiconductor film 108 is formed over the insulating film 107 (see FIGS. 7C and 7D).

In this embodiment, an oxide semiconductor film is formed by a sputtering method using an In—Ga—Zn metal oxide target (having an atomic ratio of In:Ga:Zn=1:1:1.2), a mask is formed over the oxide semiconductor film through a lithography process, and the oxide semiconductor film is processed into a desired region, whereby the oxide semiconductor film 108 having an island shape is formed.

After the oxide semiconductor film 108 is formed, heat treatment may be performed at a temperature higher than or equal to 150° C. and lower than the strain point of the substrate, preferably higher than or equal to 200° C. and lower than or equal to 450° C., or further preferably higher than or equal to 300° C. and lower than or equal to 450° C. The heat treatment performed here serves as one kind of treatment for increasing the purity of the oxide semiconductor film and can reduce hydrogen, water, and the like included in the oxide semiconductor film 108. Note that the heat treatment for the purpose of reducing hydrogen, water, and the like may be performed before the oxide semiconductor film 108 is processed into an island shape.

An electric furnace, an RTA apparatus, or the like can be used for the heat treatment performed on the oxide semiconductor film 108. With the use of an RTA apparatus, the heat treatment can be performed at a temperature higher than or equal to the strain point of the substrate if the heating time is short. Therefore, the heat treatment time can be shortened.

Note that the heat treatment performed on the oxide semiconductor film 108 may be performed under an atmosphere of nitrogen, oxygen, ultra-dry air (air in which a water content is 20 ppm or less, preferably 1 ppm or less, or further preferably 10 ppb or less), or a rare gas (argon, helium, or the like). The atmosphere of nitrogen, oxygen, ultra-dry air, or a rare gas preferably does not contain hydrogen, water, and the like. Furthermore, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the oxide semiconductor film and oxygen can be supplied to the oxide semiconductor film at the same time. Consequently, the amount of oxygen vacancy in the oxide semiconductor film can be reduced.

In the case where the oxide semiconductor film 108 is formed by a sputtering method, as a sputtering gas, a rare gas (typically argon), oxygen, or a mixed gas of a rare gas and oxygen is used as appropriate. In the case of using the mixed gas of a rare gas and oxygen, the proportion of oxygen to a rare gas is preferably increased. In addition, increasing the purity of a sputtering gas is necessary. For example, as an oxygen gas or an argon gas used for a sputtering gas, a gas which is highly purified to have a dew point of −40° C. or lower, preferably −80° C. or lower, further preferably −100° C. or lower, or still further preferably −120° C. or lower is used, whereby entry of moisture and the like into the oxide semiconductor film 108 can be minimized.

In the case where the oxide semiconductor film 108 is formed by a sputtering method, a chamber in a sputtering apparatus is preferably evacuated to be a high vacuum state (to the degree of about $5 \times 10^{-7}$ Pa to $1 \times 10^{-4}$ Pa) with an adsorption vacuum evacuation pump such as a cryopump in order to remove water or the like, which serves as an impurity for the oxide semiconductor film 108, as much as possible. Alternatively, a turbo molecular pump and a cold trap are preferably combined so as to prevent a backflow of a gas, especially a gas including carbon or hydrogen, from an exhaust system to the inside of the chamber.

Figure 7E:
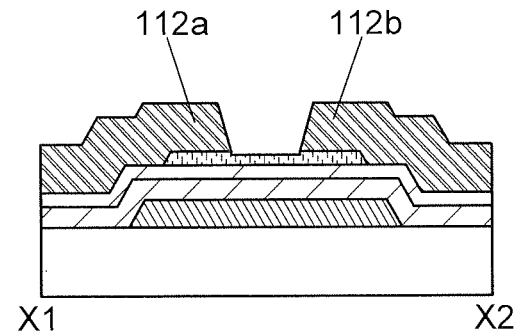
Figure 7F:
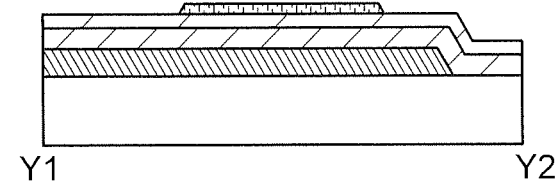

Next, the conductive films 112a and 112b functioning as source and drain electrodes are formed over the insulating film 107 and the oxide semiconductor film 108 (see FIGS. 7E and 7F).

In this embodiment, the conductive films 112a and 112b are formed in the following manner: a stack of a 50-nm-thick tungsten film and a 400-nm-thick aluminum film is formed by a sputtering method, a mask is formed over the stack through a lithography process, and the stack is processed into desired regions. Although the conductive films 112a and 112b each have a two-layer structure in this embodiment, one embodiment of the present invention is not limited thereto. For example, the conductive films 112a and 112b each may have a three-layer structure of a 50-nm-thick tungsten film, a 400-nm-thick aluminum film, and a 100-nm-thick titanium film.

After the conductive films 112a and 112b are formed, a surface of the oxide semiconductor film 108 (on a back channel side) may be cleaned. The cleaning may be performed, for example, using a chemical solution such as phosphoric acid. The cleaning using a chemical solution such as a phosphoric acid can remove impurities (e.g., an element included in the conductive films 112a and 112b) attached to the surface of the oxide semiconductor film 108.

Note that a recessed portion might be formed in part of the oxide semiconductor film 108 at the step of forming the conductive films 112a and 112b and/or the cleaning step.

Figure 7G:
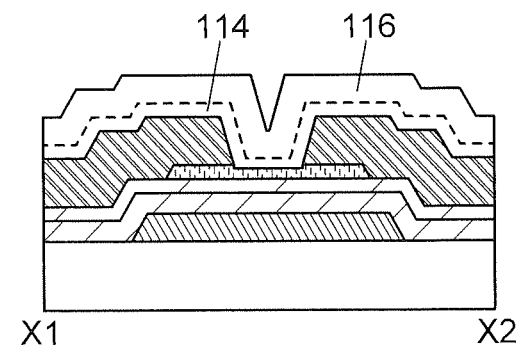
Figure 7H:
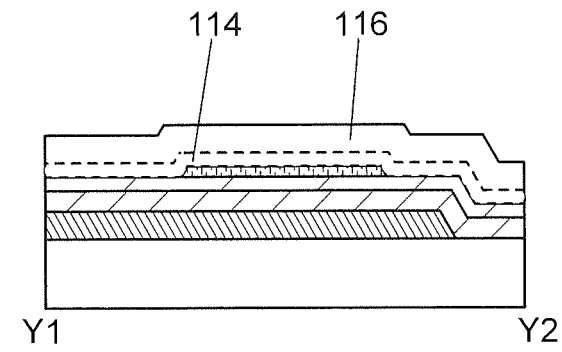

Next, over the oxide semiconductor film 108 and the conductive films 112a and 112b, the insulating films 114 and 116 functioning as second gate insulating films are formed (see FIGS. 7G and 7H).

Note that after the insulating film 114 is formed, the insulating film 116 is preferably formed in succession without exposure to the air. After the insulating film 114 is formed, the insulating film 116 is formed in succession by adjusting at least one of the flow rate of a source gas, pressure, a high-frequency power, and a substrate temperature without exposure to the air, whereby the concentration of impurities attributed to the atmospheric component at the interface between the insulating film 114 and the insulating film 116 can be reduced, and oxygen in the insulating films 114 and 116 can be moved to the oxide semiconductor film 108; accordingly, the amount of oxygen vacancy in the oxide semiconductor film 108 can be reduced.

For example, as the insulating film 114, a silicon oxynitride film can be formed by a PECVD method. In this case, a deposition gas including silicon and an oxidizing gas are preferably used as a source gas. Typical examples of the deposition gas including silicon include silane, disilane, trisilane, and silane fluoride. Examples of the oxidizing gas include dinitrogen monoxide and nitrogen dioxide. An insulating film including nitrogen and having a small number of defects can be formed as the insulating film 114 by a PECVD method under the conditions where the ratio of the oxidizing gas to the deposition gas is higher than 20 times and lower than 100 times, preferably higher than or equal to 40 times and lower than or equal to 80 times, and the pressure in a treatment chamber is lower than 100 Pa, preferably lower than or equal to 50 Pa.

In this embodiment, a 50-m-thick silicon oxynitride film is formed as the insulating film 114 by a PECVD method under the conditions where the substrate 102 is held at a temperature of 220° C., silane at a flow rate of 50 sccm and dinitrogen monoxide at a flow rate of 2000 sccm are used as a source gas, the pressure in the treatment chamber is 20 Pa, and a high-frequency power of 100 W at 13.56 MHz ($1.6 \times 10^{-2}$ W/cm$^2$ as the power density) is supplied to parallel-plate electrodes.

As the insulating film 116, a silicon oxide film or a silicon oxynitride film is formed under the conditions where the substrate placed in a treatment chamber of the PECVD apparatus, which is vacuum-evacuated, is held at a temperature higher than or equal to 180° C. and lower than or equal to 280° C., preferably higher than or equal to 200° C. and lower than or equal to 240° C., the pressure is greater than or equal to 100 Pa and less than or equal to 250 Pa, preferably greater than or equal to 100 Pa and less than or equal to 200 Pa, with introduction of a source gas into the treatment chamber, and a high-frequency power greater than or equal to 0.17 W/cm$^2$ and less than or equal to 0.5 W/cm$^2$, preferably greater than or equal to 0.25 W/cm$^2$ and less than or equal to 0.35 W/cm$^2$, is supplied to an electrode provided in the treatment chamber.

As the deposition conditions of the insulating film 116, the high-frequency power having the above power density is supplied to a reaction chamber having the above pressure, whereby the degradation efficiency of the source gas in plasma is increased, oxygen radicals are increased, and oxidation of the source gas is promoted; thus, the oxygen content in the insulating film 116 becomes higher than that in the stoichiometric composition. On the other hand, in the film formed at a substrate temperature within the above temperature range, the bond between silicon and oxygen is weak, and accordingly, part of oxygen in the film is released by heat treatment in a later step. Thus, an oxide insulating film which includes oxygen in excess of that in the stoichiometric composition and from which part of oxygen is released by heating can be formed.

Note that the insulating film 114 functions as a protective film for the oxide semiconductor film 108 in the step of forming the insulating film 116. Therefore, the insulating film 116 can be formed using the high-frequency power having a high power density while damage to the oxide semiconductor film 108 is reduced.

Note that in the deposition conditions of the insulating film 116, when the flow rate of the deposition gas including silicon with respect to the oxidizing gas is increased, the number of defects in the insulating film 116 can be reduced. Typically, it is possible to form an oxide insulating layer in which the number of defects is small, i.e., the spin density of a signal which appears at g=2.001 originating from a dangling bond of silicon is lower than $6\times10^{17}$ spins/cm$^3$, preferably lower than or equal to $3\times10^{17}$ spins/cm$^3$, or further preferably lower than or equal to $1.5\times10^{17}$ spins/cm$^3$, by ESR measurement. As a result, the reliability of the transistor can be improved.

Heat treatment may be performed after the insulating films 114 and 116 are formed. The heat treatment can reduce nitrogen oxide included in the insulating films 114 and 116. By the heat treatment, part of oxygen included in the insulating films 114 and 116 can be moved to the oxide semiconductor film 108, so that the amount of oxygen vacancy included in the oxide semiconductor film 108 can be reduced.

The temperature of the heat treatment performed on the insulating films 114 and 116 is typically higher than or equal to 150° C. and lower than or equal to 400° C., preferably higher than or equal to 300° C. and lower than or equal to 400° C., or further preferably higher than or equal to 320° C. and lower than or equal to 370° C. The heat treatment may be performed under an atmosphere of nitrogen, oxygen, ultra-dry air (air in which a water content is 20 ppm or less, preferably 1 ppm or less, or further preferably 10 ppb or less), or a rare gas (argon, helium, and the like). Note that an electric furnace, an RTA apparatus, and the like can be used for the heat treatment, in which it is preferable that hydrogen, water, and the like not be included in the nitrogen, oxygen, ultra-dry air, or rare gas.

In this embodiment, the heat treatment is performed at 350° C. in a nitrogen atmosphere for 1 hour.

Figure 8A:
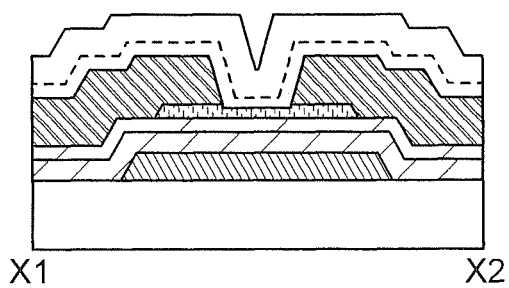
FIGS. 8A to 8H are cross-sectional views illustrating an example of a manufacturing process of a semiconductor device.
Figure 8B:
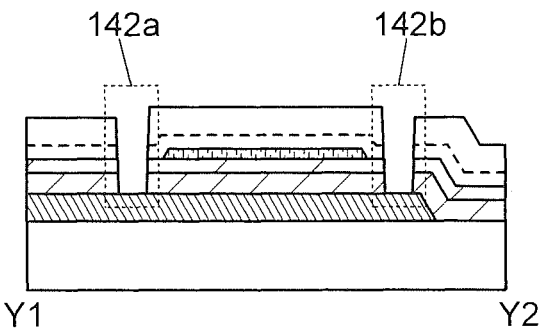

Next, a mask is formed over the insulating film 116 through a lithography process, and the openings 142a and 142b are formed in the insulating films 106, 107, 114, and 116 (see FIGS. 8A and 8B).

Note that the openings 142a and 142b reach the conductive film 104 functioning as a first gate electrode. The openings 142a and 142b can be formed with a dry etching apparatus and/or a wet etching apparatus.

Figure 8C:
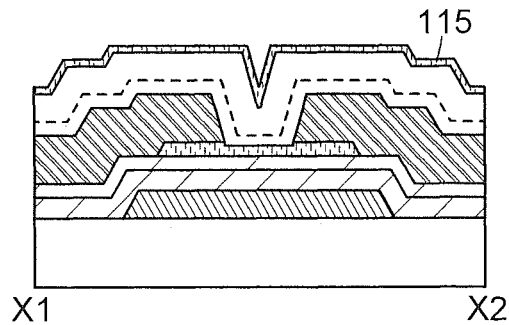
Figure 8D:
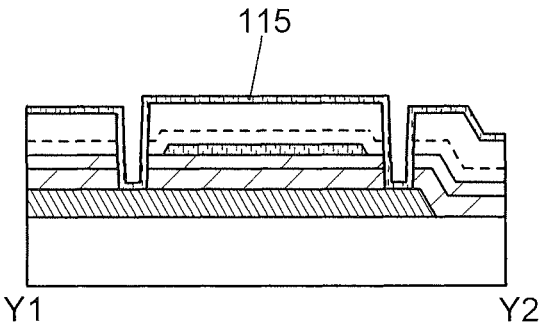

Next, an oxide semiconductor film 115 is formed over the insulating film 116 to cover the openings 142a and 142b (see FIGS. 8C and 8D).

In this embodiment, as the oxide semiconductor film 115, a 5-nm-thick In—Ga—Zn oxide film (In:Ga:Zn=1:4:5 [atomic %]) is formed by a sputtering method. In the case of forming the oxide semiconductor film 115 by a sputtering method, oxygen is used as a deposition gas, and the proportion of oxygen in the deposition gas is preferably increased. For example, in the case of forming the In—Ga—Zn oxide film (In:Ga:Zn=1:4:5 [atomic %]), oxygen is used as a deposition gas, and sputtering can be performed under an atmosphere containing oxygen at 100%. The oxide semiconductor film 115 includes excess oxygen by a high proportion of oxygen in the deposition gas. When the oxide semiconductor film 115 includes excess oxygen, oxygen can transmit effectively through the oxide semiconductor film 115 when oxygen is added later; therefore, oxygen can be added effectively to the insulating films 114 and 116.

Figure 8E:
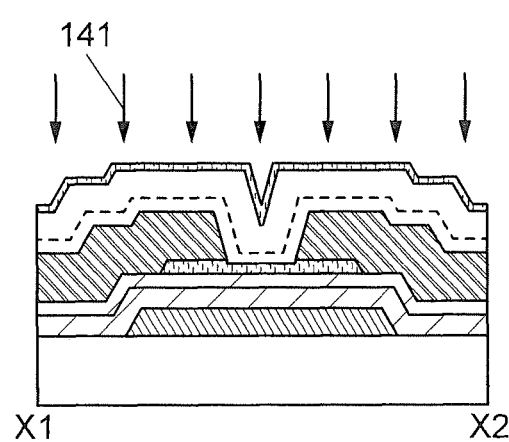
Figure 8F:
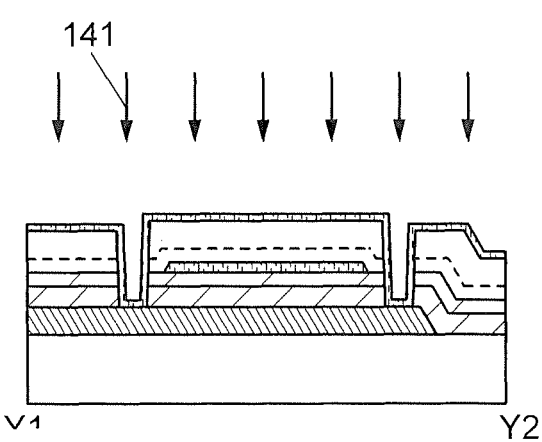

Next, oxygen 141 is added to the insulating films 114 and 116 and the oxide semiconductor film 108 through the oxide semiconductor film 117 (see FIGS. 8E and 8F).

As a method for adding the oxygen 141 to the insulating films 114 and 116 and the oxide semiconductor film 108 through the oxide semiconductor film 115, an ion doping method, an ion implantation method, plasma treatment, or the like is given. By application of bias voltage to the substrate side when the oxygen 141 is added, the oxygen 141 can be effectively added to the insulating films 114 and 116 and the oxide semiconductor film 108. As the bias voltage, for example, an ashing apparatus is used, and power density applied to a substrate side of the ashing apparatus can be greater than or equal to 1 W/cm$^2$ and less than or equal to 5 W/cm$^2$.

Here, examples of an ashing apparatus in which the oxygen 141 is added to the insulating films 114 and 116 and the oxide semiconductor film 108 through the oxide semiconductor film 115 and a concept of oxygen plasma in the ashing apparatus are described with reference to FIGS. 14A and 14B.

Figure 14A:
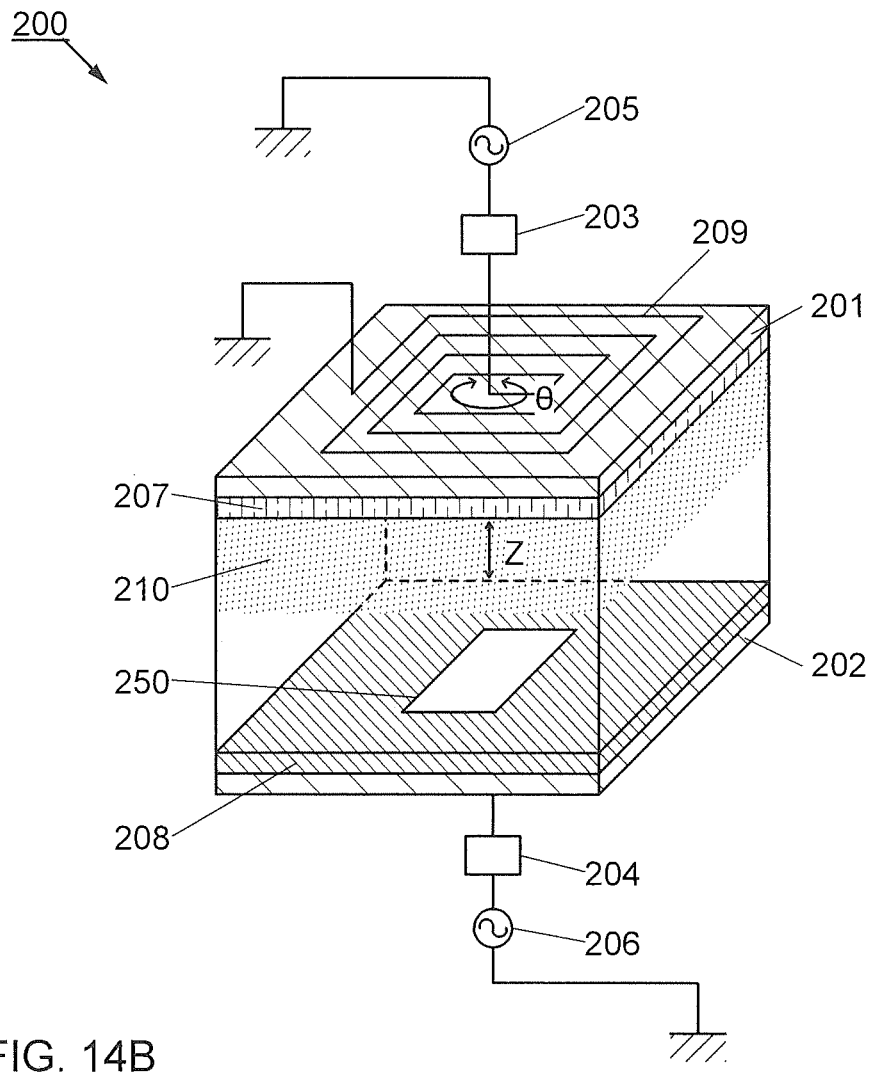
FIGS. 14A and 14B are a schematic diagram illustrating an ashing apparatus and a conceptual diagram illustrating oxygen plasma in the ashing apparatus during oxygen addition treatment.

FIG. 14A is a schematic diagram illustrating an ashing apparatus capable of performing oxygen addition treatment. FIG. 14B is a conceptual diagram illustrating the state of oxygen plasma in the ashing apparatus during oxygen addition treatment.

An ashing apparatus 200 illustrated in FIG. 14A uses inductively-coupled plasma (ICP).

The ashing apparatus 200 includes an upper electrode 201 provided above a reaction space, a first high-frequency power source 205 electrically connected to the upper electrode 201 with a matching box 203 provided therebetween, a dielectric 207 provided between the upper electrode 201 and the reaction space, a lower electrode 202 provided below the reaction space, a second high-frequency power source 206 electrically connected to the lower electrode 202 with a matching box 204 provided therebetween, and a substrate stage 208 provided between the lower electrode 202 and the reaction space. Note that a substrate 250 to be treated is provided over the substrate stage 208 of the ashing apparatus 200. In this structure illustrated as an example, the upper electrode 201 is provided with an antenna coil 209.

As the first high-frequency power source 205, a high-frequency power source of 1 MHz or more and 50 MHz or less, typically 13.56 MHz, can be used. As the second high-frequency power source 206, a high-frequency power source of 100 kHz or more and 60 MHz or less, typically 3.2 MHz, can be used. As the dielectric 207, quartz, ceramic, or the like can be used.

Figure 14B:
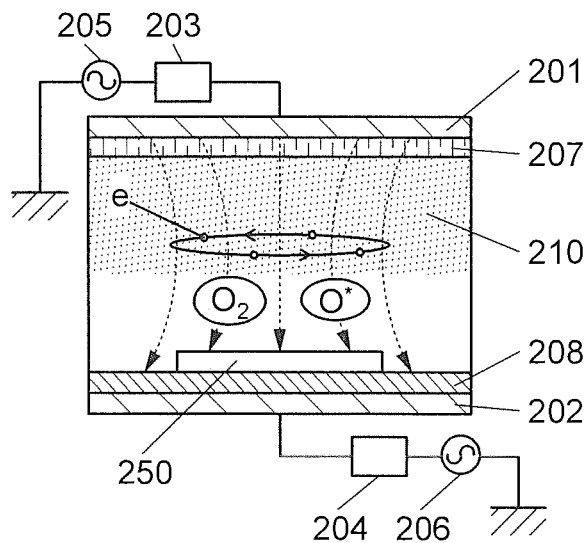

As illustrated in FIGS. 14A and 14B, when high-frequency power is applied to the upper electrode 201, a high-frequency current flows in a direction 8 of the antenna coil 209 provided over the upper electrode 201, so that a magnetic field is produced in a direction Z. Then, an induction field is produced in the direction 8 by the Faraday's law of electromagnetic induction. Electrons e in the reaction space are trapped in the induction field and accelerated in the direction 8, and collide with molecules of the gas (here, oxygen molecules), so that high-density plasma 210 is produced in the reaction space (below the dielectric 207). A region apart from the upper electrode 201 has a small influence of the magnetic field of the high-density plasma 210; therefore, the high-density plasma 210 is expanded flat near the dielectric 207 of the upper electrode 201. Here, by adjusting the high-frequency power applied to the lower electrode 202, a region where the high-density plasma 210 is produced can be closer to a region on the substrate 250 side. As illustrated in FIGS. 14A and 14B, the upper electrode 201 and the lower electrode 202 each individually have a high-frequency power source, whereby the bias voltage applied to each electrode can be controlled separately.

Furthermore, as illustrated in FIG. 14B, for example, $O_2$ molecules and/or O* radicals can be efficiently added to the substrate 250 by controlling the bias voltage applied to the substrate 250, specifically increasing high-frequency power applied to the lower electrode 202. Note that at this time, when the outermost surface of the substrate 250 has an insulating property, the oxygen cannot be added efficiently in some cases. However, in one embodiment of the present invention, the outermost surface of the substrate 250 is an oxide semiconductor film; therefore, the oxygen can be efficiently added to an insulating film positioned below the oxide semiconductor film. The temperature of the substrate 250 during oxygen addition treatment is greater than or equal to room temperature and lower than or equal to 300° C., preferably higher than or equal to 100° C. and lower than or equal to 250° C., whereby the oxygen can be added efficiently to the substrate 250. Note that a heater may be provided in the substrate stage 208 to raise the temperature of the substrate 250. As a structure of the heater, heating may be performed using a resistance heater, or heat conduction or heat radiation from a medium such as a heated gas (e.g., a He gas).

Note that although the ashing apparatus using ICP is described as an example in FIGS. 14A and 14B, a plasma etching apparatus using capacitively coupled plasma (CCP) may be used, for example. Alternatively, plasma etching apparatus using a reactive ion etching (RIE) instead of ICP may be used.

When the oxide semiconductor film 115 is provided over the insulating film 116 and then oxygen is added, the oxide semiconductor film 115 functions as a protective film for inhibiting release of oxygen from the insulating film 116. Thus, a larger amount of oxygen can be added to the insulating films 114 and 116 and the oxide semiconductor film 108. By adding the oxygen 141, oxygen vacancy of the oxide semiconductor film 115 is filled and the oxide semiconductor film 115 has higher resistance in some cases.

In the case where oxygen is introduced by plasma treatment, by making oxygen excited by a microwave to generate high density oxygen plasma, the amount of oxygen introduced into the insulating films 114 and 116 through the oxide semiconductor film 115 can be increased.

Figure 10A:
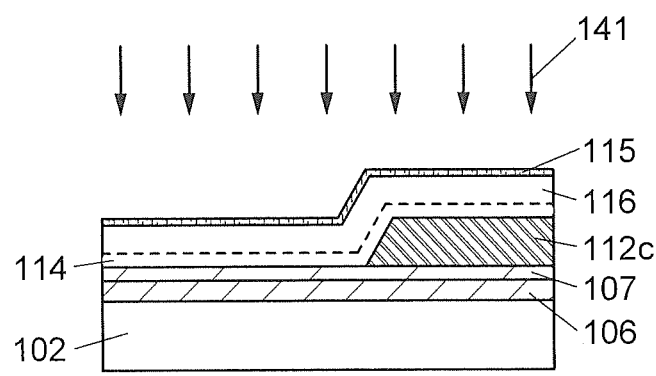
FIGS. 10A and 10B are cross-sectional views illustrating examples of a step in a manufacturing process of a semiconductor device.
Figure 10B:
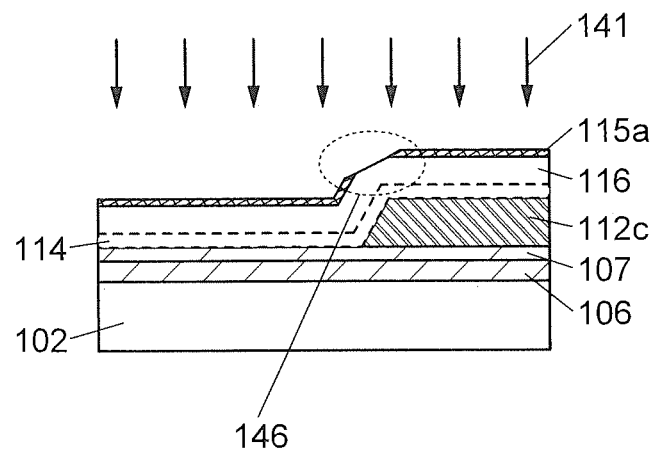

Here, FIGS. 10A and 10B are cross-sectional views illustrating addition of the oxygen 141, which are different from that in FIGS. 8E and 8F.

FIG. 10A is a cross-sectional view illustrating an example of a step in a method for manufacturing a semiconductor device manufactured through the same formation process as the transistor 100. The semiconductor device in FIG. 10A includes the insulating film 106 over the substrate 102, the insulating film 107 over the insulating film 106, a conductive film 112c over the insulating film 107, the insulating film 114 over the insulating film 107 and the conductive film 112c, the insulating film 116 over the insulating film 114, and the oxide semiconductor film 115 over the insulating film 116. Note that the conductive film 112c is formed by processing a conductive film used for forming the conductive films 112a and 112b functioning as source and drain electrodes of the transistor 100.

FIG. 10B is a cross-sectional view illustrating another example of the step in a method for manufacturing a semiconductor device for comparison. The semiconductor device in FIG. 10B includes the insulating film 106 over the substrate 102, the insulating film 107 over the insulating film 106, the conductive film 112c over the insulating film 107, the insulating film 114 over the insulating film 107 and the conductive film 112c, the insulating film 116 over the insulating film 114, and a conductive film 115a over the insulating film 116. Note that the conductive film 112c is formed by processing the conductive film used for forming the conductive films 112a and 112b. The conductive film 115a is formed using a metal film having high conductivity (e.g., a film of silver, copper, aluminum, titanium, tantalum, or molybdenum).

FIG. 10A illustrates the case where the oxide semiconductor film 115 is formed to cover an uneven surface of the insulating films 114 and 116. FIG. 10B illustrates the case where the conductive film 115a which does not cover the uneven surface of the insulating films 114 and 116.

Specifically, in FIG. 10A, the oxide semiconductor film 115 is formed along the uneven surface of the insulating films 114 and 116 covering the conductive film 112c. In other words, the surfaces of the insulating films 114 and 116 are not exposed. Therefore, when the oxygen 141 is added, the oxide semiconductor film 115 can inhibit release of oxygen from the insulating films 114 and 116. On the other hand, in FIG. 10B, the conductive film 115a is not formed along the uneven surface of the insulating films 114 and 116 covering the conductive film 112c. In other words, the conductive film 115a includes a region 146 in which the surface of the insulating film 116 is partly exposed. Therefore, when the oxygen 141 is added, oxygen is released from the region 146 in FIG. 10B.

In the structure of FIG. 10B, the region 146 may be formed in the case where coverage with the conductive film 115a is not sufficient or where the end portions of the conductive film 115a and the insulating film 116 are partly reduced when the oxygen 141 is added. Since the conductive film 115a is formed using a metal film having high conductivity, concentration of an electric field occurs at the end portion of the conductive film 115a because a bias voltage is applied to the substrate 102 side when the oxygen 141 is added, so that the insulating films 114 and 116 and the conductive film 115a might be partly removed. In contrast, in the semiconductor device of one embodiment of the present invention, the concentration of electric field can be relieved by employing a structure in which the oxide semiconductor film 115 is used instead of the conductive film 115a and the oxide semiconductor film 115 is formed using the same metal element as at least one of the metal elements of the oxide semiconductor film 108.

In this manner, as illustrated in FIG. 10A, the oxide semiconductor film 115 is preferably formed to cover the uneven surface of the insulating films 114 and 116.

Figure 8G:
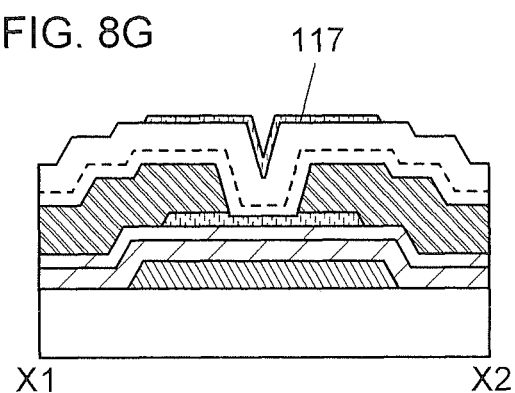
Figure 8H:
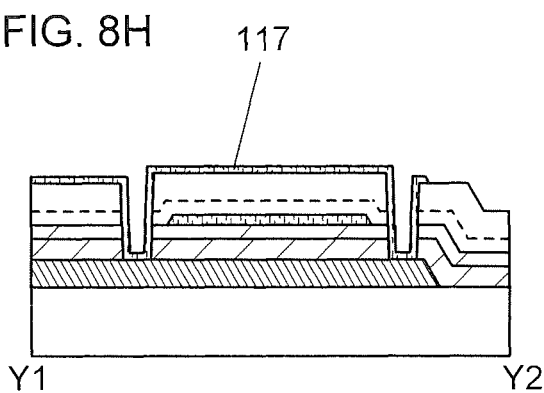

Next, a mask is formed over the oxide semiconductor film 115 through a lithography process, and the oxide semiconductor film 115 is processed into desired regions to form the oxide semiconductor film 117 functioning as a second gate electrode (see FIGS. 8G and 8H).

Figure 9A:
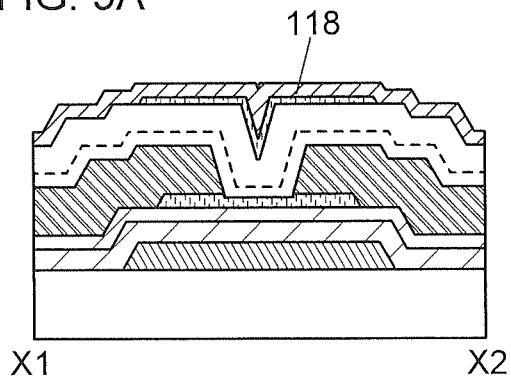
FIGS. 9A to 9H are cross-sectional views illustrating an example of a manufacturing process of a semiconductor device.
Figure 9B:
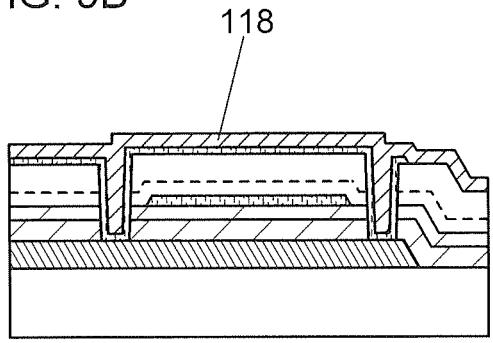

Next, the insulating film 118 is formed over the insulating film 116 and the oxide semiconductor film 117 (see FIGS. 9A and 9B).

In the case where the insulating film 118 is formed by a PECVD method, the substrate temperature is set to be higher than or equal to 300° C. and lower than or equal to 400° C., or preferably higher than or equal to 320° C. and lower than or equal to 370° C., so that a dense film can be formed.

For example, in the case where a silicon nitride film is formed by a PECVD method as the insulating film 118, a deposition gas including silicon, nitrogen, and ammonia are preferably used as a source gas. A small amount of ammonia compared with the amount of nitrogen is used, whereby ammonia is dissociated in the plasma and activated species are generated. The activated species cleave a bond between silicon and hydrogen which are included in a deposition gas including silicon and a triple bond between nitrogen molecules. As a result, a dense silicon nitride film having few defects, in which bonds between silicon and nitrogen are promoted and bonds between silicon and hydrogen is few, can be formed. On the other hand, when the amount of ammonia with respect to nitrogen is large, decomposition of a deposition gas including silicon and decomposition of nitrogen are not promoted, so that a sparse silicon nitride film in which bonds between silicon and hydrogen remain and defects are increased is formed. Therefore, in the source gas, a flow rate ratio of the nitrogen to the ammonia is set to be greater than or equal to 5 and less than or equal to 50, preferably greater than or equal to 10 and less than or equal to 50.

In this embodiment, with the use of a PECVD apparatus, a 50-nm-thick silicon nitride film is formed as the insulating film 118 using silane, nitrogen, and ammonia as a source gas. The flow rate of silane is 50 sccm, the flow rate of nitrogen is 5000 sccm, and the flow rate of ammonia is 100 sccm. The pressure in the treatment chamber is 100 Pa, the substrate temperature is 350° C., and high-frequency power of 1000 W is supplied to parallel-plate electrodes with a 27.12 MHz high-frequency power source. Note that the PECVD apparatus is a parallel-plate PECVD apparatus in which the electrode area is 6000 cm$^2$, and the power per unit area (power density) into which the supplied power is converted is $1.7 \times 10^{-1}$ W/cm$^2$.

Heat treatment may be performed after the formation of the insulating film 118. The heat treatment is performed typically at a temperature higher than or equal to 150° C. and lower than or equal to 400° C., preferably higher than or equal to 300° C. and lower than or equal to 400° C., or further preferably higher than or equal to 320° C. and lower than or equal to 370° C. By the heat treatment, excess oxygen included in the insulating films 114 and 116 can be diffused to the oxide semiconductor film 108, so that the oxygen vacancy in the oxide semiconductor film 108 can be filled. Furthermore, by the heat treatment, hydrogen included in the insulating film 118 moves to the oxide semiconductor film 117 and is bonded to oxygen vacancy in the oxide semiconductor film 117, and the resistance of the oxide semiconductor film 117 is reduced or the conductivity of the oxide semiconductor film 117 is increased; therefore, the oxide semiconductor film 117 becomes a conductor. Accordingly, the oxide semiconductor film 117 can function as a second gate electrode. In other words, the oxide semiconductor film 117 can also be referred to as an oxide conductor (OC).

Figure 9C:
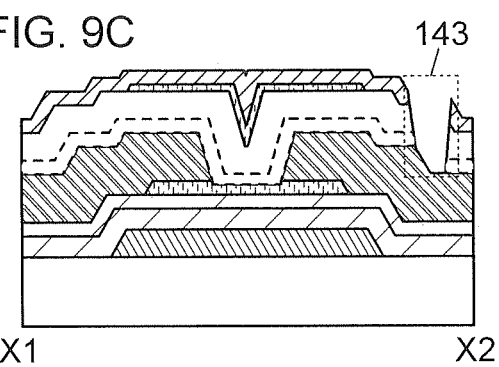
Figure 9D:
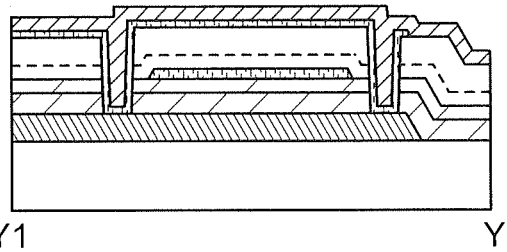

Next, a mask is formed over the insulating film 118 through a lithography process, and the opening 143 is formed in the insulating films 114, 116, and 118 (see FIGS. 9C and 9D).

Note that the opening 143 reaches the conductive film 112b. The openings 143 can be formed with a dry etching apparatus and/or a wet etching apparatus.

Figure 9E:
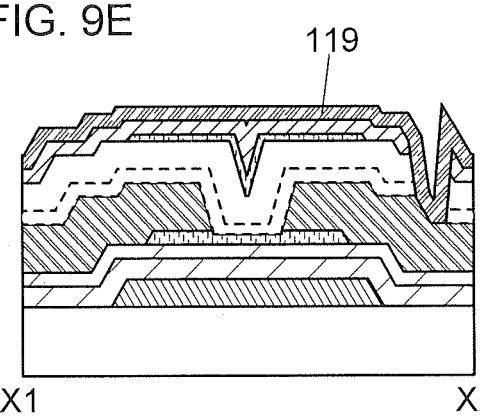
Figure 9F:
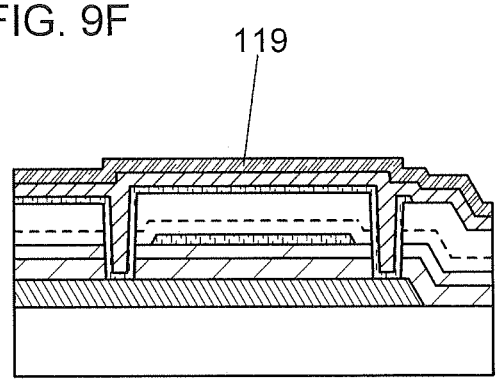

Next, a conductive film 119 is formed over the insulating film 118 to cover the opening 143 (see FIGS. 9E and 9F).

For the conductive film 119, for example, a material including one of indium (In), zinc (Zn), and tin (Sn) can be used. In particular, for the conductive film 119, a light-transmitting conductive material such as indium oxide including tungsten oxide, indium zinc oxide including tungsten oxide, indium oxide including titanium oxide, indium tin oxide including titanium oxide, indium tin oxide (ITO), indium zinc oxide, or indium tin oxide to which silicon oxide is added (indium tin SiO$_2$ doped oxide; hereinafter referred to as ITSO) can be used. The conductive film 119 can be formed by a sputtering method, for example. In this embodiment, a 110-nm-thick ITSO film is formed by a sputtering method.

Figure 9G:
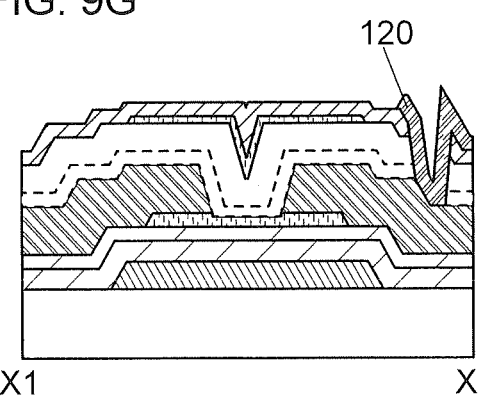
Figure 9H:
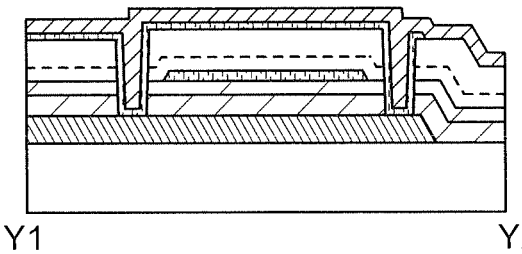

Next, a mask is formed over the conductive film 119 through a lithography process, and the conductive film 119 is processed into desired regions to form the conductive film 120 (see FIGS. 9G and 9H).

Through the above process, the transistor 100 illustrated in FIGS. 1A to 1C can be manufactured.

Figure 2B:
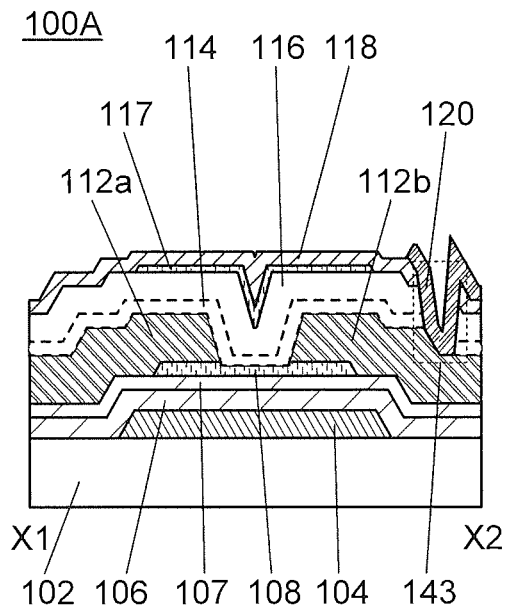
Figure 2C:
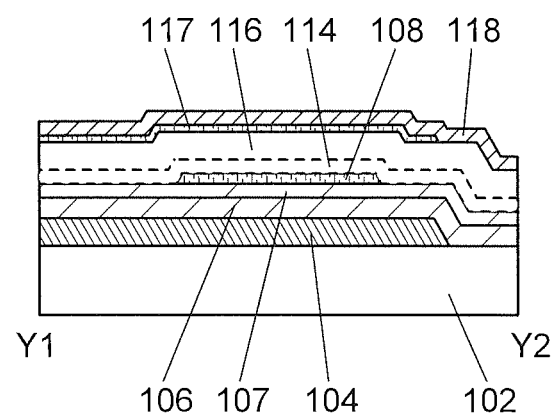

Note that the transistor 100A in FIGS. 2A to 2C can be manufactured without performing the step of forming the openings 142a and 142b.

<Method 2 for Manufacturing Semiconductor Device>

Next, a method for manufacturing the transistor 100B that is a semiconductor device of one embodiment of the present invention, which is illustrated in FIGS. 3A to 3C, is described in detail below with reference to FIGS. 11A to 11H, FIGS. 12A to 12H, and FIGS. 13A to 13H. FIGS. 11A to 11H, FIGS. 12A to 12H, and FIGS. 13A to 13H are cross-sectional views illustrating a method for manufacturing a semiconductor device.

FIGS. 11A, 11C, 11E, and 11G, FIGS. 12A, 12C, 12E, and 12G, and FIGS. 13A, 13C, 13E, and 13G are each a cross-sectional view in the channel length direction of the transistor 100B, and FIGS. 11B, 11D, 11F, and 11H, FIGS. 12B, 12D, 12F, and 12H, and FIGS. 13B, 13D, 13F, and 13H are each a cross-sectional view in the channel width direction of the transistor 100B.

Figure 11A:
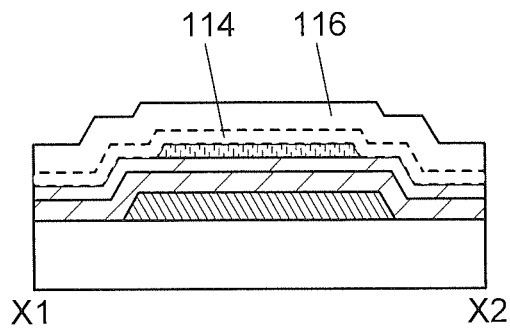
FIGS. 11A to 11H are cross-sectional views illustrating an example of a manufacturing process of a semiconductor device.
Figure 11B:
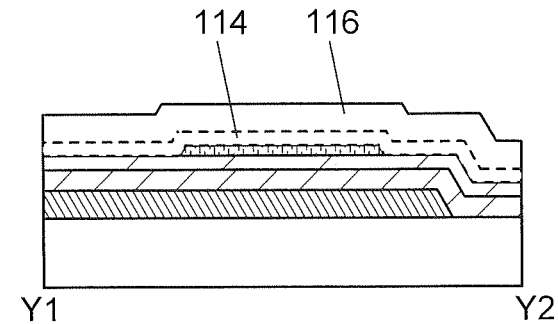

First, the steps up to the step in FIGS. 7C and 7D are performed, and then the insulating films 114 and 116 functioning as second gate insulating films are formed over the insulating film 107 and the oxide semiconductor film 108 (see FIGS. 11A and 11B).

Figure 11C:
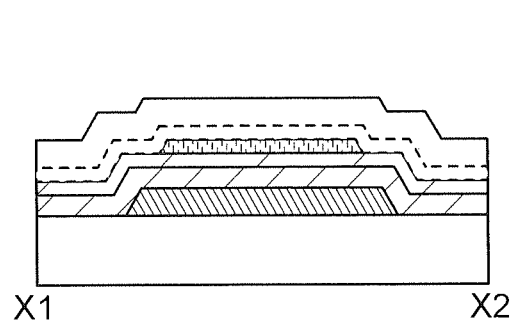
Figure 11D:
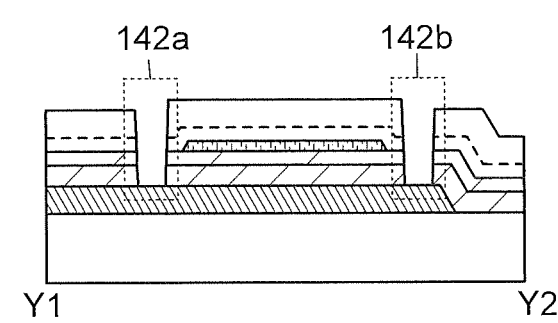

Next, a mask is formed over the insulating film 116 through a lithography process, and the openings 142a and 142b are formed in the insulating films 106, 107, 114, and 116 (see FIGS. 11C and 11D).

Note that the openings 142a and 142b reach the conductive film 104 functioning as a first gate electrode. The openings 142a and 142b can be formed with a dry etching apparatus and/or a wet etching apparatus.

Figure 11E:
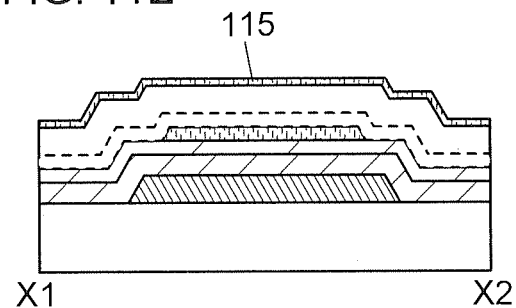
Figure 11F:
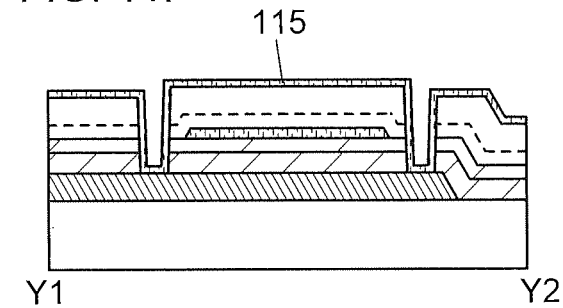

Next, the oxide semiconductor film 115 is formed over the insulating film 116 to cover the opening 142a and 142b (see FIGS. 11E and 11F).

Figure 11G:
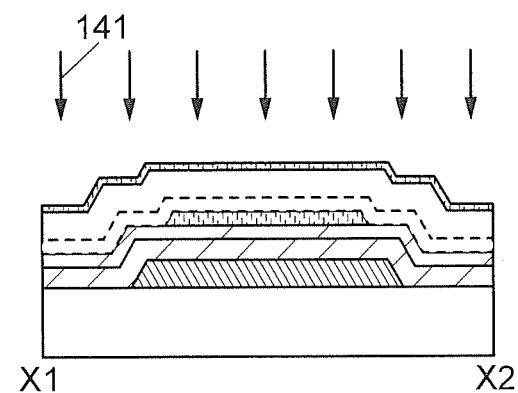
Figure 11H:
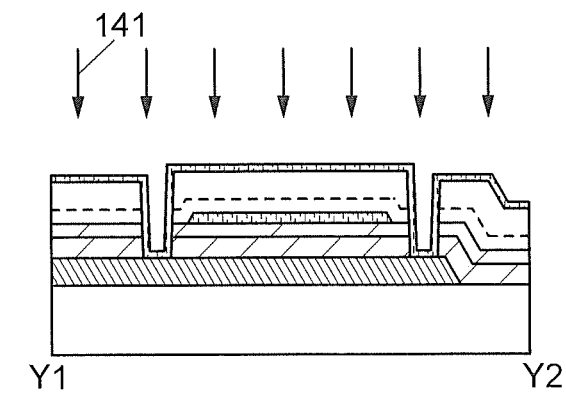

Next, the oxygen 141 is added to the insulating films 114 and 116 and the oxide semiconductor film 108 through the oxide semiconductor film 115 (see FIGS. 11G and 11H).

Figure 12A:
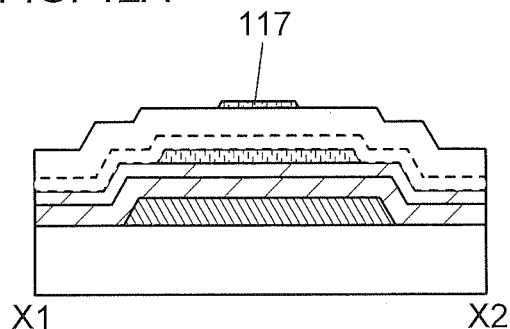
FIGS. 12A to 12H are cross-sectional views illustrating an example of a manufacturing process of a semiconductor device.
Figure 12B:
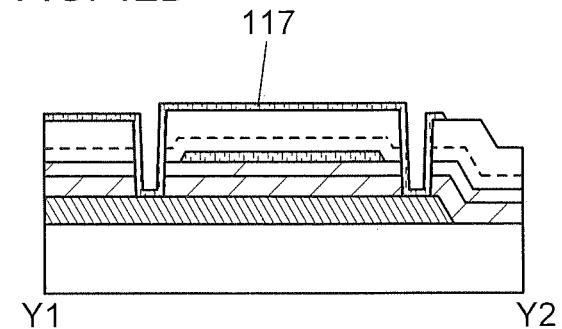

Next, a mask is formed over the oxide semiconductor film 115 through a lithography process, and the oxide semiconductor film 115 is processed into desired regions to form the oxide semiconductor film 117 functioning as a second gate electrode (see FIGS. 12A and 12B).

Figure 12C:
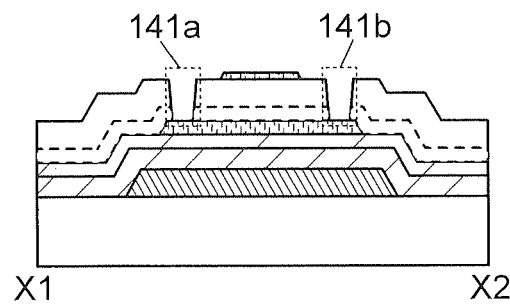
Figure 12D:
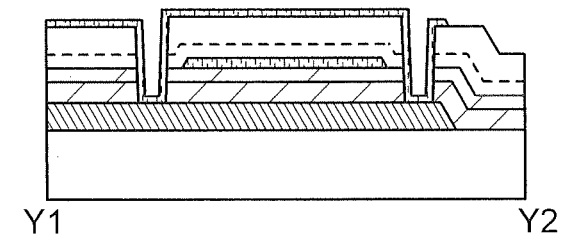

Next, a mask is formed over the insulating film 116 and the oxide semiconductor film 117 through a lithography process, and the openings 141a and 141b are formed in the insulating films 114 and 116 (see FIGS. 12C and 12D).

Note that the openings 141a and 141b reach the oxide semiconductor film 108. The openings 141a and 141b can be formed with a dry etching apparatus and/or a wet etching apparatus.

Figure 12E:
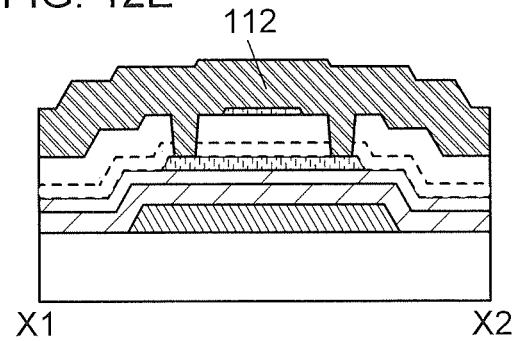
Figure 12F:
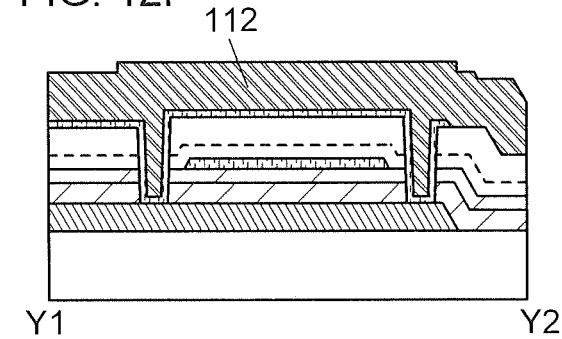

Next, a conductive film 112 is formed over the insulating film 116 and the oxide semiconductor film 117 to cover the opening 141a and 141b (see FIGS. 12E and 12F).

The conductive film 112 is formed in such a manner that a stack of a 50-nm-thick tungsten film and a 400-nm-thick aluminum film is formed by a sputtering method.

Figure 12G:
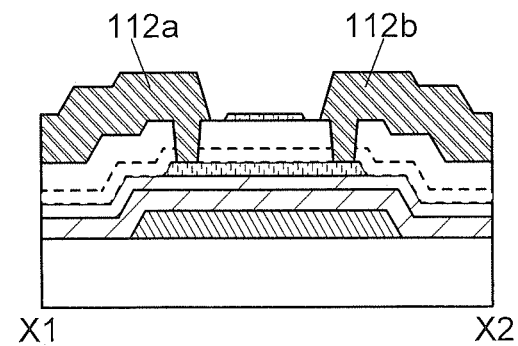
Figure 12H:
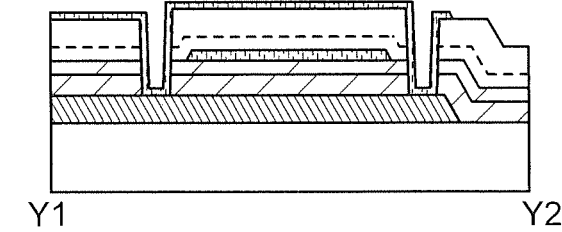

Next, a mask is formed over the conductive film 112 through a lithography process, and the conductive film 112 is processed into desired regions, whereby the conductive films 112a and 112b functioning as source and drain electrodes are formed (see FIGS. 12G and 12H).

Figure 13A:
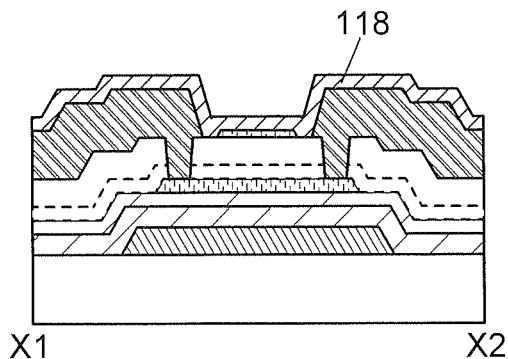
FIGS. 13A to 13H are cross-sectional views illustrating an example of a manufacturing process of a semiconductor device.
Figure 13B:
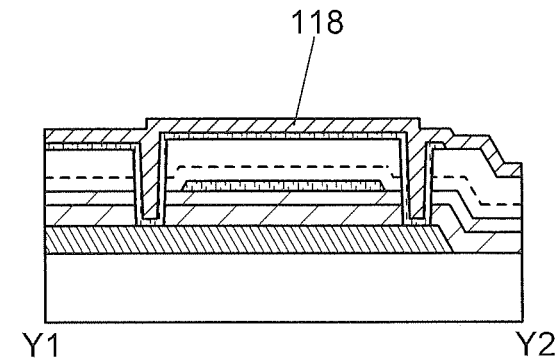

Next, the insulating film 118 is formed over the insulating film 116, the oxide semiconductor film 117, and the conductive films 112a and 112b (see FIGS. 13A and 13B).

Figure 13C:
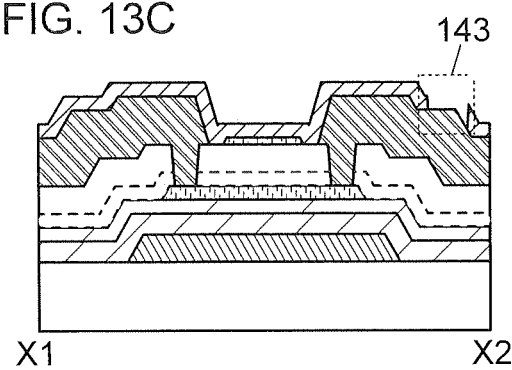
Figure 13D:
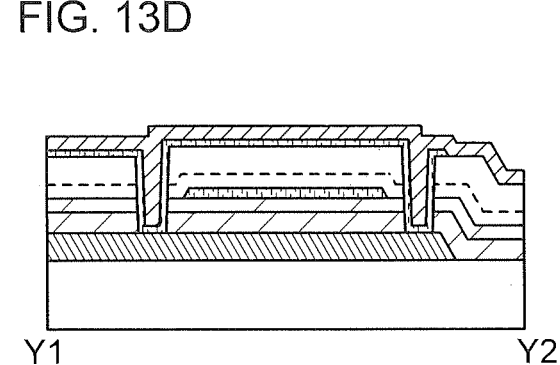

Next, a mask is formed over the insulating film 118 through a lithography process, and the opening 143 is formed in the insulating film 118 (see FIGS. 13C and 13D).

Note that the opening 143 reaches the conductive film 112b. The openings 143 can be formed with a dry etching apparatus and/or a wet etching apparatus.

Figure 13E:
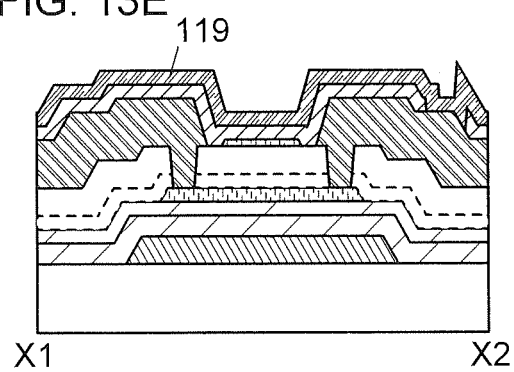
Figure 13F:
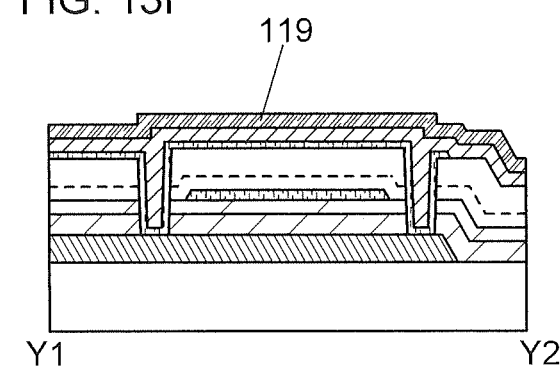

Next, the conductive film 119 is formed over the insulating film 118 to cover the opening 143 (see FIGS. 13E and 13F).

Figure 13G:
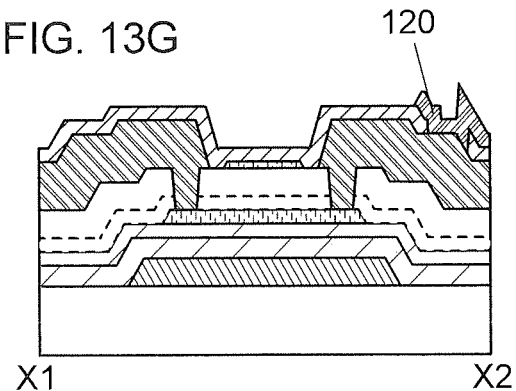
Figure 13H:
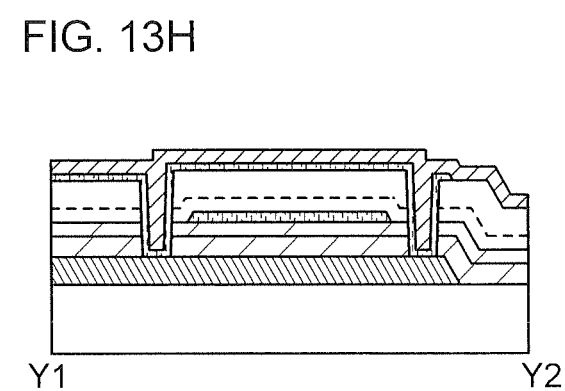

Next, a mask is formed over the conductive film 119 through a lithography process, and the conductive film 119 is processed into desired regions to form the conductive film 120 (see FIGS. 13G and 13H).

Through the above process, the transistor 100B illustrated in FIGS. 3A to 3C can be manufactured.

Figure 4B:
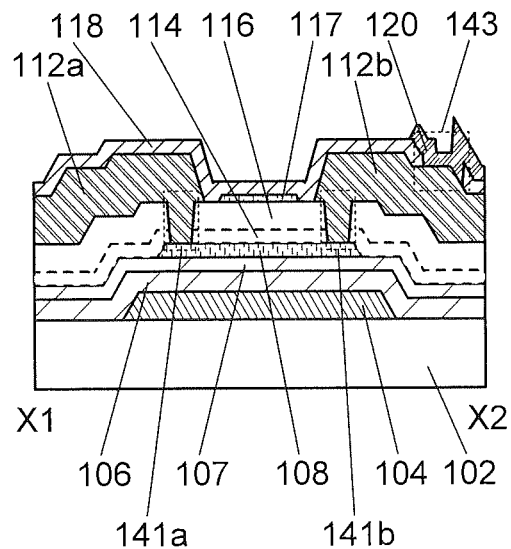
Figure 4C:
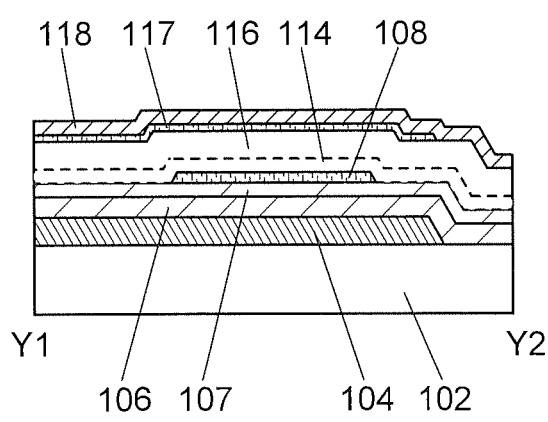

Note that the transistor 100C in FIGS. 4A to 4C can be manufactured without performing the step of forming the openings 142a and 142b.

In this embodiment, one embodiment of the present invention has been described. Other embodiments of the present invention are described in Embodiments 2 to 5. Note that one embodiment of the present invention is not limited to the embodiments. Although an example in which the transistor 100 and the like include the oxide semiconductor film is shown as one embodiment of the present invention, one embodiment of the present invention is not limited thereto. Depending on circumstances or conditions, the transistor 100 and the like do not necessarily include an oxide semiconductor film in one embodiment of the present invention. For example, according to one embodiment of the present invention, a channel, the vicinity of the channel, a source region, a drain region, or the like of the transistor 100 and the like may be formed using a material including silicon (Si), germanium (Ge), silicon germanium (SiGe), gallium arsenide (GaAs), or the like.

The structure and method described in this embodiment can be implemented in appropriate combination with any of the structures and methods described in the other embodiments.

Embodiment 2

In this embodiment, the structure of an oxide semiconductor included in a semiconductor device of one embodiment of the present invention will be described in detail.
<Oxide Semiconductor Structure>

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. In addition, examples of a crystalline oxide semiconductor include a single crystal oxide semiconductor, a CAAC-OS, a polycrystalline oxide semiconductor, and an nc-OS.

It is known that an amorphous structure is generally defined as being metastable and unfixed, and being isotropic and having no non-uniform structure. In other words, an amorphous structure has a flexible bond angle and a short-range order but does not have a long-range order.

This means that an inherently stable oxide semiconductor cannot be regarded as a completely amorphous oxide semiconductor. Moreover, an oxide semiconductor that is not isotropic (e.g., an oxide semiconductor film that has a periodic structure in a microscopic region) cannot be regarded as a completely amorphous oxide semiconductor. Note that an a-like OS has a periodic structure in a microscopic region, but at the same time has a void and has an unstable structure. For this reason, an a-like OS has physical properties similar to those of an amorphous oxide semiconductor.
<CAAC-OS>

First, a CAAC-OS is described.

A CAAC-OS is one of oxide semiconductors having a plurality of c-axis aligned crystal parts (also referred to as pellets).

In a combined analysis image (also referred to as a high-resolution transmission electron microscope (TEM) image) of a bright-field image and a diffraction pattern of a CAAC-OS, which is obtained using a TEM, a plurality of pellets can be observed. However, in the high-resolution TEM image, a boundary between pellets, that is, a grain boundary is not clearly observed. Thus, in the CAAC-OS, a reduction in electron mobility due to the grain boundary is less likely to occur.

Figure 15A:
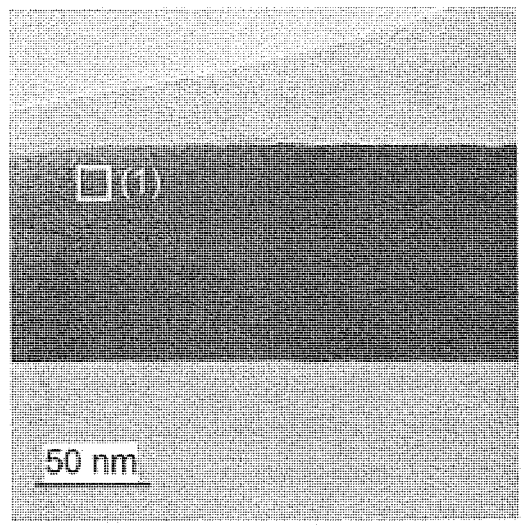
FIGS. 15A to 15D are Cs-corrected high-resolution TEM images of a cross section of a CAAC-OS and a cross-sectional schematic view of a CAAC-OS.

The CAAC-OS observed with a TEM is described below. FIG. 15A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be obtained with, for example, an atomic resolution analytical electron microscope JEM-ARM200F manufactured by JEOL Ltd.

Figure 15B:
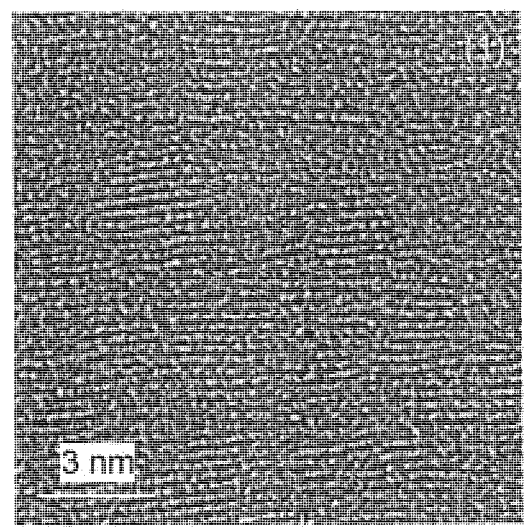

FIG. 15B is an enlarged Cs-corrected high-resolution TEM image of a region (1) in FIG. 15A. FIG. 15B shows that metal atoms are arranged in a layered manner in a pellet. Each metal atom layer has a configuration reflecting unevenness of a surface over which a CAAC-OS film is formed (hereinafter, the surface is referred to as a formation surface) or a top surface of the CAAC-OS, and is arranged parallel to the formation surface or the top surface of the CAAC-OS.

Figure 15C:
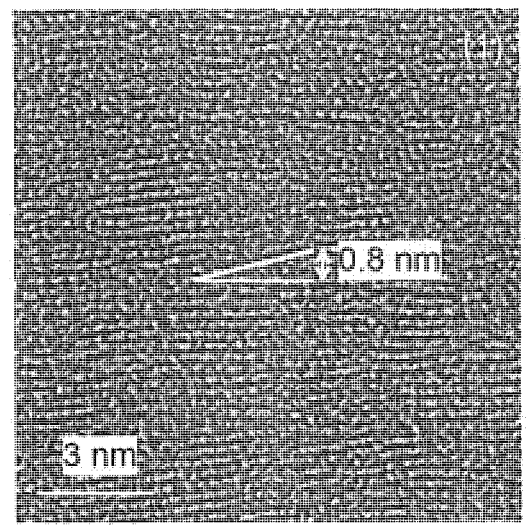

As shown in FIG. 15B, the CAAC-OS has a characteristic atomic arrangement. The characteristic atomic arrangement is denoted by an auxiliary line in FIG. 15C. FIGS. 15B and 15C prove that the size of a pellet is greater than or equal to 1 nm or greater than or equal to 3 nm, and the size of a space caused by tilt of the pellets is approximately 0.8 nm.

Therefore, the pellet can also be referred to as a nanocrystal (nc). Furthermore, a CAAC-OS can be referred to as an oxide semiconductor including c-axis aligned nanocrystals (CANC).

Figure 15D:
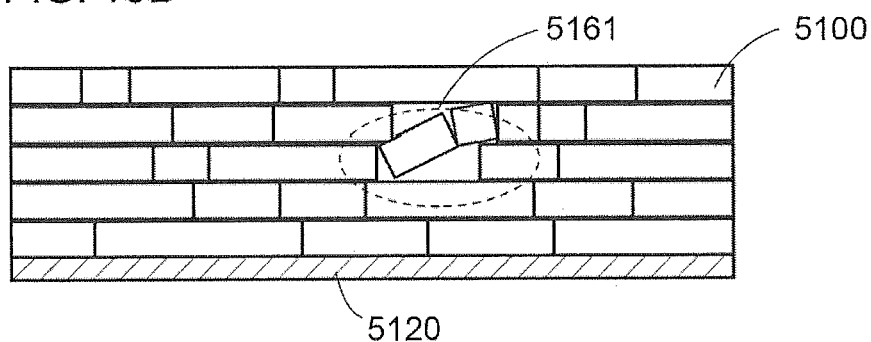

Here, according to the Cs-corrected high-resolution TEM images, the schematic arrangement of pellets 5100 of a CAAC-OS over a substrate 5120 is illustrated by such a structure in which bricks or blocks are stacked (see FIG. 15D). The part in which the pellets are tilted as observed in FIG. 15C corresponds to a region 5161 illustrated in FIG. 15D.

FIG. 16A shows a Cs-corrected high-resolution TEM image of a plane of the CAAC-OS observed from a direction substantially perpendicular to the sample surface. FIGS. 16B, 16C, and 16D are enlarged Cs-corrected high-resolution TEM images of regions (1), (2), and (3) in FIG. 16A, respectively. FIGS. 16B, 16C, and 16D indicate that metal atoms are arranged in a triangular, quadrangular, or hexagonal configuration in a pellet. However, there is no regularity of arrangement of metal atoms between different pellets.

Figure 17A:
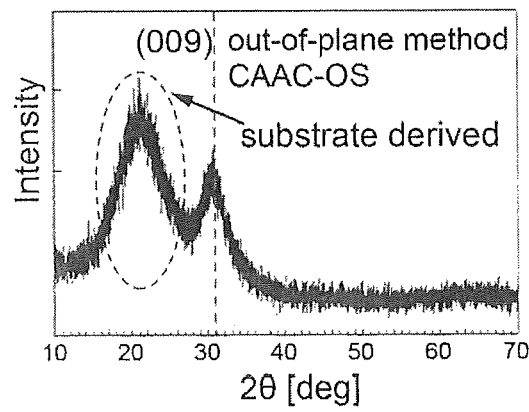
FIGS. 17A to 17C show structural analysis of a CAAC-OS and a single crystal oxide semiconductor by XRD.

Next, a CAAC-OS analyzed by X-ray diffraction (XRD) is described. For example, when the structure of a CAAC-OS including an $InGaZnO_4$ crystal is analyzed by an out-of-plane method, a peak appears at a diffraction angle (2θ) of around 31° as shown in FIG. 17A. This peak is derived from the (009) plane of the $InGaZnO_4$ crystal, which indicates that crystals in the CAAC-OS have c-axis alignment, and that the c-axes are aligned in a direction substantially perpendicular to the formation surface or the top surface of the CAAC-OS.

Note that in structural analysis of the CAAC-OS by an out-of-plane method, another peak may appear when 2θ is around 36°, in addition to the peak at 2θ of around 31°. The peak of 2θ at around 36° indicates that a crystal having no c-axis alignment is included in part of the CAAC-OS. It is preferable that in the CAAC-OS analyzed by an out-of-plane method, a peak appear when 2θ is around 31° and that a peak not appear when 2θ is around 36°.

Figure 17B:
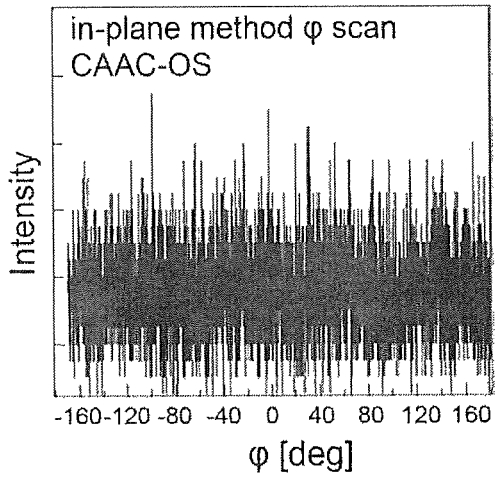
Figure 17C:
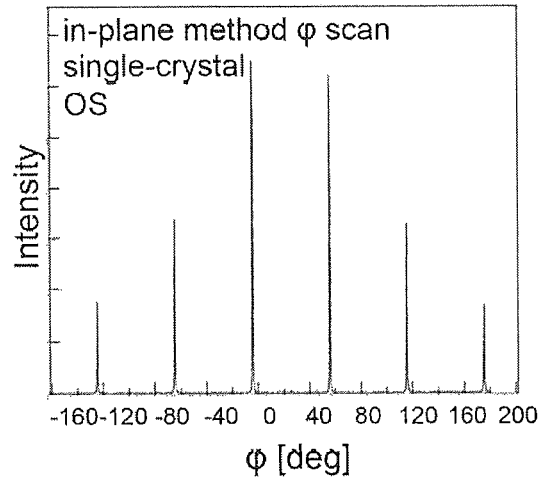

On the other hand, in structural analysis of the CAAC-OS by an in-plane method in which an X-ray is incident on a sample in a direction substantially perpendicular to the c-axis, a peak appears when 2θ is around 56°. This peak is derived from the (110) plane of the $InGaZnO_4$ crystal. In the case of the CAAC-OS, when analysis (ϕ scan) is performed with 2θ fixed at around 56° and with the sample rotated using a normal vector of the sample surface as an axis (ϕ axis), as shown in FIG. 17B, a peak is not clearly observed. In contrast, in the case of a single crystal oxide semiconductor of $InGaZnO_4$, when ϕ scan is performed with 2θ fixed at around 56°, as shown in FIG. 17C, six peaks which are derived from crystal planes equivalent to the (110) plane are observed. Accordingly, the structural analysis using XRD shows that the directions of a-axes and b-axes are irregularly oriented in the CAAC-OS.

Figure 18A:
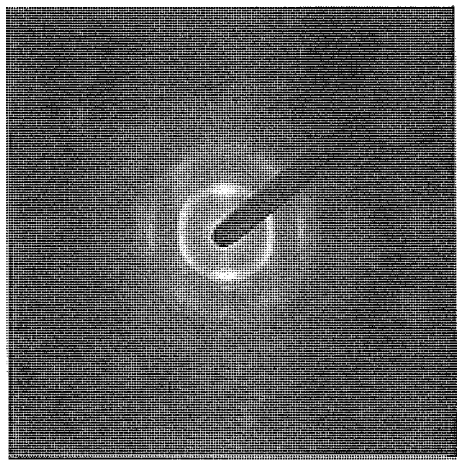
FIGS. 18A and 18B show electron diffraction patterns of a CAAC-OS.
Figure 18B:
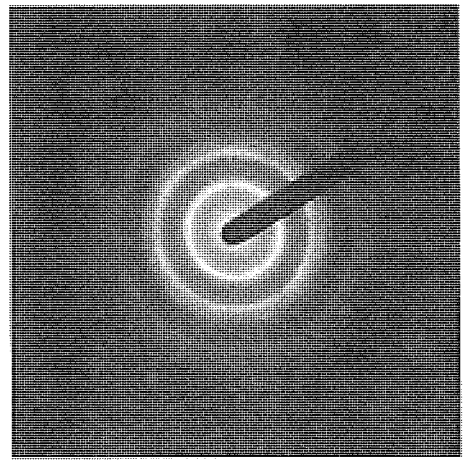

Next, a CAAC-OS analyzed by electron diffraction is described. For example, when an electron beam with a probe diameter of 300 nm is incident on a CAAC-OS including an $InGaZnO_4$ crystal in a direction parallel to the sample surface, a diffraction pattern (also referred to as a selected-area transmission electron diffraction pattern) shown in FIG. 18A can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 18B shows a diffraction pattern obtained in such a manner that an electron beam with a probe diameter of 300 nm is incident on the same sample in a direction perpendicular to the sample surface. As shown in FIG. 18B, a ring-like diffraction pattern is observed. Thus, the electron diffraction also indicates that the a-axes and b-axes of the pellets included in the CAAC-OS do not have regular alignment. The first ring in FIG. 18B is considered to be derived from the (010) plane, the (100) plane, and the like of the $InGaZnO_4$ crystal. Furthermore, it is supposed that the second ring in FIG. 18B is derived from the (110) plane and the like.

As described above, the CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancy).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities included in the oxide semiconductor might serve as carrier traps or carrier generation sources, for example. Furthermore, oxygen vacancy in the oxide semiconductor might serve as a carrier trap or serve as a carrier generation source when hydrogen is captured therein.

The CAAC-OS having small amounts of impurities and oxygen vacancy is an oxide semiconductor film with low carrier density (specifically, lower than $8 \times 10^{11}/cm^3$, preferably lower than $1 \times 10^{11}/cm^3$, or further preferably lower than $1 \times 10^{10}/cm^3$, and higher than or equal to $1 \times 10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

An nc-OS has a region in which a crystal part is observed and a region in which a crystal part is not clearly observed in a high-resolution TEM image. In most cases, the size of a crystal part included in the nc-OS is greater than or equal to 1 nm and less than or equal to 10 nm, or greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, the nc-OS cannot be distinguished from an a-like OS and an amorphous oxide semiconductor, depending on an analysis method. For example, when the nc-OS is analyzed by an out-of-plane method using an X-ray beam having a diameter larger than the size of a pellet, a peak which shows a crystal plane does not appear. Furthermore, a diffraction pattern like a halo pattern is observed when the nc-OS is subjected to electron diffraction using an electron beam with a probe diameter (e.g., 50 nm or larger) that is larger than the size of a pellet. Meanwhile, spots appear in a nanobeam electron diffraction pattern of the nc-OS when an electron beam having a probe diameter close to or smaller than the size of a pellet is used. Moreover, in a nanobeam electron diffraction pattern of the nc-OS, regions with high luminance in a circular (ring) pattern are shown in some cases. Also in a nanobeam electron diffraction pattern of the nc-OS layer, a plurality of spots is shown in a ring-like region in some cases.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared with an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-like OS>

An a-like OS has a structure intermediate between those of the nc-OS and the amorphous oxide semiconductor.

In a high-resolution TEM image of the a-like OS, a void may be observed. Furthermore, in the high-resolution TEM image, there are a region where a crystal part is clearly observed and a region where a crystal part is not observed.

The a-like OS has an unstable structure because it contains a void. To verify that an a-like OS has an unstable structure as compared with a CAAC-OS and an nc-OS, a change in structure caused by electron irradiation is described below.

An a-like OS (sample A), an nc-OS (sample B), and a CAAC-OS (sample C) are prepared as samples subjected to electron irradiation. Each of the samples is an In—Ga—Zn oxide.

First, a high-resolution cross-sectional TEM image of each sample is obtained. The high-resolution cross-sectional TEM images show that all the samples have crystal parts.

Note that which part is regarded as a crystal part is determined as follows. It is known that a unit cell of the $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the lattice spacing between lattice fringes is greater than or equal to 0.28 nm and less than or equal to 0.30 nm is regarded as a crystal part of $InGaZnO_4$. Each of lattice fringes corresponds to the a-b plane of the $InGaZnO_4$ crystal.

Figure 19:
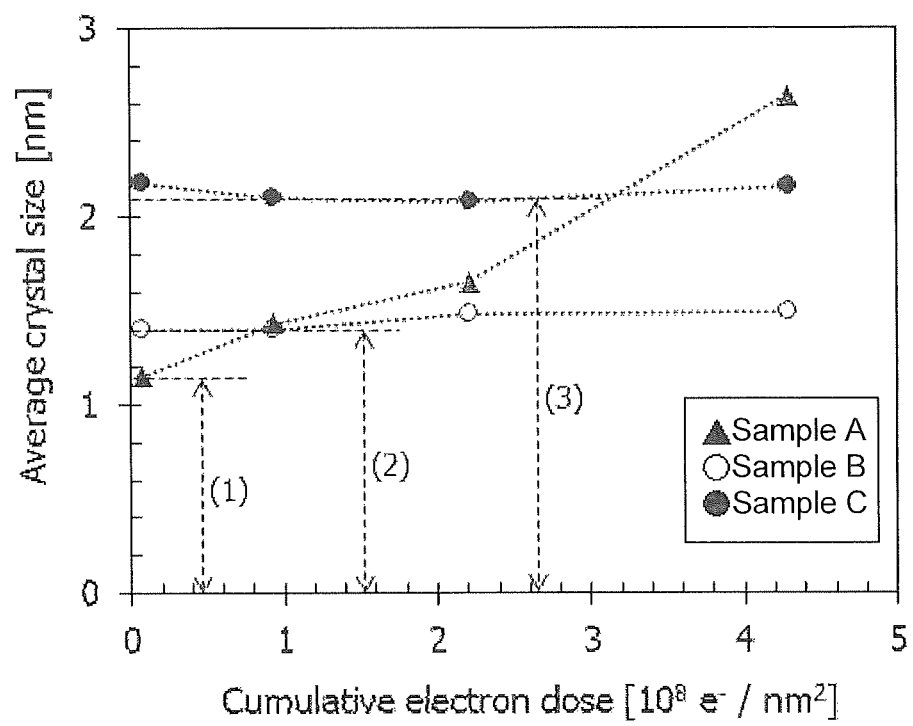
FIG. 19 shows a change in crystal part of an In—Ga—Zn oxide induced by electron irradiation.

FIG. 19 shows change in the average size of crystal parts (at 22 points to 45 points) in each sample. Note that the crystal part size corresponds to the length of a lattice fringe. FIG. 19 indicates that the crystal part size in the a-like OS increases with an increase in the cumulative electron dose. Specifically, as shown by (1) in FIG. 19, a crystal part of approximately 1.2 nm at the start of TEM observation (the crystal part is also referred to as an initial nucleus) grows to a size of approximately 2.6 nm at a cumulative electron dose of $4.2 \times 10^8$ $e^-/nm^2$. In contrast, the crystal part size in the nc-OS and the CAAC-OS shows little change from the start of electron irradiation to a cumulative electron dose of $4.2 \times 10^8$ $e^-/nm^2$. Specifically, as shown by (2) and (3) in FIG. 19, the average crystal sizes in an nc-OS and a CAAC-OS are approximately 1.4 nm and approximately 2.1 nm, respectively, regardless of the cumulative electron dose.

In this manner, growth of the crystal part in the a-like OS is induced by electron irradiation. In contrast, in the nc-OS and the CAAC-OS, growth of the crystal part is hardly induced by electron irradiation. Therefore, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the oxide semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that there is a possibility that an oxide semiconductor having a certain composition cannot exist in a single crystal structure. In that case, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer including two or more of an amorphous oxide semiconductor, an a-like OS, an nc-OS, and a CAAC-OS, for example.

The structure described in this embodiment can be implemented in appropriate combination with any of the structures described in the other embodiments.

Embodiment 3

In this embodiment, an example of a display device that includes any of the transistors described in the embodiment above is described below with reference to FIG. 20, FIG. 21, and FIG. 22.

Figure 20:
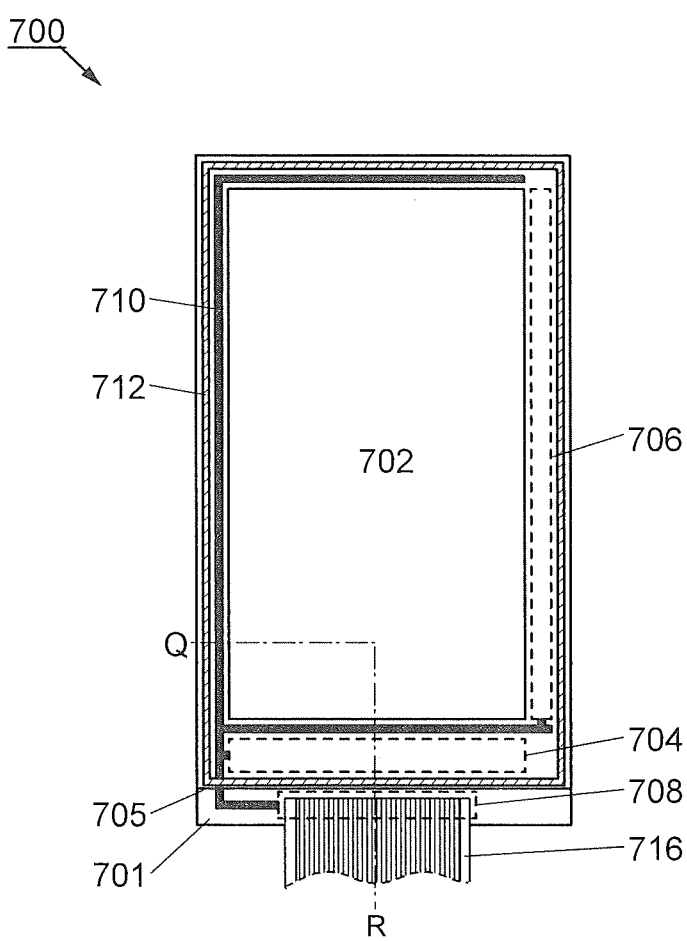
FIG. 20 is a top view illustrating one embodiment of a display device.

FIG. 20 is a top view of an example of a display device. A display device 700 illustrated in FIG. 20 includes a pixel portion 702 provided over a first substrate 701; a source driver circuit portion 704 and a gate driver circuit portion 706 provided over the first substrate 701; a sealant 712 provided to surround the pixel portion 702, the source driver circuit portion 704, and the gate driver circuit portion 706; and a second substrate 705 provided to face the first substrate 701. The first substrate 701 and the second substrate 705 are sealed with the sealant 712. That is, the pixel portion 702, the source driver circuit portion 704, and the gate driver circuit portion 706 are sealed with the first substrate 701, the sealant 712, and the second substrate 705. Although not illustrated in FIG. 20, a display element is provided between the first substrate 701 and the second substrate 705.

In the display device 700, a flexible printed circuit (FPC) terminal portion 708 electrically connected each other to the pixel portion 702, the source driver circuit portion 704, and the gate driver circuit portion 706 is provided in a region different from the region which is surrounded by the sealant 712 and positioned over the first substrate 701. Furthermore, an FPC 716 is connected to the FPC terminal portion 708, and a variety of signals and the like are supplied to the pixel portion 702, the source driver circuit portion 704, and the gate driver circuit portion 706 through the FPC 716. Furthermore, a signal line 710 is connected to the pixel portion 702, the source driver circuit portion 704, the gate driver circuit portion 706, and the FPC terminal portion 708. Various signals and the like are applied to the pixel portion 702, the source driver circuit portion 704, the gate driver circuit portion 706, and the FPC terminal portion 708 via the signal line 710 from the FPC 716.

A plurality of gate driver circuit portions 706 may be provided in the display device 700. An example of the display device 700 in which the source driver circuit portion 704 and the gate driver circuit portion 706 are formed over the first substrate 701 where the pixel portion 702 is also formed is described; however, the structure is not limited thereto. For example, only the gate driver circuit portion 706 may be formed over the first substrate 701 or only the source driver circuit portion 704 may be formed over the first substrate 701. In this case, a substrate where a source driver circuit, a gate driver circuit, or the like is formed (e.g., a driver-circuit substrate formed using a single-crystal semiconductor film or a polycrystalline semiconductor film) may be mounted on the first substrate 701. Note that there is no particular limitation on the method of connecting a separately prepared driver circuit substrate, and a chip on glass (COG) method, a wire bonding method, or the like can be used.

The pixel portion 702, the source driver circuit portion 704, and the gate driver circuit portion 706 included in the display device 700 include a plurality of transistors. As the plurality of transistors, any of the transistors that are the semiconductor devices of embodiments of the present invention can be used.

The display device 700 can include any of a variety of elements. The element includes, for example, at least one of a liquid crystal element, an electroluminescence (EL) element (e.g., an EL element including organic and inorganic materials, an organic EL element, or an inorganic EL element), an LED (e.g., a white LED, a red LED, a green LED, or a blue LED), a transistor (a transistor that emits light depending on current), an electron emitter, electronic ink, an electrophoretic element, a grating light valve (GLV), a plasma display panel (PDP), a display element using micro electro mechanical system (MEMS), a digital micromirror device (DMD), a digital micro shutter (DMS), MIRASOL (registered trademark), an interferometric modulator display (IMOD) element, a MEMS shutter display element, an optical-interference-type MEMS display element, an electrowetting element, a piezoelectric ceramic display, and a display element including a carbon nanotube. Other than the above elements, display media whose contrast, luminance, reflectivity, transmittance, or the like is changed by an electrical or magnetic effect may be included. Examples of display devices having EL elements include an EL display. Examples of display devices including electron emitters include a field emission display (FED) and an SED-type flat panel display (SED: surface-conduction electron-emitter display). Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). An example of a display device including electronic ink or electrophoretic elements is electronic paper. In the case of a transflective liquid crystal display or a reflective liquid crystal display, some of or all of pixel electrodes function as reflective electrodes. For example, some or all of pixel electrodes are formed to include aluminum, silver, or the like. In such a case, a memory circuit such as an SRAM can be provided under the reflective electrodes, leading to lower power consumption.

As a display method in the display device 700, a progressive method, an interlace method, or the like can be employed. Furthermore, color elements controlled in a pixel at the time of color display are not limited to three colors: R, G, and B (R, G, and B correspond to red, green, and blue, respectively). For example, four pixels of the R pixel, the G pixel, the B pixel, and a W (white) pixel may be included. Alternatively, a color element may be composed of two colors among R, G, and B as in PenTile layout. The two colors may differ among color elements. Alternatively, one or more colors of yellow, cyan, magenta, and the like may be added to RGB. Furthermore, the size of a display region may be different depending on respective dots of the color components. Embodiments of the disclosed invention are not limited to a display device for color display; the disclosed invention can also be applied to a display device for monochrome display.

A coloring layer (also referred to as a color filter) may be used in order to obtain a full-color display device in which white light (W) for a backlight (e.g., an organic EL element, an inorganic EL element, an LED, or a fluorescent lamp) is used. As the coloring layer, red (R), green (G), blue (B), yellow (Y), or the like may be combined as appropriate, for example. With the use of the coloring layer, higher color reproducibility can be obtained than in the case without the coloring layer. In this case, by providing a region with the coloring layer and a region without the coloring layer, white light in the region without the coloring layer may be directly utilized for display. By partly providing the region without the coloring layer, a decrease in luminance due to the coloring layer can be suppressed, and 20% to 30% of power consumption can be reduced in some cases when an image is displayed brightly. Note that in the case where full-color display is performed using a self-luminous element such as an organic EL element or an inorganic EL element, elements may emit light of their respective colors R, G, B, Y, and W. By using a self-luminous element, power consumption can be further reduced as compared with the case of using the coloring layer in some cases.

In this embodiment, a structure including a liquid crystal element and an EL element as display elements is described with reference to FIG. 21 and FIG. 22. Note that FIG. 21 is a cross-sectional view along the dashed-dotted line Q-R shown in FIG. 20 and shows a structure including a liquid crystal element as a display element, whereas FIG. 22 is a cross-sectional view along the dashed-dotted line Q-R shown in FIG. 20 and shows a structure including an EL element as a display element.

Figure 21:
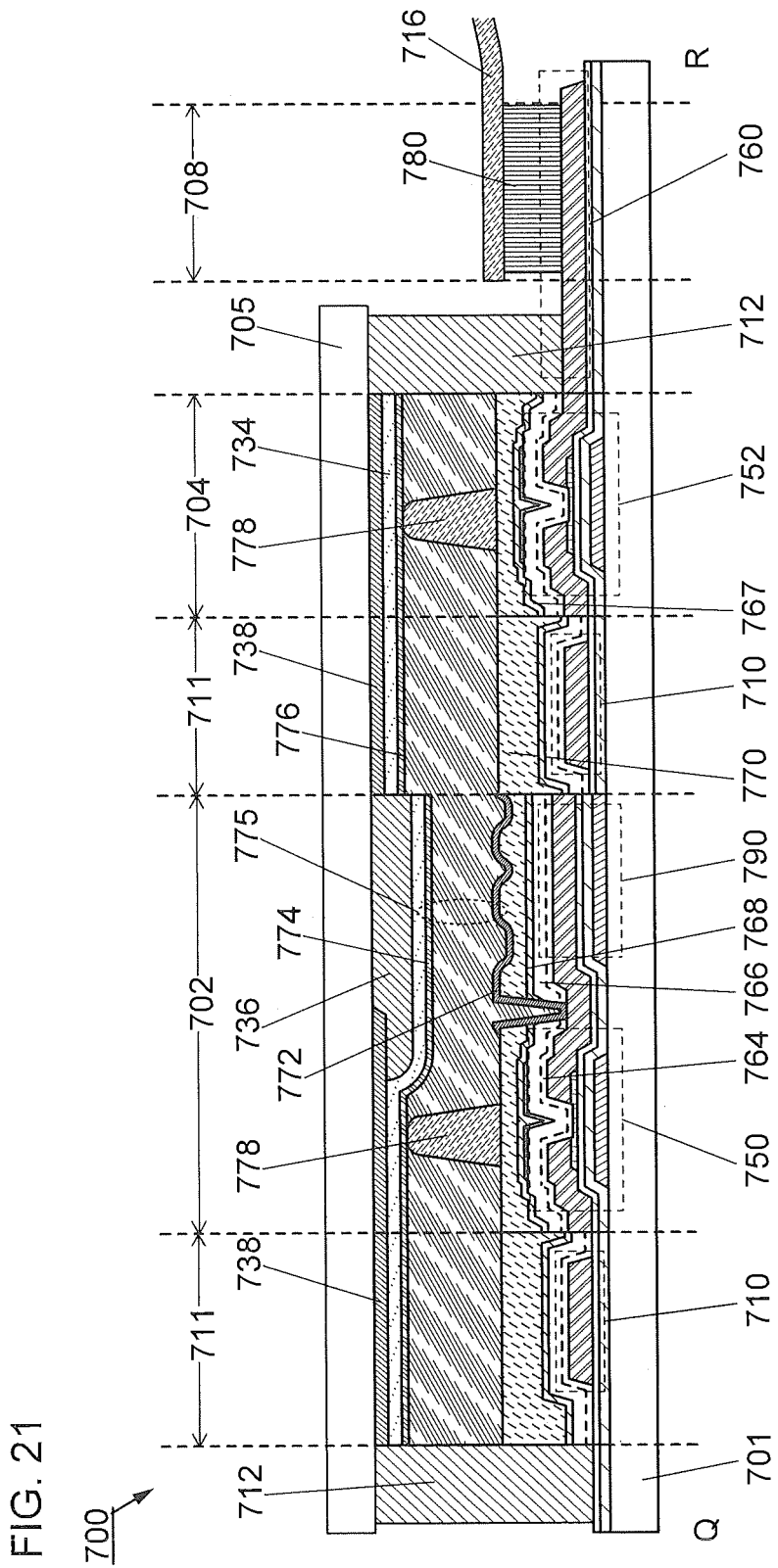
FIG. 21 is a cross-sectional view illustrating one embodiment of a display device.
Figure 22:
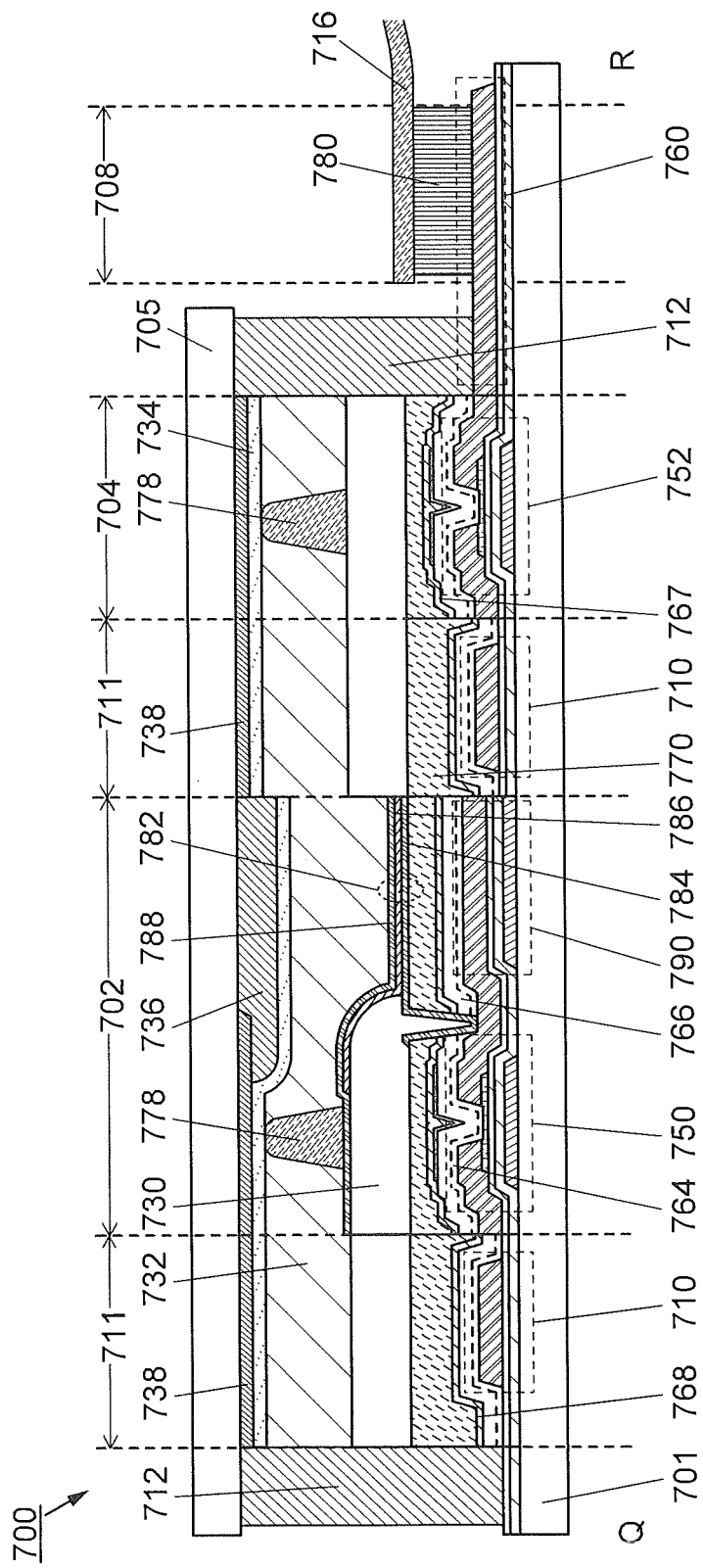
FIG. 22 is a cross-sectional view illustrating one embodiment of a display device.

Common portions between FIG. 21 and FIG. 22 are described first, and then different portions are described.

<Common Portions in Display Devices>

The display device 700 illustrated in FIG. 21 and FIG. 22 include a lead wiring portion 711, the pixel portion 702, the source driver circuit portion 704, and the FPC terminal portion 708. Note that the lead wiring portion 711 includes the signal line 710. The pixel portion 702 includes a transistor 750 and a capacitor 790. The source driver circuit portion 704 includes a transistor 752.

Any of the transistors described above can be used as the transistors 750 and 752.

The transistors used in this embodiment each include an oxide semiconductor film which is highly purified and in which formation of oxygen vacancy is suppressed. In the transistor, the current in an off state (off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption.

In addition, the transistor used in this embodiment can have relatively high field-effect mobility and thus is capable of high speed operation. For example, with such a transistor which can operate at high speed used for a liquid crystal display device, a switching transistor in a pixel portion and a driver transistor in a driver circuit portion can be formed over one substrate. That is, a semiconductor device formed using a silicon wafer or the like is not additionally needed as a driver circuit, whereby the number of components of the semiconductor device can be reduced. In addition, the transistor which can operate at high speed can be used also in the pixel portion, whereby a high-quality image can be provided.

The capacitor 790 includes a dielectric between a pair of electrodes. Specifically, a conductive film which is formed using the same step as a conductive film functioning as a gate electrode of the transistor 750 is used as one electrode of the capacitor 790, and a conductive film functioning as a source electrode or a drain electrode of the transistor 750 is used as the other electrode of the capacitor 790. Furthermore, an insulating film functioning as a gate insulating film of the transistor 750 is used as the dielectric between the pair of electrodes.

In FIG. 21 and FIG. 22, insulating films 764, 766, and 768, an oxide semiconductor film 767, and a planarization insulating film 770 are formed over the transistor 750, the transistor 752, and the capacitor 790.

The insulating films 764, 766, and 768 can be formed using materials and methods similar to those of the insulating films 114, 116, and 118 described in the above embodiment, respectively. The oxide semiconductor film 767 can be formed using a material and a method similar to those of the oxide semiconductor film 117 described in the above embodiment. The planarization insulating film 770 can be formed using a heat-resistant organic material, such as a polyimide resin, an acrylic resin, a polyimide amide resin, a benzocyclobutene resin, a polyamide resin, or an epoxy resin. Note that the planarization insulating film 770 may be formed by stacking a plurality of insulating films formed from these materials. Alternatively, a structure without the planarization insulating film 770 may be employed.

The signal line 710 is formed in the same steps as conductive films functioning as source and drain electrodes of the transistor 750 or 752. Note that the signal line 710 may be formed using a conductive film which is formed in different steps as a source electrode and a drain electrode of the transistor 750 or 752, for example, a conductive film functioning as a gate electrode may be used. In the case where the signal line 710 is formed using a material including a copper element, signal delay or the like due to wiring resistance is reduced, which enables display on a large screen.

The FPC terminal portion 708 includes a connection electrode 760, an anisotropic conductive film 780, and the FPC 716. Note that the connection electrode 760 is formed in the same steps as conductive films functioning as source and drain electrodes of the transistor 750 or 752. The connection electrode 760 is electrically connected to a terminal included in the FPC 716 through the anisotropic conductive film 780.

For example, a glass substrate can be used as the first substrate 701 and the second substrate 705. A flexible substrate may be used as the first substrate 701 and the second substrate 705. Examples of the flexible substrate include a plastic substrate.

A structure body 778 is provided between the first substrate 701 and the second substrate 705. The structure body 778 is a columnar spacer obtained by selective etching of an insulating film and provided to control the distance (cell gap) between the first substrate 701 and the second substrate 705. Note that a spherical spacer may be used as the structure body 778. Although the structure in which the structure body 778 is provided on the first substrate 701 side is described as an example in this embodiment, one embodiment of the present invention is not limited thereto. For example, a structure in which the structure body 778 is provided on the second substrate 705 side, or a structure in which both of the first substrate 701 and the second substrate 705 are provided with the structure body 778 may be employed.

Furthermore, a light-blocking film 738 functioning as a black matrix, a coloring film 736 functioning as a color filter, and, an insulating film 734 in contact with the light-blocking film 738 and the coloring film 736 are provided on the second substrate 705 side.

<Structure Example of Display Device Using Liquid Crystal Element as Display Element>

The display device 700 in FIG. 21 includes a liquid crystal element 775. The liquid crystal element 775 includes a conductive film 772, a conductive film 774, and a liquid crystal layer 776. The conductive film 774 is provided on the second substrate 705 side and functions as a counter electrode. The display device 700 in FIG. 21 is capable of displaying an image in such a manner that transmission or non-transmission is controlled by change in the alignment state of the liquid crystal layer 776 depending on a voltage applied to the conductive film 772 and the conductive film 774.

The conductive film 772 is connected to the conductive film functioning as a source or drain electrode included in the transistor 750. The conductive film 772 is formed over the planarization insulating film 770 to function as a pixel electrode, i.e., one electrode of the display element. The conductive film 772 functions as a reflective electrode. The display device 700 in FIG. 21 is what is called a reflective color liquid crystal display device in which external light is reflected by the conductive film 772 to display an image through the coloring film 736.

A conductive film that transmits visible light or a conductive film that reflects visible light can be used as the conductive film 772. For example, a material including one kind selected from indium (In), zinc (Zn), and tin (Sn) is preferably used for the conductive film that transmits visible light. For example, a material including aluminum or silver may be used for the conductive film that reflects visible light. In this embodiment, the conductive film that reflects visible light is used as the conductive film 772.

In the case where a conductive film which reflects visible light is used as the conductive film 772, the conductive film may have a stacked-layer structure. For example, a 100-nm-thick aluminum film is formed as the bottom layer, and a 30-nm-thick silver alloy film (e.g., an alloy film including silver, palladium, and copper) is formed as the top layer. Such a structure makes it possible to obtain the following effects.

(1) Adhesion between the base film and the conductive film 772 can be improved.

(2) The aluminum film and the silver alloy film can be collectively etched depending on a chemical solution.

(3) The conductive film 772 can have a favorable cross-sectional shape (e.g., a tapered shape).

The reason for (3) is as follows: the etching rate of the aluminum film with the chemical solution is lower than that of the silver alloy film, or etching of the aluminum film that is the bottom layer is developed faster than that of the silver alloy film because, when the aluminum film that is the bottom layer is exposed after the etching of the silver alloy film that is the top layer, electrons are extracted from metal that is less noble than the silver alloy film, i.e., aluminum that is metal having a high ionization tendency, and thus etching of the silver alloy film is suppressed.

Note that projections and depressions are provided in part of the planarization insulating film 770 of the pixel portion 702 in the display device 700 in FIG. 21. The projections and depressions can be formed in such a manner that the planarization insulating film 770 is formed using an organic resin film or the like, and projections and depressions are formed on the surface of the organic resin film. The conductive film 772 functioning as a reflective electrode is formed along the projections and depressions. Therefore, when external light is incident on the conductive film 772, the light is reflected diffusely at the surface of the conductive film 772, whereby visibility can be improved.

Note that the display device 700 in FIG. 21 is a reflective color liquid crystal display device given as an example, but a display type is not limited thereto. For example, a transmissive color liquid crystal display device in which the conductive film 772 is a conductive film that transmits visible light may be used. In the case of a transmissive color liquid crystal display device, projections and depressions are not necessarily provided on the planarization insulating film 770.

Although not illustrated in FIG. 21, an alignment film may be provided on a side of the conductive film 772 in contact with the liquid crystal layer 776 and on a side of the conductive film 774 in contact with the liquid crystal layer 776. Although not illustrated in FIG. 21, an optical member (an optical substrate) and the like such as a polarizing member, a retardation member, or an anti-reflection member may be provided as appropriate. For example, circular polarization may be employed by using a polarizing substrate and a retardation substrate. In addition, a backlight, a sidelight, or the like may be used as a light source.

In the case where a liquid crystal element is used as the display element, a thermotropic liquid crystal, a low-molecular liquid crystal, a high-molecular liquid crystal, a polymer-dispersed liquid crystal, a ferroelectric liquid crystal, an anti-ferroelectric liquid crystal, or the like can be used. Such a liquid crystal material exhibits a cholesteric phase, a smectic phase, a cubic phase, a chiral nematic phase, an isotropic phase, or the like depending on conditions.

Alternatively, in the case of employing a horizontal electric field mode, a liquid crystal exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which several weight percent or more of a chiral material is mixed is used for the liquid crystal layer in order to improve the temperature range. The liquid crystal composition which includes liquid crystal exhibiting a blue phase and a chiral material has a short response time and optical isotropy, which makes the alignment process unneeded. In addition, the liquid crystal composition which includes liquid crystal exhibiting a blue phase and a chiral material has a small viewing angle dependence. An alignment film does not need to be provided and rubbing treatment is thus not necessary;

accordingly, electrostatic discharge damage caused by the rubbing treatment can be prevented and defects and damage of the liquid crystal display device in the manufacturing process can be reduced.

In the case where a liquid crystal element is used as the display element, a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Furthermore, a normally black liquid crystal display device such as a transmissive liquid crystal display device utilizing a vertical alignment (VA) mode may also be used. There are some examples of a vertical alignment mode; for example, a multi-domain vertical alignment (MVA) mode, a patterned vertical alignment (PVA) mode, an ASV mode, or the like can be employed.

<Display Device Using Light-Emitting Element as Display Element>

The display device 700 illustrated in FIG. 22 includes a light-emitting element 782. The light-emitting element 782 includes a conductive film 784, an EL layer 786, and a conductive film 788. The display device 700 in FIG. 22 is capable of displaying an image by light emission from the EL layer 786 included in the light-emitting element 782.

The conductive film 784 is connected to the conductive film functioning as a source or drain electrode included in the transistor 750. The conductive film 784 is formed over the planarization insulating film 770 to function as a pixel electrode, i.e., one electrode of the display element. A conductive film which transmits visible light or a conductive film which reflects visible light can be used as the conductive film 784. The conductive film which transmits visible light can be formed using a material including one kind selected from indium (In), zinc (Zn), and tin (Sn), for example. The conductive film which reflects visible light can be formed using a material including aluminum or silver, for example.

In the display device 700 in FIG. 22, an insulating film 730 is provided over the planarization insulating film 770 and the conductive film 784. The insulating film 730 covers part of the conductive film 784. Note that the light-emitting element 782 has a top emission structure. Therefore, the conductive film 788 has a light-transmitting property and transmits light emitted from the EL layer 786. Although the top-emission structure is described as an example in this embodiment, one embodiment of the present invention is not limited thereto. A bottom-emission structure in which light is emitted to the conductive film 784 side, or a dual-emission structure in which light is emitted to both the conductive film 784 side and the conductive film 788 side may be employed.

The coloring film 736 is provided to overlap with the light-emitting element 782, and the light-blocking film 738 is provided to overlap with the insulating film 730 and to be included in the lead wiring portion 711 and in the source driver circuit portion 704. The coloring film 736 and the light-blocking film 738 are covered with the insulating film 734. A space between the light-emitting element 782 and the insulating film 734 is filled with a sealing film 732. Although a structure with the coloring film 736 is described as the display device 700 in FIG. 22, the structure is not limited thereto. In the case where the EL layer 786 is formed by a separate coloring method, the coloring film 736 is not necessarily provided.

The structure described in this embodiment can be used in appropriate combination with any of the structures described in the other embodiments.

Embodiment 4

In this embodiment, a display device that includes a semiconductor device of one embodiment of the present invention will be described with reference to FIGS. 23A to 23C.

The display device illustrated in FIG. 23A includes a region including pixels of display elements (hereinafter the region is referred to as a pixel portion 502), a circuit portion being provided outside the pixel portion 502 and including a circuit for driving the pixels (hereinafter the portion is referred to as a driver circuit portion 504), circuits each having a function of protecting an element (hereinafter the circuits are referred to as protection circuits 506), and a terminal portion 507. Note that the protection circuits 506 are not necessarily provided.

Part or the whole of the driver circuit portion 504 is preferably formed over a substrate over which the pixel portion 502 is formed, in which case the number of components and the number of terminals can be reduced. When part or the whole of the driver circuit portion 504 is not formed over the substrate over which the pixel portion 502 is formed, the part or the whole of the driver circuit portion 504 can be mounted by COG or tape automated bonding (TAB).

The pixel portion 502 includes a plurality of circuits for driving display elements arranged in X rows (X is a natural number of 2 or more) and Y columns (Y is a natural number of 2 or more) (hereinafter, such circuits are referred to as pixel circuits 501). The driver circuit portion 504 includes driver circuits such as a circuit for supplying a signal (scan signal) to select a pixel (hereinafter, the circuit is referred to as a gate driver 504*a*) and a circuit for supplying a signal (data signal) to drive a display element in a pixel (hereinafter, the circuit is referred to as a source driver 504*b*).

The gate driver 504*a* includes a shift register or the like. The gate driver 504*a* receives a signal for driving the shift register through the terminal portion 507 and outputs a signal. For example, the gate driver 504*a* receives a start pulse signal, a clock signal, or the like and outputs a pulse signal. The gate driver 504*a* has a function of controlling the potentials of wirings supplied with scan signals (hereinafter, such wirings are referred to as scan lines GL_1 to GL_X). Note that a plurality of gate drivers 504*a* may be provided to control the scan lines GL_1 to GL_X separately. Alternatively, the gate driver 504*a* has a function of supplying an initialization signal. Without being limited thereto, the gate driver 504*a* can supply another signal.

The source driver 504*b* includes a shift register or the like. The source driver 504*b* receives a signal (video signal) from which a data signal is derived, as well as a signal for driving the shift register, through the terminal portion 507. The source driver 504*b* has a function of generating a data signal to be written to the pixel circuit 501 which is based on the video signal. In addition, the source driver 504*b* has a function of controlling output of a data signal in response to a pulse signal produced by input of a start pulse signal, a clock signal, or the like. Furthermore, the source driver 504*b* has a function of controlling the potentials of wirings supplied with data signals (hereinafter such wirings are referred to as data lines DL_1 to DL_Y). Alternatively, the source driver 504*b* has a function of supplying an initialization signal. Without being limited thereto, the source driver 504*b* can supply another signal.

The source driver 504*b* includes a plurality of analog switches, for example. The source driver 504*b* can output, as the data signals, signals obtained by time-dividing the video signal by sequentially turning on the plurality of analog switches. The source driver 504*b* may include a shift register or the like.

A pulse signal and a data signal are input to each of the plurality of pixel circuits 501 through one of the plurality of scan lines GL supplied with scan signals and one of the plurality of data lines DL supplied with data signals, respectively. Writing and holding of the data signal to and in each of the plurality of pixel circuits 501 are controlled by the gate driver 504*a*. For example, to the pixel circuit 501 in the m-th row and the n-th column (m is a natural number of less than or equal to X, and n is a natural number of less than or equal to Y), a pulse signal is input from the gate driver 504*a* through the scan line GL_m, and a data signal is input from the source driver 504*b* through the data line DL_n in accordance with the potential of the scan line GL_m.

Figure 23A:
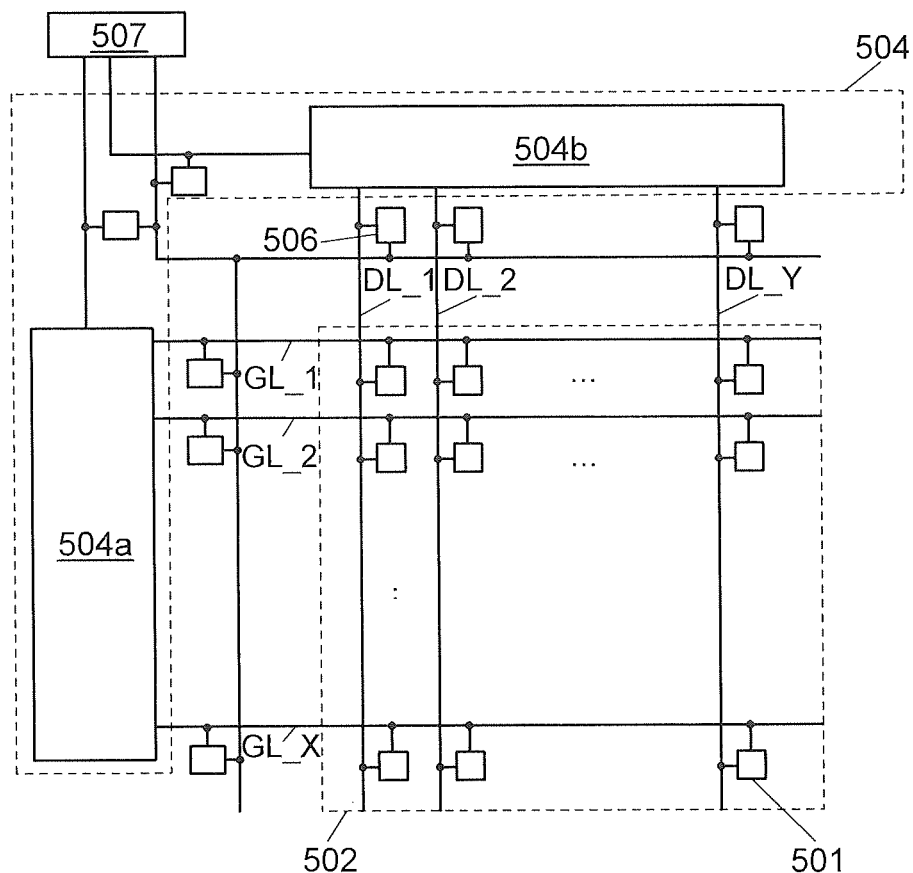
FIGS. 23A to 23C are a block diagram and circuit diagrams illustrating a display device.

The protection circuit 506 illustrated in FIG. 23A is connected to, for example, the scan line GL between the gate driver 504*a* and the pixel circuit 501. Alternatively, the protection circuit 506 is connected to the data line DL between the source driver 504*b* and the pixel circuit 501. Alternatively, the protection circuit 506 can be connected to a wiring between the gate driver 504*a* and the terminal portion 507. Alternatively, the protection circuit 506 can be connected to a wiring between the source driver 504*b* and the terminal portion 507. Note that the terminal portion 507 means a portion having terminals for inputting power, control signals, and video signals to the display device from external circuits.

The protection circuit 506 is a circuit that electrically connects a wiring connected to the protection circuit to another wiring when a potential out of a certain range is applied to the wiring connected to the protection circuit.

As illustrated in FIG. 23A, the protection circuits 506 are provided for the pixel portion 502 and the driver circuit portion 504, so that the resistance of the display device to overcurrent generated by electrostatic discharge (ESD) or the like can be improved. Note that the configuration of the protection circuits 506 is not limited to that, and for example, the protection circuit 506 may be configured to be connected to the gate driver 504a or the protection circuit 506 may be configured to be connected to the source driver 504b. Alternatively, the protection circuit 506 may be configured to be connected to the terminal portion 507.

In FIG. 23A, an example in which the driver circuit portion 504 includes the gate driver 504a and the source driver 504b is shown; however, the structure is not limited thereto. For example, only the gate driver 504a may be formed and a separately prepared substrate where a source driver circuit is formed (e.g., a driver circuit substrate formed with a single crystal semiconductor film or a polycrystalline semiconductor film) may be mounted.

Figure 23B:
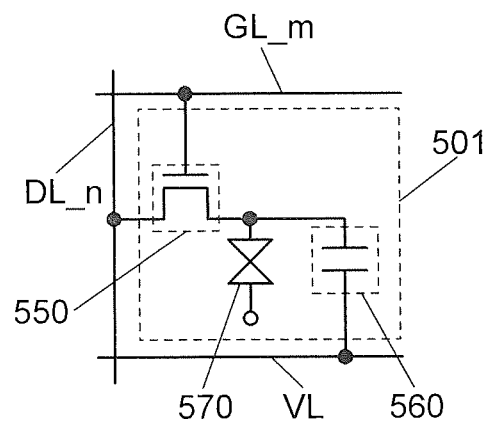

Each of the plurality of pixel circuits 501 in FIG. 23A can have the structure illustrated in FIG. 23B, for example.

The pixel circuit 501 illustrated in FIG. 23B includes a liquid crystal element 570, a transistor 550, and a capacitor 560. As the transistor 550, any of the transistors described in the above embodiment, for example, can be used.

The potential of one of a pair of electrodes of the liquid crystal element 570 is set in accordance with the specifications of the pixel circuit 501 as appropriate. The alignment state of the liquid crystal element 570 depends on written data. A common potential may be supplied to one of the pair of electrodes of the liquid crystal element 570 included in each of the plurality of pixel circuits 501. Furthermore, the potential supplied to one of the pair of electrodes of the liquid crystal element 570 in the pixel circuit 501 in one row may be different from the potential supplied to one of the pair of electrodes of the liquid crystal element 570 in the pixel circuit 501 in another row.

As examples of a driving method of the display device including the liquid crystal element 570, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer-dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

In the pixel circuit 501 in the m-th row and the n-th column, one of a source electrode and a drain electrode of the transistor 550 is electrically connected to the data line DL_n, and the other is electrically connected to the other of the pair of electrodes of the liquid crystal element 570. A gate electrode of the transistor 550 is electrically connected to the scan line GL_m. The transistor 550 has a function of controlling whether to write a data signal by being turned on or off.

One of a pair of electrodes of the capacitor 560 is electrically connected to a wiring to which a potential is supplied (hereinafter referred to as a potential supply line VL), and the other is electrically connected to the other of the pair of electrodes of the liquid crystal element 570. The potential of the potential supply line VL is set in accordance with the specifications of the pixel circuit 501 as appropriate. The capacitor 560 functions as a storage capacitor for storing written data.

For example, in the display device including the pixel circuit 501 in FIG. 23B, the pixel circuits 501 are sequentially selected row by row by the gate driver 504a illustrated in FIG. 23A, whereby the transistors 550 are turned on and a data signal is written.

When the transistors 550 are turned off, the pixel circuits 501 in which the data has been written are brought into a holding state. This operation is sequentially performed row by row; thus, an image can be displayed.

Figure 23C:
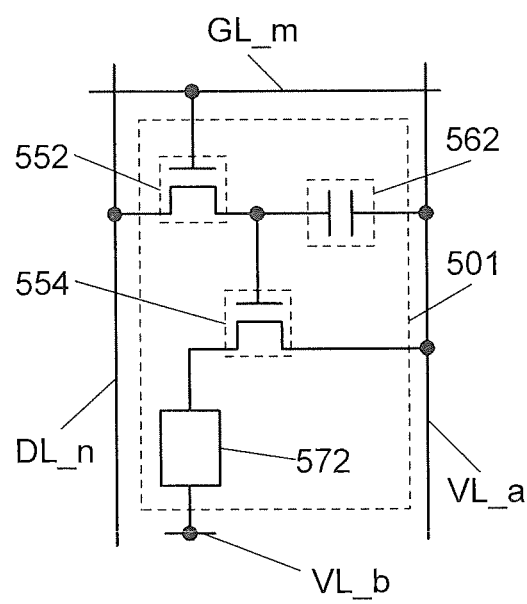

Alternatively, each of the plurality of pixel circuits 501 in FIG. 23A can have the structure illustrated in FIG. 23C, for example.

The pixel circuit 501 illustrated in FIG. 23C includes transistors 552 and 554, a capacitor 562, and a light-emitting element 572. Any of the transistors described in the above embodiment, for example, can be used as one or both of the transistors 552 and 554.

One of a source electrode and a drain electrode of the transistor 552 is electrically connected to a wiring to which a data signal is supplied (hereinafter referred to as a signal line DL_n). A gate electrode of the transistor 552 is electrically connected to a wiring to which a gate signal is supplied (hereinafter referred to as a scan line GL_m).

The transistor 552 has a function of controlling whether to write a data signal by being turned on or off.

One of a pair of electrodes of the capacitor 562 is electrically connected to a wiring to which a potential is supplied (hereinafter referred to as a potential supply line VL_a), and the other is electrically connected to the other of the source electrode and the drain electrode of the transistor 552.

The capacitor 562 functions as a storage capacitor for storing written data.

One of a source electrode and a drain electrode of the transistor 554 is electrically connected to the potential supply line VL_a. Furthermore, a gate electrode of the transistor 554 is electrically connected to the other of the source electrode and the drain electrode of the transistor 552.

One of an anode and a cathode of the light-emitting element 572 is electrically connected to a potential supply line VL_b, and the other is electrically connected to the other of the source electrode and the drain electrode of the transistor 554.

As the light-emitting element 572, an organic electroluminescent element (also referred to as an organic EL element) can be used, for example. Note that the light-emitting element 572 is not limited to an organic EL element; an inorganic EL element including an inorganic material may be used A high power supply potential VDD is supplied to one of the potential supply line VL_a and the potential supply line VL_b, and a low power supply potential VSS is supplied to the other.

For example, in the display device including the pixel circuit 501 in FIG. 23C, the pixel circuits 501 are sequentially selected row by row by the gate driver 504a illustrated in FIG. 23A, whereby the transistors 552 are turned on and a data signal is written.

When the transistors 552 are turned off, the pixel circuits 501 in which the data has been written are brought into a holding state. Furthermore, the amount of current flowing between the source electrode and the drain electrode of the transistor 554 is controlled in accordance with the potential of the written data signal. The light-emitting element 572 emits light with luminance corresponding to the amount of flowing current. This operation is sequentially performed row by row; thus, an image can be displayed.

The structure described in this embodiment can be used in appropriate combination with the structure described in any of the other embodiments.

Embodiment 5

In this embodiment, a display module and electronic appliances that include a semiconductor device of one embodiment of the present invention will be described with reference to FIG. 24 and FIGS. 25A to 25G.

Figure 24:
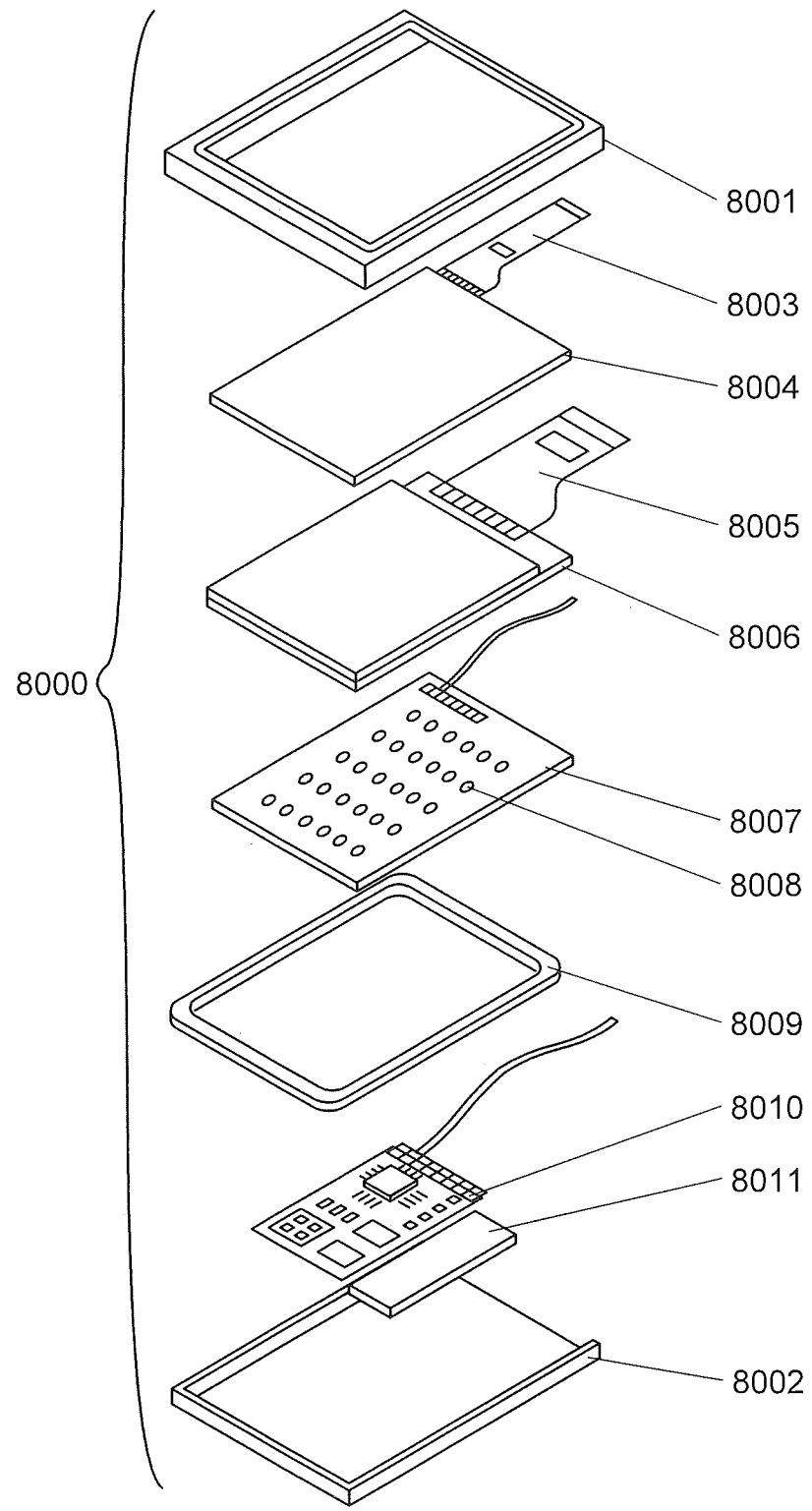
FIG. 24 illustrates a display module.

In a display module 8000 illustrated in FIG. 24, a touch panel 8004 connected to an FPC 8003, a display panel 8006 connected to an FPC 8005, a backlight 8007, a frame 8009, a printed board 8010, and a battery 8011 are provided between an upper cover 8001 and a lower cover 8002.

The semiconductor device of one embodiment of the present invention can be used for, for example, the display panel 8006.

The shapes and sizes of the upper cover 8001 and the lower cover 8002 can be changed as appropriate in accordance with the sizes of the touch panel 8004 and the display panel 8006.

The touch panel 8004 can be a resistive touch panel or a capacitive touch panel and can be formed to overlap with the display panel 8006. A counter substrate (sealing substrate) of the display panel 8006 can have a touch panel function. A photosensor may be provided in each pixel of the display panel 8006 to form an optical touch panel.

The backlight 8007 includes a light source 8008. Note that although a structure in which the light sources 8008 are provided over the backlight 8007 is illustrated in FIG. 24, one embodiment of the present invention is not limited to this structure. For example, a structure in which the light source 8008 is provided at an end portion of the backlight 8007 and a light diffusion plate is further provided may be employed. Note that the backlight 8007 need not be provided in the case where a self-luminous light-emitting element such as an organic EL element is used or in the case where a reflective panel or the like is employed.

The frame 8009 protects the display panel 8006 and also functions as an electromagnetic shield for blocking electromagnetic waves generated by the operation of the printed board 8010. The frame 8009 may function as a radiator plate.

The printed board 8010 is provided with a power supply circuit and a signal processing circuit for outputting a video signal and a clock signal. As a power source for supplying power to the power supply circuit, an external commercial power source or a power source using the battery 8011 provided separately may be used. The battery 8011 can be omitted in the case of using a commercial power source.

The display module 8000 may be additionally provided with a member such as a polarizing plate, a retardation plate, or a prism sheet.

FIGS. 25A to 25G illustrate electronic appliances. These electronic appliances can include a housing 9000, a display portion 9001, a speaker 9003, operation keys 9005 (including a power switch or an operation switch), a connection terminal 9006, a sensor 9007 (a sensor having a function of measuring or sensing force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 9008, and the like.

The electronic appliances illustrated in FIGS. 25A to 25G can have a variety of functions, for example, a function of displaying a variety of data (a still image, a moving image, a text image, and the like) on the display portion, a touch panel function, a function of displaying a calendar, date, time, and the like, a function of controlling a process with a variety of software (programs), a wireless communication function, a function of being connected to a variety of computer networks with a wireless communication function, a function of transmitting and receiving a variety of data with a wireless communication function, a function of reading a program or data stored in a memory medium and displaying the program or data on the display portion, and the like. Note that functions that can be provided for the electronic appliances illustrated in FIGS. 25A to 25G are not limited to those described above, and the electronic appliances can have a variety of functions. Although not illustrated in FIGS. 25A to 25G, the electronic appliance may include a plurality of display portions. Furthermore, the electronic appliance may be provided with a camera and the like and have a function of shooting a still image, a function of shooting a moving image, a function of storing a shot image in a memory medium (an external memory medium or a memory medium incorporated in the camera), a function of displaying a shot image on the display portion, or the like.

The electronic appliances illustrated in FIGS. 25A to 25G are described in detail below.

Figure 25A:
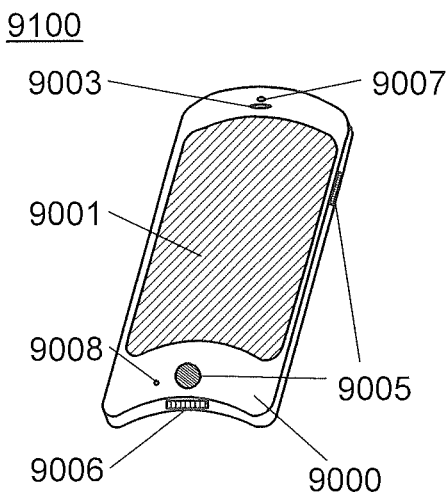
FIGS. 25A to 25G illustrate electronic appliances.

FIG. 25A is a perspective view illustrating a portable information terminal 9100. A display portion 9001 of the portable information terminal 9100 is flexible. Therefore, the display portion 9001 can be incorporated along a bent surface of a bent housing 9000. Furthermore, the display portion 9001 includes a touch sensor, and operation can be performed by touching the screen with a finger, a stylus, or the like. For example, by touching an icon displayed on the display portion 9001, application can be started.

Figure 25D:
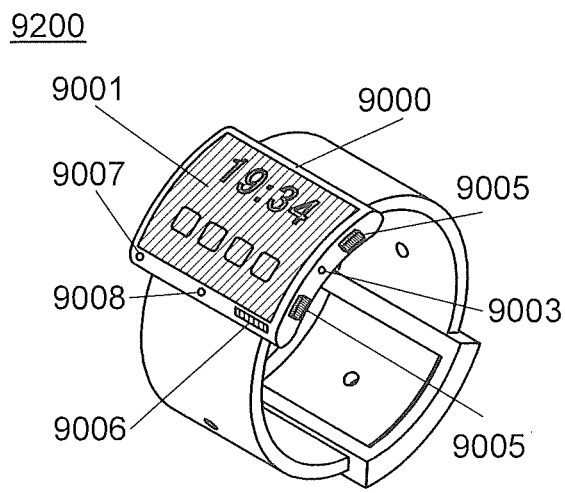
Figure 25B:
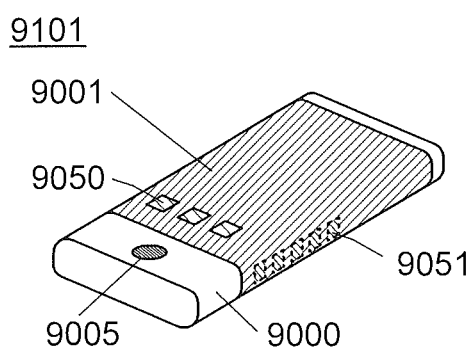

FIG. 25B is a perspective view illustrating a portable information terminal 9101. The portable information terminal 9101 function as, for example, one or more of a telephone set, a notebook, and an information browsing system. Specifically, the portable information terminal 9101 can be used as a smartphone. Note that although the speaker 9003, the connection terminal 9006, the sensor 9007, and the like of the portable information terminal 9101 are not illustrated in FIG. 25B, they can be provided in the same positions as the portable information terminal 9100 in FIG. 25A. The portable information terminal 9101 can display characters and image information on its plurality of surfaces. For example, three operation buttons 9050 (also referred to as operation icons or simply icons) can be displayed on one surface of the display portion 9001. Furthermore, information 9051 indicated by dashed rectangles can be displayed on another surface of the display portion 9001. Examples of the information 9051 include display indicating reception of an incoming email, social networking service (SNS) message, and call; the title and sender of an email and SNS massage; the date; the time; remaining battery; and the reception strength of an antenna. Alternatively, the operation buttons 9050 or the like may be displayed in place of the information 9051.

Figure 25E:
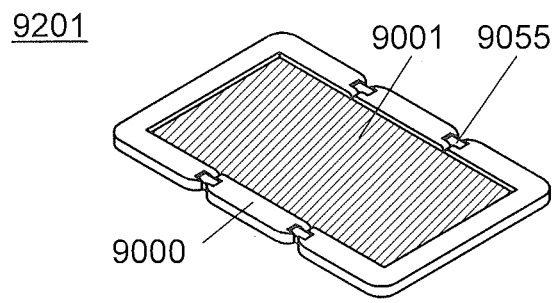
Figure 25C:
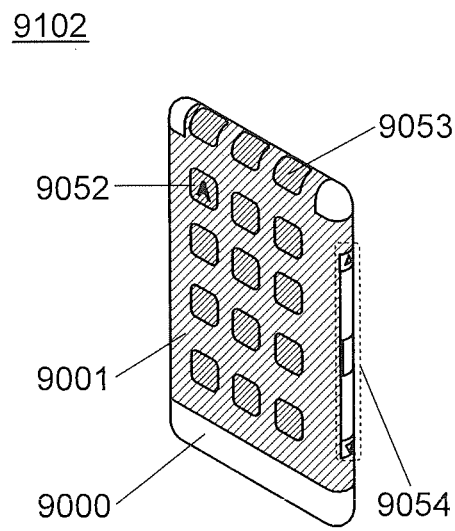

FIG. 25C is a perspective view illustrating a portable information terminal 9102. The portable information terminal 9102 has a function of displaying information, for example, on three or more sides of the display portion 9001. Here, information 9052, information 9053, and information 9054 are displayed on different sides. For example, a user of the portable information terminal 9102 can see the display (here, the information 9053) with the portable information terminal 9102 put in a breast pocket of his/her clothes. Specifically, a caller's phone number, name, or the like of an incoming call is displayed in a position that can be seen from above the portable information terminal 9102. Thus, the user can see the display without taking out the portable information terminal 9102 from the pocket and decide whether to answer the call.

FIG. 25D is a perspective view illustrating a wrist-watch-type portable information terminal 9200. The portable information terminal 9200 is capable of executing a variety of applications such as mobile phone calls, e-mailing, reading and editing texts, music reproduction, Internet communication, and a computer game. The display surface of the display portion 9001 is bent, and images can be displayed on the bent display surface. The portable information terminal 9200 can employ near field communication that is a communication method based on an existing communication standard. In that case, for example, mutual communication between the portable information terminal 9200 and a headset capable of wireless communication can be performed, and thus hands-free calling is possible. Moreover, the portable information terminal 9200 includes the connection terminal 9006, and data can be directly transmitted to and received from another information terminal via a connector. Charging through the connection terminal 9006 is possible. Note that the charging operation may be performed by wireless power feeding without using the connection terminal 9006.

Figure 25F:
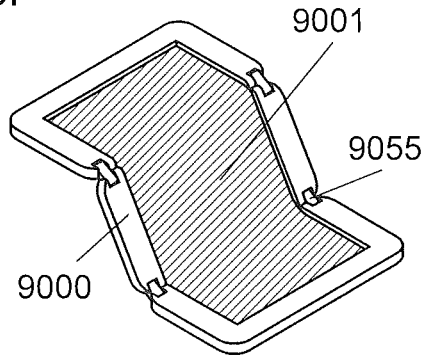
Figure 25G:
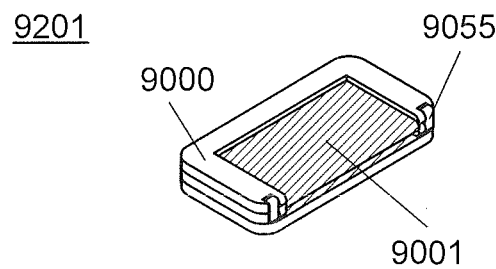

FIGS. 25E, 25F, and 25G are perspective views each illustrating a foldable portable information terminal 9201. FIG. 25E is a perspective view illustrating the portable information terminal 9201 that is opened, FIG. 25F is a perspective view illustrating the portable information terminal 9201 that is being opened or being folded, and FIG. 25G is a perspective view illustrating the portable information terminal 9201 that is folded. The portable information terminal 9201 is highly portable when folded. When the portable information terminal 9201 is opened, a seamless large display region is highly browsable. The display portion 9001 of the portable information terminal 9201 is supported by three housings 9000 joined together by hinges 9055. By folding the portable information terminal 9201 at a connection portion between two housings 9000 with the hinges 9055, the portable information terminal 9201 can be reversibly changed in shape from an opened state to a folded state. For example, the portable information terminal 9201 can be bent with a radius of curvature of greater than or equal to 1 mm and less than or equal to 150 mm.

The electronic appliances described in this embodiment each include the display portion for displaying some sort of data. Note that the semiconductor device of one embodiment of the present invention can also be used for an electronic appliance that does not have a display portion. The structure in which the display portion of the electronic appliance described in this embodiment is flexible and display can be performed on the bent display surface or the structure in which the display portion of the electronic appliance is foldable is described as an example; however, the structure is not limited thereto and a structure in which the display portion of the electronic appliance is not flexible and display is performed on a plane portion may be employed.

The structure described in this embodiment can be used in appropriate combination with any of the structures described in the other embodiments.

EXAMPLE 1

In this example, the amount of oxygen released from an insulating film included in a semiconductor device of one embodiment of the present invention was measured. Samples A2, A2, A3, A4, A5, A6, A7, and A8 described below were used for evaluation in this example.

Figure 26A:
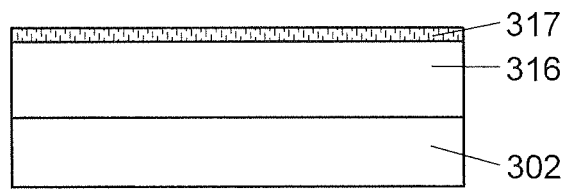
FIGS. 26A and 26B are cross-sectional views illustrating structures of samples in Examples 1 to 4.
Figure 26B:
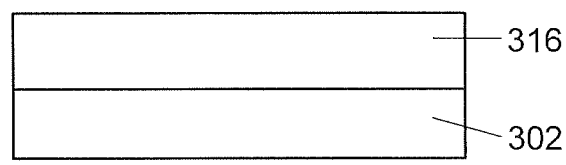

First, each sample will be described in detail with reference to FIGS. 26A and 26B. FIG. 26A is a cross-sectional view schematically illustrating the samples A1, A3, A5, and A7, and FIG. 26B is a cross-sectional view schematically illustrating the samples A2, A4, A6, and A8.

The samples A1, A3, A5, and A7 illustrated in FIG. 26A each include a substrate 302, an insulating film 316 over the substrate 302, and an oxide semiconductor film 317 over the insulating film 316. The samples A2, A4, A6, and A8 illustrated in FIG. 26B each include the substrate 302 and the insulating film 316 over the substrate 302.

(Sample A1)

As for a fabrication method of the sample A1, the insulating film 316 was formed over the substrate 302. A 400-nm-thick silicon oxynitride film (hereinafter described as a SiON film in some cases) was used as the insulating film 316. The silicon oxynitride film was deposited under the conditions where the substrate temperature was 220° C.; a silane gas at a flow rate of 160 sccm and a dinitrogen monoxide gas at a flow rate of 4000 sccm were introduced into a chamber; the pressure was 200 Pa; and an RF power of 1500 W was supplied between parallel-plate electrodes provided in a PECVD apparatus.

Next, heat treatment was performed. The heat treatment was performed at 650° C. in a nitrogen atmosphere for 6 minutes with an RTA apparatus. By the heat treatment, oxygen included in the insulating film 316 is released.

Next, the oxide semiconductor film 317 was formed over the insulating film 316. A 5-nm-thick IGZO film was used as the oxide semiconductor film 317. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:4:5 [atomic %]) provided in a sputtering apparatus.

Note that the IGZO film was deposited under the condition where the percentage of the oxygen ($O_2$) gas to the whole deposition gas was 100%.

Next, oxygen addition treatment was performed on the insulating film 316 through the oxide semiconductor film 317. The oxygen addition treatment was performed with an ashing apparatus under the conditions where the substrate temperature was 160° C., an oxygen gas at a flow rate of 250 sccm was introduced into a chamber, the pressure was 15 Pa, and an RF power of 4500 W was supplied for 120 seconds between parallel-plate electrodes provided in the ashing apparatus so that a bias voltage would be applied to the substrate side.

(Sample A2)

In the sample A2, an IGZO film serving as the oxide semiconductor film 317 was removed by a wet etching method after the same fabrication steps as the sample Al were performed.

(Sample A3)

The fabrication method of the sample A3 was different from that of the sample A1 only in the step of forming the oxide semiconductor film 317, and the other steps were the same as those of the sample A1. A 5-nm-thick IGZO film was used as the oxide semiconductor film 317 of the sample A3. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:3:2 [atomic %]) provided in a sputtering apparatus.

Note that the IGZO film was deposited under the condition where the percentage of the oxygen ($O_2$) gas to the whole deposition gas was 100%.

(Sample A4)

In the sample A4, an IGZO film serving as the oxide semiconductor film 317 was removed by a wet etching method after the same fabrication steps as the sample A3 were performed.

(Sample A5)

The fabrication method of the sample A5 was different from that of the sample Al only in the step of forming the oxide semiconductor film 317, and the other steps were the same as those of the sample A1. A 5-nm-thick IGZO film was used as the oxide semiconductor film 317 of the sample A5. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:1:1.2 [atomic %]) provided in a sputtering apparatus.

Note that the IGZO film was deposited under the condition where the percentage of the oxygen ($O_2$) gas to the whole deposition gas was 100%.

(Sample A6)

In the sample A6, an IGZO film serving as the oxide semiconductor film 317 was removed by a wet etching method after the same fabrication steps as the sample A5 were performed.

(Sample A7)

The fabrication method of the sample A7 was different from that of the sample A1 only in the step of forming the oxide semiconductor film 317, and the other steps were the same as those of the sample A1. A 5-nm-thick IGZO film was used as the oxide semiconductor film 317 of the sample A7. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=3:1:2 [atomic %]) provided in a sputtering apparatus.

Note that the IGZO film was deposited under the condition where the percentage of the oxygen ($O_2$) gas to the whole deposition gas was 100%.

(Sample A8)

In the sample A8, an IGZO film serving as the oxide semiconductor film 317 was removed by a wet etching method after the same fabrication steps as the sample A7 were performed.

Through the above process, the samples A1 to A8 of this example were fabricated. Table 1 briefly shows fabrication processes and structures of the samples Al to A8.

TABLE 1

| | Step 1 | Step 2 | Step 3 | Step 4 | Step 5 | Sample structure |
|---|---|---|---|---|---|---|
| Sample A1 | Formation of SiON film | Heat treatment at 650° C. | Formation of IGZO film (1:4:5) 5 nm, $O_2$ = 100% | Oxygen addition treatment 120 sec, 160° C. | — | Glass \SiON\ IGZO (1:4:5) |
| Sample A2 | Formation of SiON film | Heat treatment at 650° C. | Formation of IGZO film (1:4:5) 5 nm, $O_2$ = 100% | Oxygen addition treatment 120 sec, 160° C. | Removal of IGZO film | Glass\SiON |
| Sample A3 | Formation of SiON film | Heat treatment at 650° C. | Formation of IGZO film (1:3:2) 5 nm, $O_2$ = 100% | Oxygen addition treatment 120 sec, 160° C. | — | Glass\SiON\ IGZO (1:3:2) |
| Sample A4 | Formation of SiON film | Heat treatment at 650° C. | Formation of IGZO film (1:3:2) 5 nm, $O_2$ = 100% | Oxygen addition treatment 120 sec, 160° C. | Removal of IGZO film | Glass\SiON |
| Sample A5 | Formation of SiON film | Heat treatment at 650° C. | Formation of IGZO film (1:1:1.2) 5 nm, $O_2$ = 100% | Oxygen addition treatment 120 sec, 160° C. | — | Glass\SiON\ IGZO (1:1:1.2) |
| Sample A6 | Formation of SiON film | Heat treatment at 650° C. | Formation of IGZO film (1:1:1.2) 5 nm, $O_2$ = 100% | Oxygen addition treatment 120 sec, 160° C. | Removal of IGZO film | Glass\SiON |
| Sample A7 | Formation of SiON film | Heat treatment at 650° C. | Formation of IGZO film (3:1:2) 5 nm, $O_2$ = 100% | Oxygen addition treatment 120 sec, 160° C. | | Glass\SiON\ IGZO (3:1:2) |
| Sample A8 | Formation of SiON film | Heat treatment at 650° C. | Formation of IGZO film (3:1:2) 5 nm, $O_2$ = 100% | Oxygen addition treatment 120 sec, 160° C. | Removal of IGZO film | Glass\SiON |

Note:
The values in parentheses in the step 3 represent composition ratios of In:Ga:Zn (atomic %) of targets for forming IGZO films.
The bottom in the step 3 represents the thicknesses of the IGZO films and percentages of oxygen gas to the whole deposition gas.
The bottom in the step 4 represents time of oxygen addition treatment and substrate temperature during oxygen addition treatment.

Note that as shown in Table 1, the samples A2 to A8 are different from one another in composition of the oxide semiconductor film 317 and/or whether the step of removing the oxide semiconductor film 317 after its formation was performed or not.

<TDS Measurement 1>

Next, the samples A1 to A8 fabricated as described above were subjected to thermal desorption spectroscopy (TDS) measurement. In the TDS measurement, each sample was heated at temperatures ranging from 50° C. to 500° C. to evaluate the amount of oxygen released from the insulating film 316 in each sample. As the amount of oxygen released in the TDS measurement, a gas having a mass-to-charge ratio (M/z) of 32 was measured.

Figure 27A:
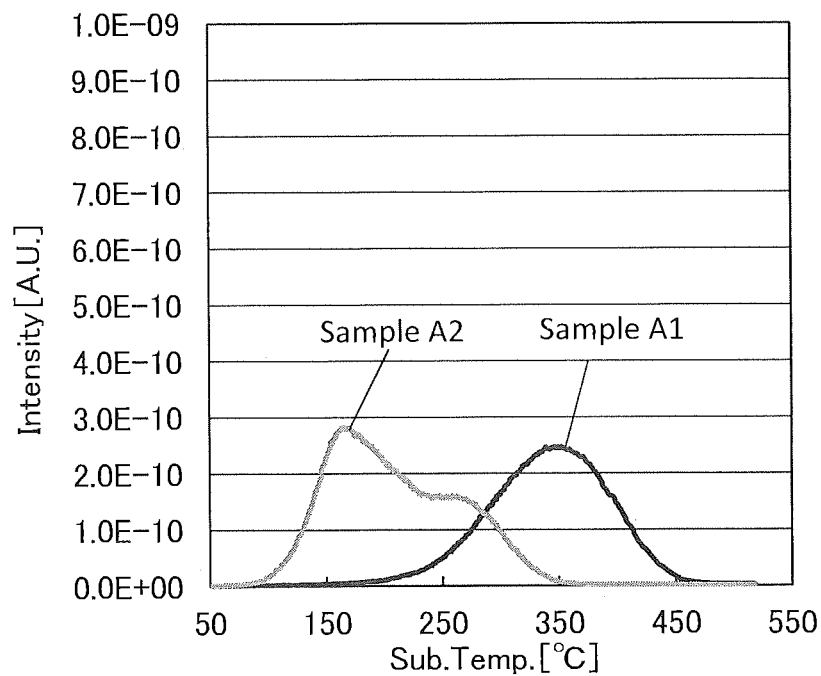
FIGS. 27A and 27B show TDS measurement results in Example 1.
Figure 27B:
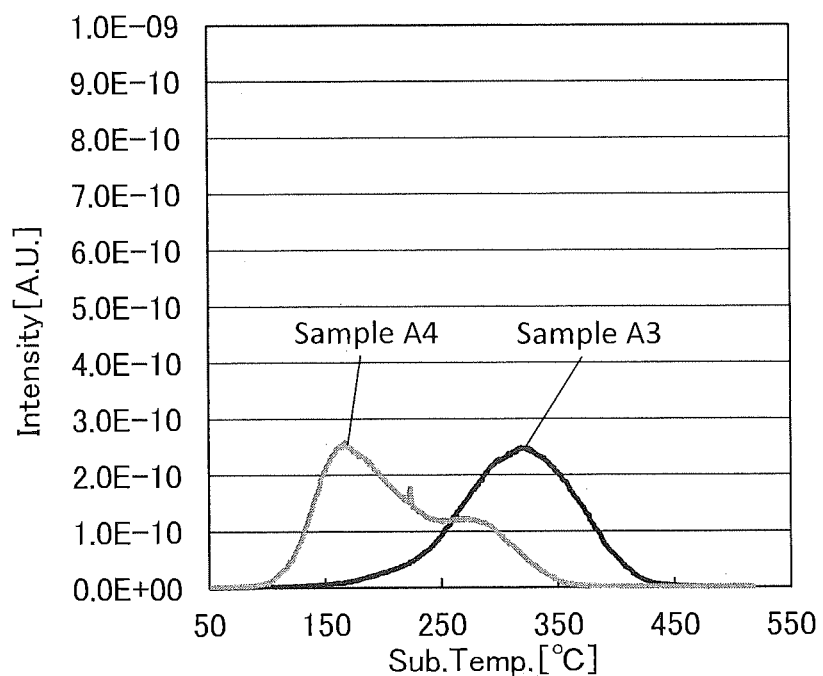
Figure 28A:
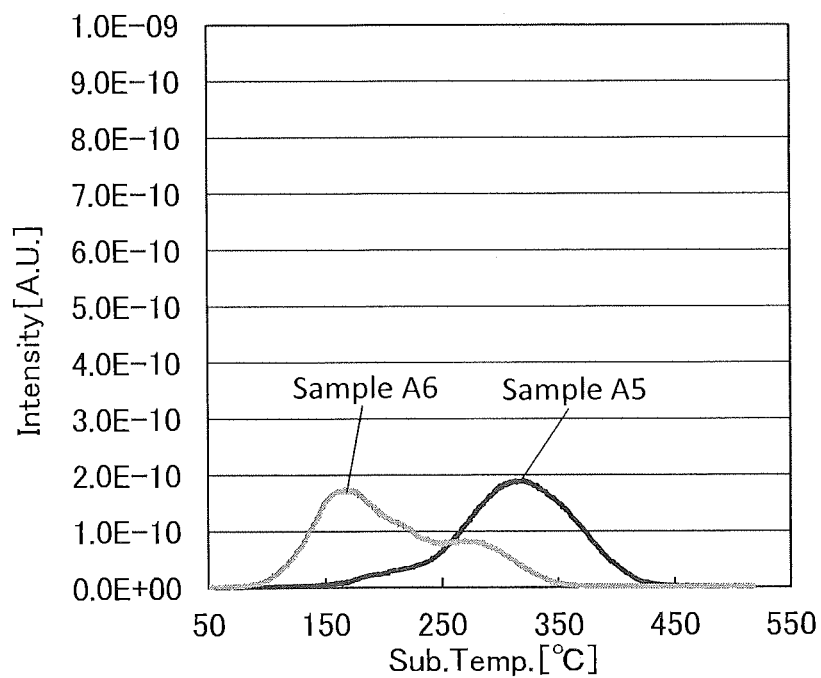
FIGS. 28A and 28B show TDS measurement results in Example 1.
Figure 28B:
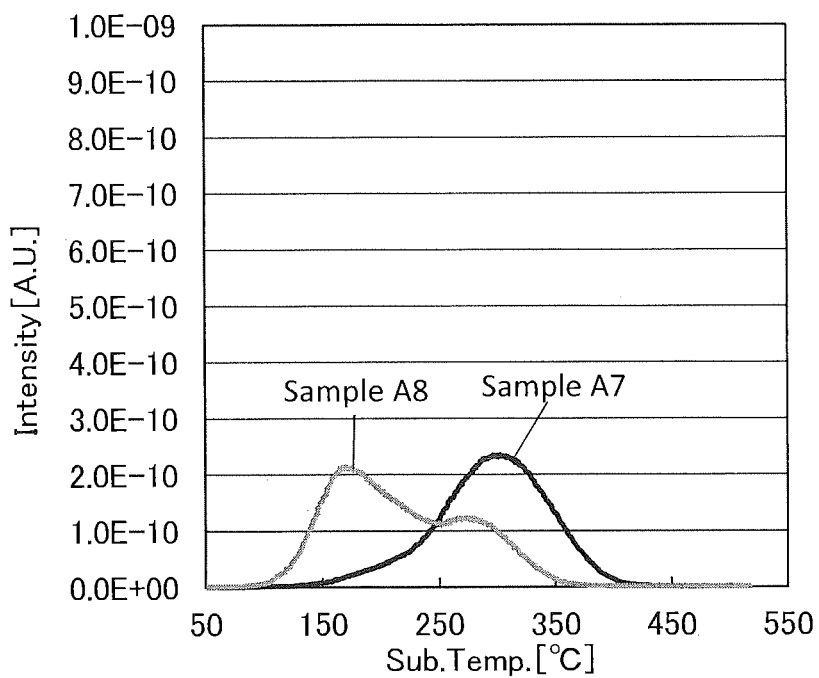
Figure 29:
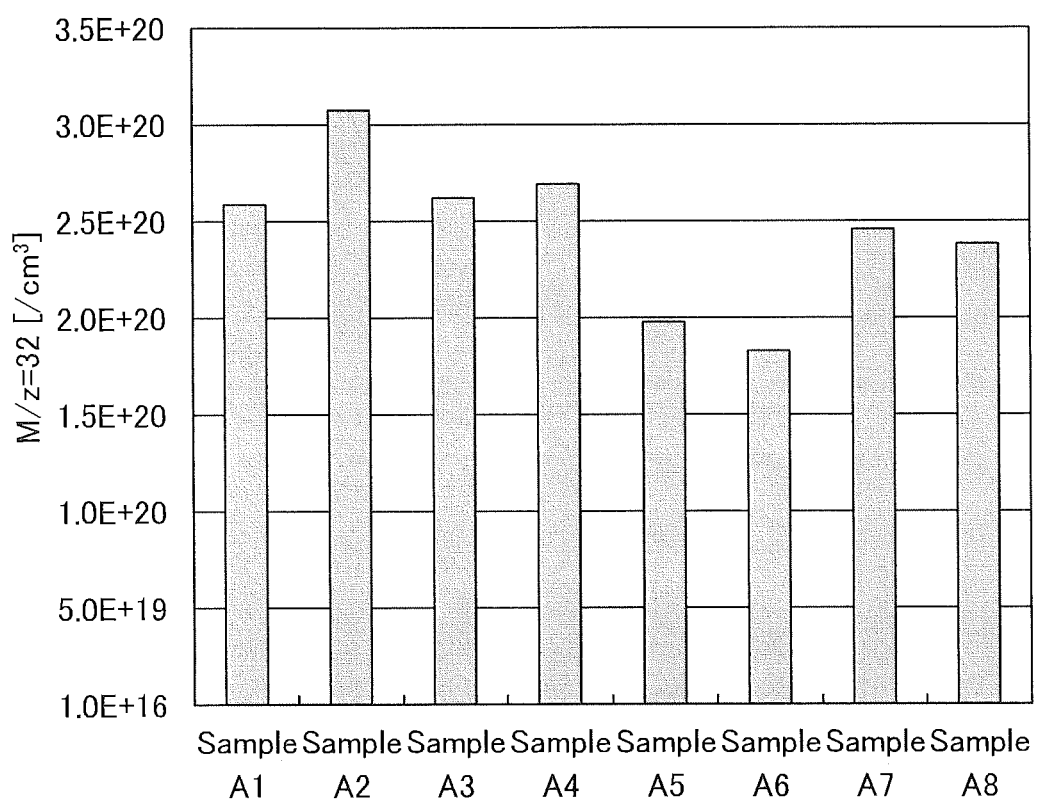
FIG. 29 shows the amount of oxygen released in Example 1.

FIGS. 27A and 27B show TDS measurement results of the samples A1 and A2 and TDS measurement results of the samples A3 and A4, respectively; and FIGS. 28A and 28B show TDS measurement results of the samples A5 and A6 and TDS measurement results of the samples A7 and A8, respectively. Note that in FIGS. 27A and 27B and FIGS. 28A and 28B, the vertical axis represents intensity (arbitrary unit), and the horizontal axis represents temperature (° C.). FIG. 29 shows the amount of a gas having a mass-to-charge ratio (M/z) of 32 which was released in TDS measurement. Note that FIG. 29 shows the amounts of a gas having a mass-to-charge ratio (M/z) of 32, i.e. the gas corresponding to an oxygen molecule, which was released in the TDS measurements shown in FIGS. 27A and 27B and FIGS. 28A and 28B and was calculated from the ratio of the integrated intensity to that of the gas having a mass-to-charge ratio (M/z) of 32 which was obtained by the TDS measurement.

According to the results shown in FIGS. 27A and 27B and FIGS. 28A and 28B, in the samples A1, A3, A5, and A7 each of which include the oxide semiconductor film 317, the intensity of a gas having a mass-to-charge ratio (M/z) of 32, which corresponds to the amount of oxygen released, is observed at a higher temperature than that in the samples A2, A4, A6, and A8 each of which does not include the oxide semiconductor film 317. Specifically, in the samples A1, A3, A5, and A7 each of which include the oxide semiconductor film 317, a peak of the intensity of the gas having a mass-to-charge ratio (M/z) of 32 was observed around 300° C., whereas, in the samples A2, A4, A6, and A8 each of which does not include the oxide semiconductor film 317, a peak of the intensity of the gas having a mass-to-charge ratio (M/z) of 32 was observed around 150° C. This is probably because the oxide semiconductor film 317 blocks oxygen released from the insulating film 316 up to a temperature around 300° C.

According to the results of FIG. 29, the amount of oxygen released in the sample A1 was approximately $2.6 \times 10^{20}/cm^3$, that in the sample A2 was approximately $3.1 \times 10^{20}/cm^3$, that in the sample A3 was approximately $2.6 \times 10^{20}/cm^3$, that in the sample A4 was approximately $2.7 \times 10^{20}/cm^3$, that in the sample A5 was approximately $2.0 \times 10^{20}/cm^3$, that in the sample A6 was approximately $1.8 \times 10^{20}/cm^3$, that in the sample A7 was approximately $2.5 \times 10^{20}/cm^3$, and that in the sample A8 was approximately $2.4 \times 10^{20}/cm^3$.

The structure described above in this example can be combined with any of the structures described in the other embodiments and examples as appropriate.

EXAMPLE 2

In this example, the amount of oxygen released from an insulating film included in the semiconductor device of one embodiment of the present invention was measured.

Samples B1, B2, B3, B4, B5, and B6 described below were used for evaluation in this example.

First, each sample will be described in detail with reference to FIGS. 26A and 26B. FIG. 26A is a cross-sectional view schematically illustrating the samples B1, B3, and B5, and FIG. 26B is a cross-sectional view schematically illustrating the samples B2, B4, and B6.

The samples B1, B3, and B5 illustrated in FIG. 26A each include the substrate 302, the insulating film 316 over the substrate 302, and the oxide semiconductor film 317 over the insulating film 316. The samples B2, B4, and B6 illustrated in FIG. 26B each include the substrate 302 and the insulating film 316 over the substrate 302.

(Sample B1)

As for a fabrication method of the sample B1, the insulating film 316 was formed over the substrate 302. A 400-nm-thick silicon oxynitride film was used as the insulating film 316. The silicon oxynitride film was deposited under the conditions where the substrate temperature was 220° C.; a silane gas at a flow rate of 160 sccm and a dinitrogen monoxide gas at a flow rate of 4000 sccm were introduced into a chamber; the pressure was 200 Pa; and an RF power of 1500 W was supplied between parallel-plate electrodes provided in a PECVD apparatus.

Next, heat treatment was performed. The heat treatment was performed at 650° C. in a nitrogen atmosphere for 6 minutes with an RTA apparatus. By the heat treatment, oxygen included in the insulating film 316 is released.

Next, the oxide semiconductor film 317 was formed over the insulating film 316. A 5-nm-thick IGZO film was used as the oxide semiconductor film 317. The IGZO film was deposited under the conditions where the substrate temperature was 170° C., an oxygen gas at a flow rate of 30 sccm and an argon gas at a flow rate of 270 sccm were introduced into a chamber, the pressure was 0.6 Pa, and an AC power of 2500 W was supplied to a metal oxide target (In:Ga:Zn=1:4:5 [atomic %]) provided in a sputtering apparatus.

Note that the IGZO film was deposited under the condition where the percentage of the oxygen ($O_2$) gas to the whole deposition gas was 10%.

Next, oxygen addition treatment was performed on the insulating film 316 through the oxide semiconductor film 317. The oxygen addition treatment was performed with an ashing apparatus under the conditions where the substrate temperature was 160° C., an oxygen gas at a flow rate of 250 sccm was introduced into a chamber, the pressure was 15 Pa, and an RF power of 4500 W was supplied for 120 seconds between parallel-plate electrodes provided in the ashing apparatus so that a bias voltage would be applied to the substrate side.

(Sample B2)

In the sample B2, an IGZO film serving as the oxide semiconductor film 317 was removed by a wet etching method after the same fabrication steps as the sample B1 were performed.

(Sample B3)

The fabrication method of the sample B3 was different from that of the sample B1 only in the step of forming the oxide semiconductor film 317, and the other steps were the same as those of the sample B1. A 5-nm-thick IGZO film was used as the oxide semiconductor film 317 of the sample B3. The IGZO film was deposited under the conditions where the substrate temperature was 170° C., an oxygen gas at a flow rate of 150 sccm and an argon gas at a flow rate of 150 sccm were introduced into a chamber, the pressure was 0.6 Pa, and an AC power of 2500 W was supplied to a metal oxide target (In:Ga:Zn=1:4:5 [atomic %]) provided in a sputtering apparatus.

Note that the IGZO film was deposited under the condition where the percentage of the oxygen ($O_2$) gas to the whole deposition gas was 50%.

(Sample B4)

In the sample B4, an IGZO film serving as the oxide semiconductor film 317 was removed by a wet etching method after the same fabrication steps as the sample B3 were performed.

(Sample B5)

The fabrication method of the sample B5 was different from that of the sample B1 only in the step of forming the oxide semiconductor film 317, and the other steps were the same as those of the sample B1. A 5-nm-thick IGZO film was used as the oxide semiconductor film 317 of the sample B5. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:4:5 [atomic %]) provided in a sputtering apparatus.

Note that the IGZO film was deposited under the condition where the percentage of the oxygen ($O_2$) gas to the whole deposition gas was 100%.

(Sample B6)

In the sample B6, an IGZO film serving as the oxide semiconductor film 317 was removed by a wet etching method after the same fabrication steps as the sample B5 were performed.

Through the above process, the samples B1 to B6 of this example were fabricated. Table 2 briefly shows fabrication processes and structures of the samples B1 to B6.

Figure 30A:
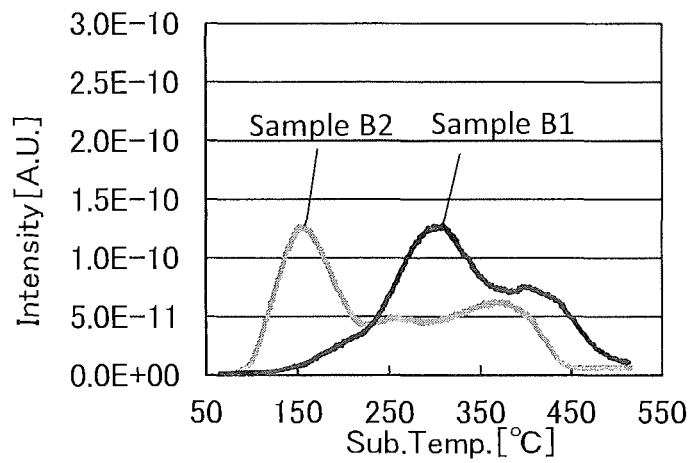
FIGS. 30A to 30C show IDS measurement results in Example 2.
Figure 30B:
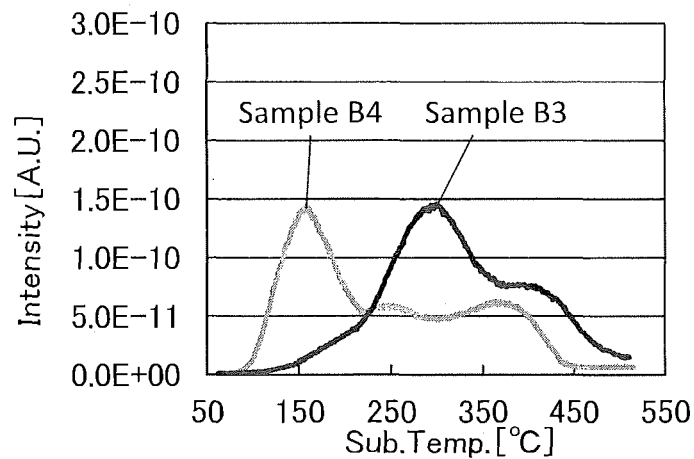
Figure 30C:
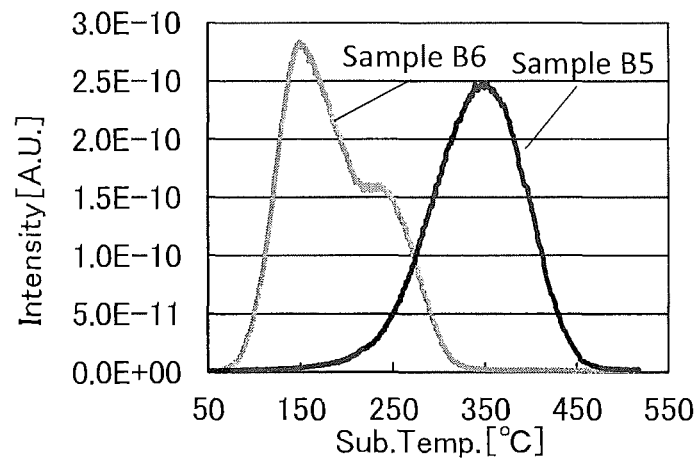
Figure 31:
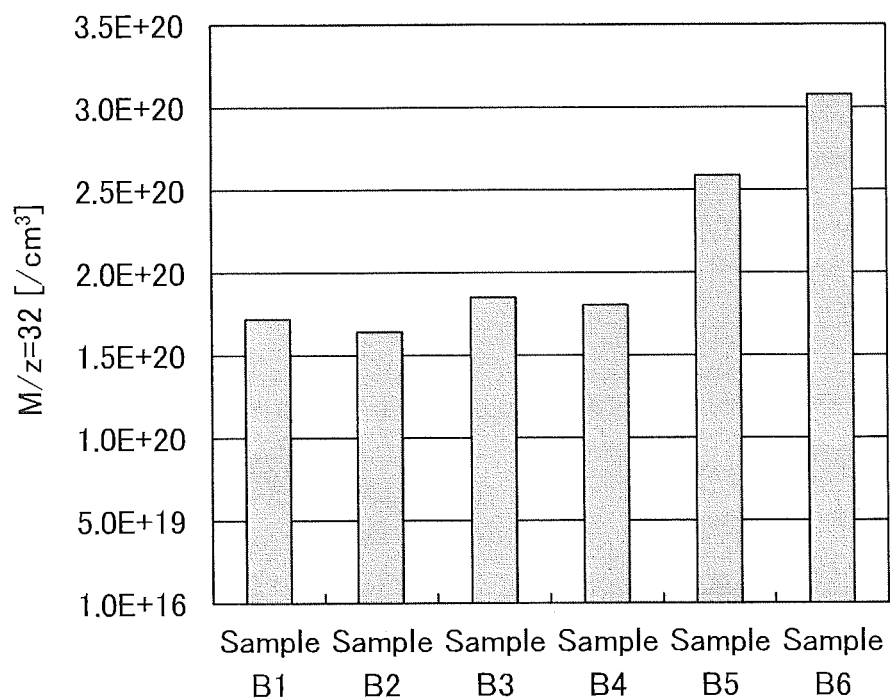
FIG. 31 shows the amount of oxygen released in Example 2.

FIGS. 30A, 30B, and 30C show TDS measurement results of the samples B1 and B2, TDS measurement results of the samples B3 and B4, and TDS measurement results of the sample B5 and B6, respectively. Note that in FIGS. 30A to 30C, the vertical axis represents intensity (arbitrary unit), and the horizontal axis represents temperature (° C.). FIG. 31 shows the amount of a gas having a mass-to-charge ratio (M/z) of 32 which was released in TDS measurement. Note that FIG. 31 shows the amounts of a gas having a mass-to-charge ratio (M/z) of 32, i.e. the gas corresponding to an oxygen molecule, which was released in the TDS measurements shown in FIGS. 30A to 30C and was calculated from the ratio of the integrated intensity to that of the gas having a mass-to-charge ratio (M/z) of 32 which was obtained by the TDS measurement.

According to the results shown in FIGS. 30A to 30C, in the samples B1, B3, and B5 each of which include the oxide semiconductor film 317, the intensity of a gas having a mass-to-charge ratio (M/z) of 32, which corresponds to the amount of oxygen released, is observed at a higher temperature than that in the samples B2, B4, and B6 each of which does not include the oxide semiconductor film 317. Specifically, in the samples B1, B3, and B5 each of which include the oxide semiconductor film 317, a peak of the intensity of the gas having a mass-to-charge ratio (M/z) of 32 was observed around 300° C., whereas, in the samples B2, B4, and B6 each of which does not include the oxide semiconductor film 317, a peak of the intensity of the gas having a mass-to-charge ratio (M/z) of 32 was observed around 150° C. This is probably because the oxide semiconductor film 317 blocks oxygen released from the insulating film 316 up to a temperature around 300° C.

TABLE 2

| | Step 1 | Step 2 | Step 3 | Step 4 | Step 5 | Sample structure |
|---|---|---|---|---|---|---|
| Sample B1 | Formation of SiON film | Heat treatment at 650° C. | Formation of IGZO film (1:4:5) 5 nm, $O_2$ = 100% | Oxygen addition treatment 160° C. | — | Glass\SiON\IGZO (1:4:5) |
| Sample B2 | Formation of SiON film | Heat treatment at 650° C. | Formation of IGZO film (1:4:5) 5 nm, $O_2$ = 100% | Oxygen addition treatment 160° C. | Removal of IGZO film | Glass\SiON |
| Sample B3 | Formation of SiON film | Heat treatment at 650° C. | Formation of IGZO film (1:4:5) 5 nm, $O_2$ = 100% | Oxygen addition treatment 160° C. | — | Glass\SiON\IGZO (1:4:5) |
| Sample B4 | Formation of SiON film | Heat treatment at 650° C. | Formation of IGZO film (1:4:5) 5 nm, $O_2$ = 100% | Oxygen addition treatment 160° C. | Removal of IGZO film | Glass\SiON |
| Sample B5 | Formation of SiON film | Heat treatment at 650° C. | Formation of IGZO film (1:4:5) 5 nm, $O_2$ = 100% | Oxygen addition treatment 160° C. | — | Glass\SiON\IGZO (1:4:5) |
| Sample B6 | Formation of SiON film | Heat treatment at 650° C. | Formation of IGZO film (1:4:5) 5 nm, $O_2$ = 100% | Oxygen addition treatment 160° C. | Removal of IGZO film | Glass\SiON |

Note:
The values in parentheses in the step 3 represent composition ratios of In:Ga:Zn (atomic %) of targets for forming IGZO films.
The bottom in the step 3 represents the thicknesses of the IGZO films and percentages of oxygen gas to the whole deposition gas.
The bottom in the step 4 represents time of oxygen addition treatment and substrate temperature during oxygen addition treatment.

Note that as shown in Table 2, the samples B1 to B6 are different from one another in a flow rate of deposition gas at the formation of the oxide semiconductor film 317 and/or whether the step of removing the oxide semiconductor film 317 after its formation was performed or not.

<TDS Measurement 2>

Next, the samples B1 to B6 fabricated as described above were subjected to TDS measurement. The TDS measurement was performed in the same manner as that in Example 1.

According to the results of FIG. 31, the amount of oxygen released in the sample B1 was approximately $1.7 \times 10^{20}$/$cm^3$, that in the sample B2 was approximately $1.6 \times 10^{20}$/$cm^3$, that in the sample B3 was approximately $1.8 \times 10^{20}$/$cm^3$, that in the sample B4 was approximately $1.8 \times 10^{20}$/$cm^3$, that in the sample B5 was approximately $2.6 \times 10^{20}$/$cm^3$, and that in the sample B6 was approximately $3.1 \times 10^{20}$/$cm^3$.

Furthermore, according to the results shown in FIG. 31, the amount of an oxygen gas released from the insulating film 316 increased by raising the flow rate of the oxygen gas at the formation of the oxide semiconductor film 317. Therefore, as the flow rate of an oxygen gas at the formation of the oxide semiconductor film, the percentage of the oxygen gas to the whole deposition gas was preferably 10% or higher, or further preferably 50% or higher and 100% or lower.

The structure described above in this example can be combined with any of the structures described in the other embodiments and examples as appropriate.

EXAMPLE 3

In this example, the amount of oxygen released from an insulating film included in a semiconductor device of one embodiment of the present invention was measured. Samples C1, C2, C3, and C4 described below were used for evaluation in this example.

First, each sample will be described in detail with reference to FIG. 26B. FIG. 26B is a cross-sectional view schematically illustrating the samples C1 to C4.

The samples C1 to C4 illustrated in FIG. 26B each include the substrate 302 and the insulating film 316 over the substrate 302.

(Sample C1)

As for a fabrication method of the sample C1, the insulating film 316 was formed over the substrate 302. A 400-nm-thick silicon oxynitride film was used as the insulating film 316. The silicon oxynitride film was deposited under the conditions where the substrate temperature was 220° C.; a silane gas at a flow rate of 160 sccm and a dinitrogen monoxide gas at a flow rate of 4000 sccm were introduced into a chamber; the pressure was 200 Pa; and an RF power of 1500 W was supplied between parallel-plate electrodes provided in a PECVD apparatus.

Next, heat treatment was performed. The heat treatment was performed at 650° C. in a nitrogen atmosphere for 6 minutes with an RTA apparatus. By the heat treatment, oxygen included in the insulating film 316 is released.

Next, the oxide semiconductor film 317 was formed over the insulating film 316. A 5-nm-thick IGZO film was used as the oxide semiconductor film 317. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:3:2 [atomic %]) provided in a sputtering apparatus.

Note that the IGZO film was deposited under the condition where the percentage of the oxygen ($O_2$) gas to the whole deposition gas was 100%.

Next, oxygen addition treatment was performed on the insulating film 316 through the oxide semiconductor film 317. The oxygen addition treatment was performed with an ashing apparatus under the conditions where the substrate temperature was 160° C., an oxygen gas at a flow rate of 250 sccm was introduced into a chamber, the pressure was 15 Pa, and an RF power of 4500 W was supplied for 120 seconds between parallel-plate electrodes provided in the ashing apparatus so that a bias voltage would be applied to the substrate side.

Next, an IGZO film serving as the oxide semiconductor film 317 was removed by a wet etching method.

(Sample C2)

The sample C2 is different from the sample C1 in the conditions of the oxygen addition treatment. The oxygen addition treatment of the sample C2 was performed with an ashing apparatus under the conditions where the substrate temperature was 104° C., an oxygen gas at a flow rate of 250 sccm was introduced into a chamber, the pressure was 15 Pa, and an RF power of 8000 W was supplied to an upper electrode side and power of 4500 W with a frequency of 3.2 MHz was supplied to a lower electrode side of parallel-plate electrodes provided in the ashing apparatus, each for 120 seconds, so that a bias voltage would be applied to the substrate side.

(Sample C3)

The sample C3 is different from the sample C1 in the conditions of the oxygen addition treatment. The oxygen addition treatment of the sample C3 was performed with an ashing apparatus under the conditions where the substrate temperature was 143° C., an oxygen gas at a flow rate of 250 sccm was introduced into a chamber, the pressure was 15 Pa, and an RF power of 8000 W was supplied to an upper electrode side and power of 4500 W with a frequency of 3.2 MHz was supplied to a lower electrode side of parallel-plate electrodes provided in the ashing apparatus, each for 120 seconds, so that a bias voltage would be applied to the substrate side.

(Sample C4)

The sample C4 is different from the sample C1 in the conditions of the oxygen addition treatment. The oxygen addition treatment of the sample C4 was performed with an ashing apparatus under the conditions where the substrate temperature was 171° C., an oxygen gas at a flow rate of 250 sccm was introduced into a chamber, the pressure was 15 Pa, and an RF power of 8000 W was supplied to an upper electrode side and power of 4500 W with a frequency of 3.2 MHz was supplied to a lower electrode side of parallel-plate electrodes provided in the ashing apparatus, each for 120 seconds, so that a bias voltage would be applied to the substrate side.

Through the above process, the samples C1 to C4 of this example were fabricated. Table 3 briefly shows fabrication processes and structures of the samples C1 to C4.

TABLE 3

|  | Step 1 | Step 2 | Step 3 | Step 4 | Step 5 | Sample structure |
|---|---|---|---|---|---|---|
| Sample C1 | Formation of SiON film | Heat treatment at 650° C. | Formation of IGZO film (1:3:2) 5 nm, $O_2$ = 100% | Oxygen addition treatment 120 sec, 160° C. | Removal of IGZO film | Glass\ SiON |
| Sample C2 | Formation of SiON film | Heat treatment at 650° C. | Formation of IGZO film (1:3:2) 5 nm, $O_2$ = 100% | Oxygen addition treatment 120 sec, 104° C. | Removal of IGZO film | Glass\ SiON |
| Sample C3 | Formation of SiON film | Heat treatment at 650° C. | Formation of IGZO film (1:3:2) 5 nm, $O_2$ = 100% | Oxygen addition treatment 120 sec, 143° C. | Removal of IGZO film | Glass\ SiON |
| Sample | Formation | Heat | Formation of IGZO | Oxygen addition | Removal of | Glass\ |

TABLE 3-continued

| | Step 1 | Step 2 | Step 3 | Step 4 | Step 5 | Sample structure |
|---|---|---|---|---|---|---|
| C4 | of SiON film | treatment at 650° C. | film (1:3:2) 5 nm, O$_2$ = 100% | treatment 120 sec, 171° C. | IGZO film | SiON |

Note:
The values in parentheses in the step 3 represent composition ratios of In:Ga:Zn (atomic %) of targets for forming IGZO films.
The bottom in the step 3 represents the thicknesses of the IGZO films and percentages of oxygen gas to the whole deposition gas.
The bottom in the step 4 represents time of oxygen addition treatment and substrate temperature during oxygen addition treatment As shown in Table 3, the samples C1 to C4 are different in substrate temperature during the oxygen addition treatment.

<TDS Measurement 3>

Next, the samples C1 to C4 fabricated as described above were subjected to TDS measurement. The TDS measurement was performed in the same manner as that in Examples 1 and 2.

Figure 32:
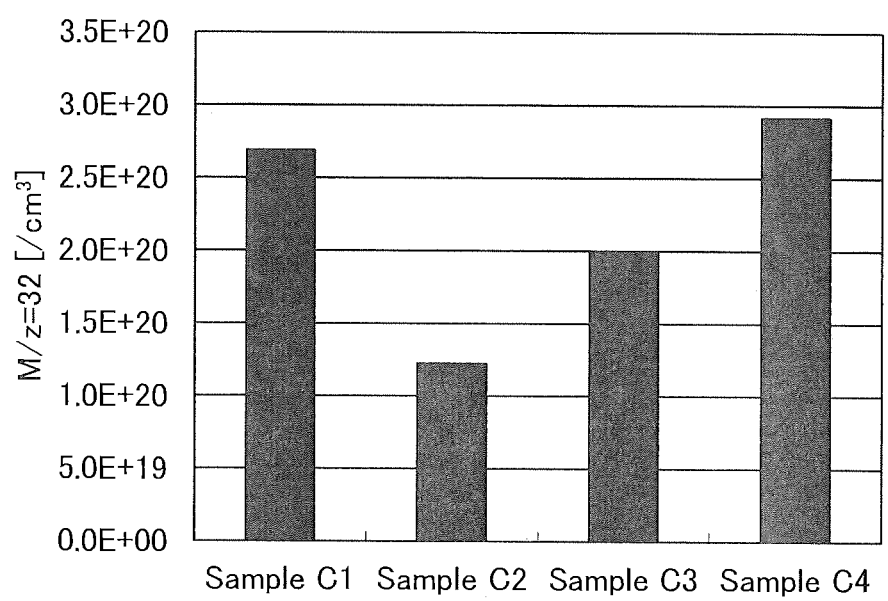
FIG. 32 shows the amount of oxygen released in Example 3.

FIG. 32 shows the amount of a gas having a mass-to-charge ratio (M/z) of 32 which was released in TDS measurement. Note that FIG. 32 shows the amounts of a gas having a mass-to-charge ratio (M/z) of 32, i.e. the gas corresponding to an oxygen molecule, which was released in the TDS measurements and was calculated from the ratio of the integrated intensity to that of the gas having a mass-to-charge ratio (M/z) of 32 which was obtained by the IDS measurement.

According to the results of FIG. 32, the amount of oxygen released in the sample C1 was approximately $2.7 \times 10^{20}$/cm$^3$, that in the sample C2 was approximately $1.2 \times 10^{20}$/cm$^3$, that in the sample C3 was approximately $2.0 \times 10^{20}$/cm$^3$, and that in the sample C4 was approximately $2.9 \times 10^{20}$/cm$^3$.

According to the results shown in FIG. 32, the amount of an oxygen gas released from the insulating film 316 was increased at a high substrate temperature during the oxygen addition treatment. That is, much oxygen can be introduced into the insulating film 316 at a high substrate temperature during the oxygen addition treatment. However, as described in Examples 1 and 2, oxygen in the insulating film 316 is diffused at a temperature around 300° C.; therefore, the oxygen addition treatment is preferably performed at a temperature lower than the temperature at which oxygen is released. Thus, the substrate temperature during the oxygen addition treatment is higher than or equal to room temperature and lower than or equal to 300° C., preferably higher than or equal to 100° C. and lower than or equal to 250° C.

The structure described above in this example can be combined with any of the structures described in the other embodiments and examples as appropriate.

EXAMPLE 4

In this example, the amount of oxygen released from an insulating film included in a semiconductor device of one embodiment of the present invention was measured. Samples D1, D2, D3, D4, D5, D6, and D7 described below were used for evaluation in this example.

First, each sample will be described in detail with reference to FIG. 26B. FIG. 26B is a cross-sectional view schematically illustrating the samples D1 to D7.

The samples D1 to D7 illustrated in FIG. 26B each include the substrate 302 and the insulating film 316 over the substrate 302.

(Sample D1)

As for a fabrication method of the sample D1, the insulating film 316 was formed over the substrate 302. A 200-nm-thick silicon nitride film and a 400-nm-thick silicon oxynitride film were stacked as the insulating film 316. The silicon nitride film was deposited under the conditions where the substrate temperature was 350° C.; a silane gas at a flow rate of 200 sccm, a nitrogen gas at a flow rate of 2000 sccm, and an ammonia gas at a flow rate of 2000 sccm were introduced into a chamber; the pressure was 100 Pa; and an RF power of 2000 W was supplied between parallel-plate electrodes provided in a PECVD apparatus. The silicon oxynitride film was deposited under the conditions where the substrate temperature was 220° C.; a silane gas at a flow rate of 160 sccm and a dinitrogen monoxide gas at a flow rate of 4000 sccm were introduced into a chamber; the pressure was 200 Pa; and an RF power of 1500 W was supplied between parallel-plate electrodes provided in a PECVD apparatus.

Next, heat treatment was performed. The heat treatment was performed at 650° C. in a nitrogen atmosphere for 6 minutes with an RTA apparatus. By the heat treatment, oxygen included in the insulating film 316 is released.

Next, the oxide semiconductor film 317 was formed over the insulating film 316. A 5-nm-thick IGZO film was used as the oxide semiconductor film 317. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:4:5 [atomic %]) provided in a sputtering apparatus.

Note that the IGZO film was deposited under the condition where the percentage of the oxygen (O$_2$) gas to the whole deposition gas was 100%.

Next, oxygen addition treatment was performed on the insulating film 316 through the oxide semiconductor film 317. The oxygen addition treatment was performed with an ashing apparatus under the conditions where the substrate temperature was 160° C., an oxygen gas at a flow rate of 250 sccm was introduced into a chamber, the pressure was 15 Pa, and an RF power of 4500 W was supplied for 600 seconds between parallel-plate electrodes provided in the ashing apparatus so that a bias voltage would be applied to the substrate side.

Next, an IGZO film serving as the oxide semiconductor film 317 was removed by a wet etching method.

(Sample D2)

The fabrication method of the sample D2 was different from that of the sample D1 only in the step of forming the oxide semiconductor film 317, and the other steps were the same as those of the sample D1. A 10-nm-thick IGZO film was used as the oxide semiconductor film 317 of the sample D2. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:4:5 [atomic %]) provided in a sputtering apparatus.

Note that the IGZO film was deposited under the condition where the percentage of the oxygen ($O_2$) gas to the whole deposition gas was 100%.
(Sample D3)

The fabrication method of the sample D3 was different from that of the sample D1 only in the step of forming the oxide semiconductor film 317, and the other steps were the same as those of the sample D1. A 15-nm-thick IGZO film was used as the oxide semiconductor film 317 of the sample D3. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:4:5 [atomic %]) provided in a sputtering apparatus.

Note that the IGZO film was deposited under the condition where the percentage of the oxygen ($O_2$) gas to the whole deposition gas was 100%.
(Sample D4)

The fabrication method of the sample D4 was different from that of the sample D1 only in the step of forming the oxide semiconductor film 317, and the other steps were the same as those of the sample D1. A 20-nm-thick IGZO film was used as the oxide semiconductor film 317 of the sample D4. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:4:5 [atomic %]) provided in a sputtering apparatus.

Note that the IGZO film was deposited under the condition where the percentage of the oxygen ($O_2$) gas to the whole deposition gas was 100%.
(Sample D5)

The fabrication method of the sample D5 was different from that of the sample D1 only in the step of forming the oxide semiconductor film 317, and the other steps were the same as those of the sample D1. A 35-nm-thick IGZO film was used as the oxide semiconductor film 317 of the sample D5. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:4:5 [atomic %]) provided in a sputtering apparatus.

Note that the IGZO film was deposited under the condition where the percentage of the oxygen ($O_2$) gas to the whole deposition gas was 100%.
(Sample D6)

The sample D6 is different from the sample D1 only in the step of performing the oxygen addition treatment, and the other steps are the same as those of the sample D1. The oxygen addition treatment of the sample D6 was performed with an ashing apparatus under the conditions where the substrate temperature was 160° C., an oxygen gas at a flow rate of 250 sccm was introduced into a chamber, the pressure was 15 Pa, and an RF power of 4500 W was supplied for 120 seconds between parallel-plate electrodes provided in the ashing apparatus so that a bias voltage would be applied to the substrate side.
(Sample D7)

The fabrication method of the sample D7 was different from that of the sample D1 in the step of forming the oxide semiconductor film 317 and the step of performing the oxygen addition treatment, and the other steps are the same as those of the sample D1. A 10-nm-thick IGZO film was used as the oxide semiconductor film 317 of the sample D7. The IGZO film was deposited under the conditions where the substrate temperature was 170° C., an oxygen gas at a flow rate of 300 sccm was introduced into a chamber, the pressure was 0.6 Pa, and an AC power of 2500 W was supplied to a metal oxide target (In:Ga:Zn=1:4:5 [atomic %]) provided in a sputtering apparatus.

Note that the IGZO film was deposited under the condition where the percentage of the oxygen ($O_2$) gas to the whole deposition gas was 100%.

The oxygen addition treatment of the sample D7 was performed with an ashing apparatus under the conditions where the substrate temperature was 160° C., an oxygen gas at a flow rate of 250 sccm was introduced into a chamber, the pressure was 15 Pa, and an RF power of 4500 W was supplied for 120 seconds between parallel-plate electrodes provided in the ashing apparatus so that a bias voltage would be applied to the substrate side.

Through the above process, the samples D1 to D7 of this example were fabricated. Table 4 briefly shows fabrication processes and structures of the samples D1 to D7.

TABLE 4

| | Step 1 | Step 2 | Step 3 | Step 4 | Step 5 | Sample structure |
|---|---|---|---|---|---|---|
| Sample D1 | Formation of SiON film | Heat treatment at 650° C. | Formation of IGZO film (1:4:5) 5 nm, $O_2$ = 100% | Oxygen addition treatment 600 sec, 160° C. | Removal of IGZO film | Glass\ SiON |
| Sample D2 | Formation of SiON film | Heat treatment at 650° C. | Formation of IGZO film (1:4:5) 10 nm, $O_2$ = 100% | Oxygen addition treatment 600 sec, 160° C. | Removal of IGZO film | Glass\ SiON |
| Sample D3 | Formation of SiON film | Heat treatment at 650° C. | Formation of IGZO film (1:4:5) 15 nm, $O_2$ = 100% | Oxygen addition treatment 600 sec, 160° C. | Removal of IGZO film | Glass\ SiON |
| Sample D4 | Formation of SiON film | Heat treatment at 650° C. | Formation of IGZO film (1:4:5) 20 nm, $O_2$ = 100% | Oxygen addition treatment 600 sec, 160° C. | Removal of IGZO film | Glass\ SiON |
| Sample D5 | Formation of SiON film | Heat treatment at 650° C. | Formation of IGZO film (1:4:5) 35 nm, $O_2$ = 100% | Oxygen addition treatment 600 sec, 160° C. | Removal of IGZO film | Glass\ SiON |
| Sample D6 | Formation of SiON film | Heat treatment at 650° C. | Formation of IGZO film (1:4:5) 5 nm, $O_2$ = 100% | Oxygen addition treatment 120 sec, 160° C. | Removal of IGZO film | Glass\ SiON |
| Sample D7 | Formation | Heat | Formation of IGZO | Oxygen addition | Removal of | Glass\ |

TABLE 4-continued

|  | Step 1 | Step 2 | Step 3 | Step 4 | Step 5 | Sample structure |
|---|---|---|---|---|---|---|
| D7 | of SiON film | treatment at 650° C. | film (1:4:5) 10 nm, $O_2$ = 100% | treatment 120 sec, 160° C. | IGZO film | SiON |

Note:
The values in parentheses in the step 3 represent composition ratios of In:Ga:Zn (atomic %) of targets for forming IGZO films.
The bottom in the step 3 represents the thicknesses of the IGZO films and percentages of oxygen gas to the whole deposition gas.
The bottom in the step 4 represents time of oxygen addition treatment and substrate temperature during oxygen addition treatment As shown in Table 4, the samples D1 to D7 are different in the thickness of the oxide semiconductor film 317 and time for the oxygen addition treatment.

<TDS Measurement 4>

Next, the samples D1 to D7 fabricated as described above were subjected to TDS measurement. The TDS measurement was performed in the same manner as that in Examples 1 to 3.

Figure 33:
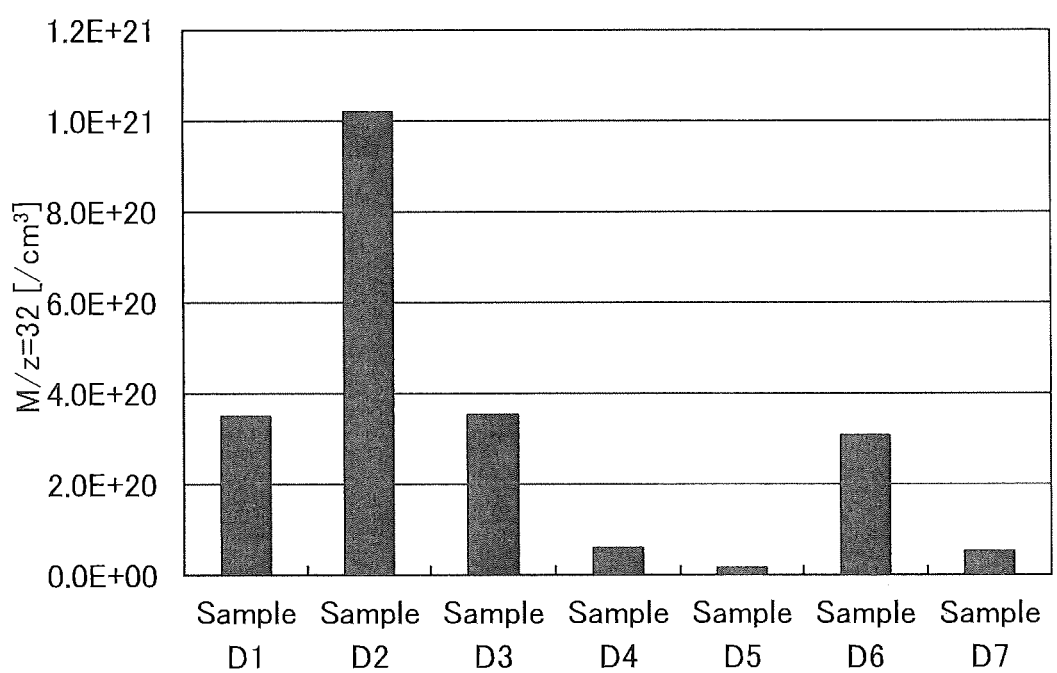
FIG. 33 shows the amount of oxygen released in Example 4.

FIG. 33 shows the amount of a gas having a mass-to-charge ratio (M/z) of 32 which was released in TDS measurement. Note that FIG. 33 shows the amounts of a gas having a mass-to-charge ratio (M/z) of 32, i.e. the gas corresponding to an oxygen molecule, which was released in the TDS measurements and was calculated from the ratio of the integrated intensity to that of the gas having a mass-to-charge ratio (M/z) of 32 which was obtained by the IDS measurement.

According to the results of FIG. 33, the amount of oxygen released in the sample D1 was approximately $3.5 \times 10^{20}/cm^3$, that in the sample D2 was approximately $1.0 \times 10^{21}/cm^3$, that in the sample D3 was approximately $3.5 \times 10^{20}/cm^3$, that in the sample D4 was approximately $6.0 \times 10^{19}/cm^3$, that in the sample D5 was approximately $1.7 \times 10^{19}/cm^3$, that in the sample D6 was approximately $3.1 \times 10^{20}/cm^3$, and that in the sample D7 was approximately $5.3 \times 10^{19}/cm^3$.

According to the results of FIG. 33, in the case where the oxygen addition treatment was performed for 600 seconds, the amount of oxygen added to the insulating film 316 seems to be large when the oxide semiconductor film 317 has a thickness of approximately 10 nm. In the case where the oxygen addition treatment was performed for 120 seconds, the amount of oxygen added to the insulating film 316 when the oxide semiconductor film 317 has a thickness of 5 nm was larger than that when the oxide semiconductor film 317 has a thickness of 10 nm. Therefore, the thickness of the oxide semiconductor film 317 is greater than or equal to 5 nm and less than or equal to 35 nm, preferably greater than or equal to 5 nm and less than or equal to 15 nm. For example, when the thickness of an oxide semiconductor film which is used as a channel formation region of a transistor is greater than 35 nm and less than or equal to 100 nm, the thickness of the oxide semiconductor film 317 is made thinner than that of the oxide semiconductor film used as the channel formation region.

The structure described above in this example can be combined with any of the structures described in the other embodiments and examples as appropriate.

This application is based on Japanese Patent Application serial No. 2014-101183 filed with Japan Patent Office on May 15, 2014, the entire contents of which are hereby incorporated by reference.

What is claimed is:

1. A semiconductor device comprising a transistor, the transistor comprising:
   a first gate electrode;
   a first insulating film over the first gate electrode;
   an oxide semiconductor film over the first insulating film;
   a source electrode electrically connected to the oxide semiconductor film;
   a drain electrode electrically connected to the oxide semiconductor film;
   a second insulating film over the oxide semiconductor film, the source electrode, and the drain electrode; and
   a second gate electrode over the second insulating film,
   wherein a resistivity of the second gate electrode is greater than or equal to $10^{-8}$ Ω·cm and less than or equal to $10^{-1}$ Ω·cm,
   wherein the second insulating film includes oxygen, and
   wherein the second gate electrode includes In—Zn oxide.

2. The semiconductor device according to claim 1, wherein the second gate electrode has a property of transmitting oxygen supplied by ion doping, ion implantation or plasma treatment.

3. The semiconductor device according to claim 1, wherein a thickness of the second gate electrode is greater than or equal to 5 nm and less than or equal to 35 nm.

4. The semiconductor device according to claim 1, wherein the oxide semiconductor film includes oxygen, In, Zn, and M (M is Ti, Ga, Sn, Y, Zr, La, Ce, Nd, or Hf).

5. The semiconductor device according to claim 1, wherein the oxide semiconductor film includes a crystal part and the crystal part has c-axis alignment.

6. A display device comprising a display element and the semiconductor device according to claim 1.

7. A display module comprising a touch sensor and the display device according to claim 6.

8. An electronic appliance comprising an operation key or a battery, and the display module according to claim 7.

9. A semiconductor device comprising a transistor, the transistor comprising:
   a first gate electrode;
   a first insulating film over the first gate electrode;
   an oxide semiconductor film over the first insulating film;
   a source electrode electrically connected to the oxide semiconductor film;
   a drain electrode electrically connected to the oxide semiconductor film;
   a second insulating film over the oxide semiconductor film, the source electrode, and the drain electrode; and
   a second gate electrode over, the second insulating film,
   wherein a resistivity of the second gate electrode is greater than or equal to 10 Ω·cm and less than or equal to $10^{-1}$ Ω·cm,
   wherein the second insulating film includes oxygen, and
   wherein the second gate electrode includes In—Ga oxide.

10. The semiconductor device according to claim 9, wherein the second gate electrode includes In—Ga—Zn oxide.

11. The semiconductor device according to claim 9, wherein the second gate electrode has a property of transmitting oxygen supplied by ion doping, ion implantation or plasma treatment.

12. The semiconductor device according to claim 9, wherein a thickness of the second gate electrode is greater than or equal to 5 nm and less than or equal to 35 nm.

13. The semiconductor device according to claim 9, wherein the oxide semiconductor film includes oxygen, In, Zn, and M (M is Ti, Ga, Sn, Y, Zr, La, Ce, Nd, or Hf).

14. The semiconductor device according to claim 9, wherein the oxide semiconductor film includes a crystal part and the crystal part has c-axis alignment.

15. A display device comprising a display element and the semiconductor device according to claim 9.

16. A display module comprising a touch sensor and the display device according to claim 15.

17. An electronic appliance comprising an operation key or a battery, and the display module according to claim 16.

* * * * *